(12) United States Patent
Katayama et al.

(10) Patent No.: US 8,461,572 B2
(45) Date of Patent: Jun. 11, 2013

(54) ORGANIC LUMINESCENT DEVICE AND MANUFACTURING METHOD THEREOF

(75) Inventors: Masayuki Katayama, Handa (JP); Kazushige Kojima, Aichi-gun (JP); Tetsuya Katoh, Anjo (JP); Kunio Akedo, Nagoya (JP); Toshikazu Satoh, Seto (JP); Koji Noda, Ichinomiya (JP); Tomohiko Mori, Aichi-gun (JP); Yoshihiro Kikuzawa, Aichi-gun (JP); Koichi Sakaguchi, Nagoya (JP)

(73) Assignees: DENSO CORPORATION, Kariya (JP); Kabushiki Kaisha Toyota Chuo Kenkyusho, Nagakute-shi (JP)

( * ) Notice: Subject to any disclaimer, the term of this patent is extended or adjusted under 35 U.S.C. 154(b) by 395 days.

(21) Appl. No.: 12/736,214

(22) PCT Filed: May 14, 2009

(86) PCT No.: PCT/JP2009/002121
§ 371 (c)(1),
(2), (4) Date: Sep. 20, 2010

(87) PCT Pub. No.: WO2009/139172
PCT Pub. Date: Nov. 19, 2009

(65) Prior Publication Data
US 2011/0006288 A1    Jan. 13, 2011

(30) Foreign Application Priority Data

May 15, 2008  (JP) ................... 2008-128207
Sep. 23, 2008  (JP) ................... 2008-243435
Feb. 2, 2009  (JP) ................... 2009-21390
Feb. 17, 2009  (JP) ................... 2009-33935

(51) Int. Cl.
*H01L 35/24* (2006.01)

(52) U.S. Cl.
USPC ..................... 257/40; 257/E51.001

(58) Field of Classification Search
USPC ............................. 257/40, E51.001
See application file for complete search history.

(56) References Cited

U.S. PATENT DOCUMENTS

| 2005/0184657 A1 | 8/2005 | Kato et al. |
| 2007/0207341 A1 | 9/2007 | Iida et al. |
| 2008/0100206 A1 | 5/2008 | Kondo et al. |

FOREIGN PATENT DOCUMENTS

| JP | A-H9-59614 | 3/1997 |
| JP | A-H11-135261 | 5/1999 |
| JP | A-2001-357974 | 12/2001 |

(Continued)

OTHER PUBLICATIONS

Office Action mailed Oct. 16, 2012 in corresponding JP Patent Application No. 2009-021390 (and English translation).

(Continued)

*Primary Examiner* — Anthony Ho
(74) *Attorney, Agent, or Firm* — Posz Law Group, PLC

(57) ABSTRACT

There is provided a polymer or low-molecular-weight compound multilayer type organic EL device configured such that a light-emitting layer formed on a hole transport layer includes a mixture of a polymer material and a low-molecular weight material. With such a configuration, the low-molecular-weight material added to the polymer material serves as a binder filling the gap of the steric hindrance to form entanglement of the polymer material and the low-molecular-weight material. This results in that the interface between the hole transport layer and the light-emitting layer is an interface high in adhesion and also high in carrier injectability. Further, optimization of the formation conditions and materials can achieve still higher reliability and longer lifetime.

50 Claims, 18 Drawing Sheets

FOREIGN PATENT DOCUMENTS

| | | |
|---|---|---|
| JP | A-2004-247161 | 9/2004 |
| JP | A-2004-281251 | 10/2004 |
| JP | A-2005-63977 | 3/2005 |
| JP | A-2005-093135 | 4/2005 |
| JP | A-2005-276802 | 10/2005 |
| JP | A-2005-285617 | 10/2005 |
| JP | A-2005-302566 | 10/2005 |
| JP | A-2005-302567 | 10/2005 |
| JP | A-2006-190759 | 7/2006 |
| JP | A-2006-233162 | 9/2006 |
| JP | A-2007-042316 | 2/2007 |
| JP | A-2007-207655 | 8/2007 |
| JP | A-2007-242816 | 9/2007 |
| JP | A-2008-10251 | 1/2008 |
| JP | A-2008-16336 | 1/2008 |
| JP | B2-4045691 | 2/2008 |
| JP | A-2008-078495 | 4/2008 |
| JP | A-2008-258641 | 10/2008 |
| JP | A-2009-013413 | 1/2009 |

OTHER PUBLICATIONS

Office Action mailed Oct. 16, 2012 in corresponding JP Patent Application No. 2009-033935 (and English translation).

Office Action mailed Oct. 16, 2012 in corresponding JP Patent Application No. 2008-128207 (and English translation).

Office Action mailed Oct. 16, 2012 in corresponding JP Patent Application No. 2008-243435 (and English translation).

Office Action dated Jun. 20, 2012 in corresponding KR Patent Application No. 10-2010-7026933 (and English translation).

International Search Report and Written Opinion of the International Searching Authority mailed on Jun. 30, 2009, for the corresponding international patent application No. PCT/JP2009/002121(English translation enclosed).

Office Action dated Jan. 16, 2013 in a corresponding Korean application No. 10-2012-7027530 (and English translation).

Office Action dated Feb. 5, 2013 mailed in a corresponding Japanese application No. JP2009-021390 (and English translation).

FIG. 1
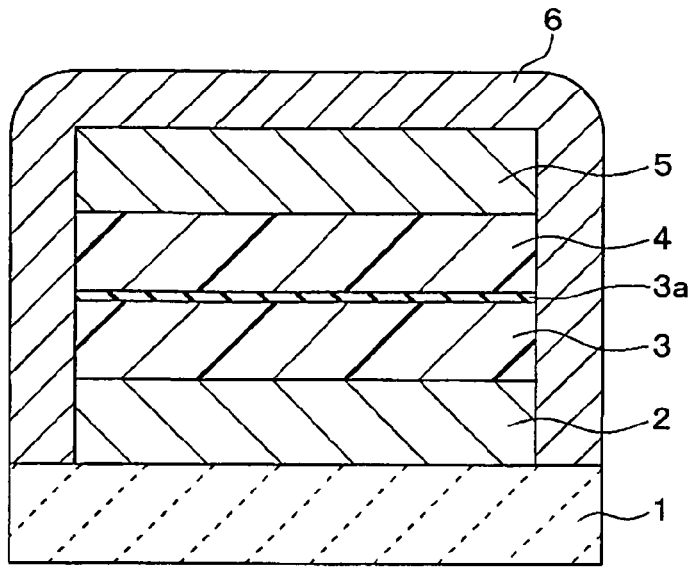
FIG. 2
|  | EXAMPLE 1 | EXAMPLE 2 | EXAMPLE 3 | EXAMPLE 4 | COMPARATIVE EXAMPLE 1 |
|---|---|---|---|---|---|
| Vo (V) | 5.3 | 6.2 | 6.9 | 6.0 | 7.3 |
| LT50 (HOURS) | 156 | 73 | 108 | 134 | 16 |
| N (SPOTS) | 0 | 0 | 0 | 0 | 18 |
FIG. 3
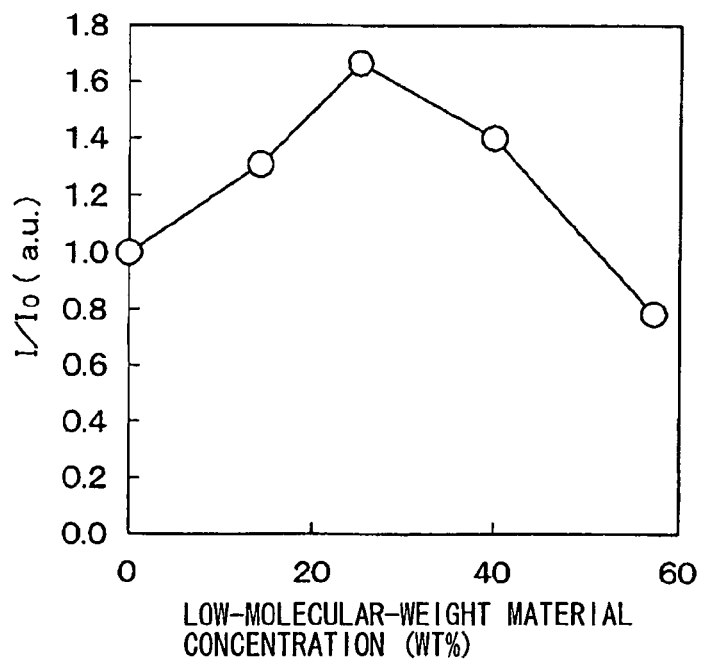

[CHEMICAL 3]

[CHEMICAL 4]

[CHEMICAL 5]

[CHEMICAL 6]

[CHEMICAL 7]

[CHEMICAL 8]

[CHEMICAL 9]

[CHEMICAL 10]

【CHEMICAL 11】

【CHEMICAL 12】

【CHEMICAL 13】

[CHEMICAL 14]

[CHEMICAL 15]

[CHEMICAL 16]

[CHEMICAL 17]

[CHEMICAL 18]

[CHEMICAL 19]

[CHEMICAL 20]

[CHEMICAL 21]

FIG. 23
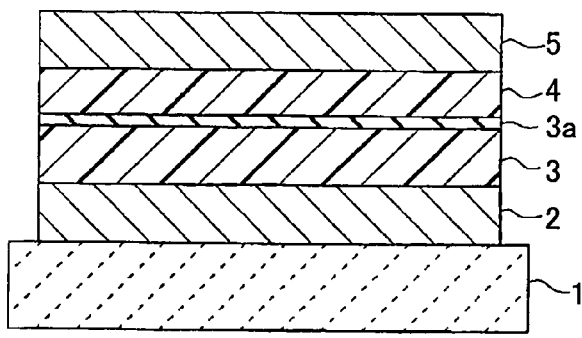
FIG. 24
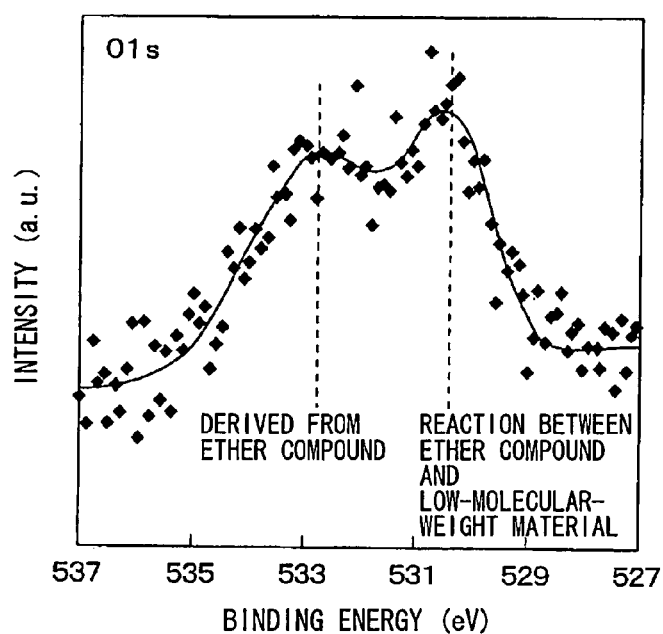
FIG. 25
| | EXAMPLE 8 | EXAMPLE 9 | EXAMPLE 10 | EXAMPLE 11 | EXAMPLE 12 | EXAMPLE 13 |
|---|---|---|---|---|---|---|
| I/Io | 5.0 | 1.5 | 4.0 | 2.0 | 4.2 | 2.5 |

FIG. 26
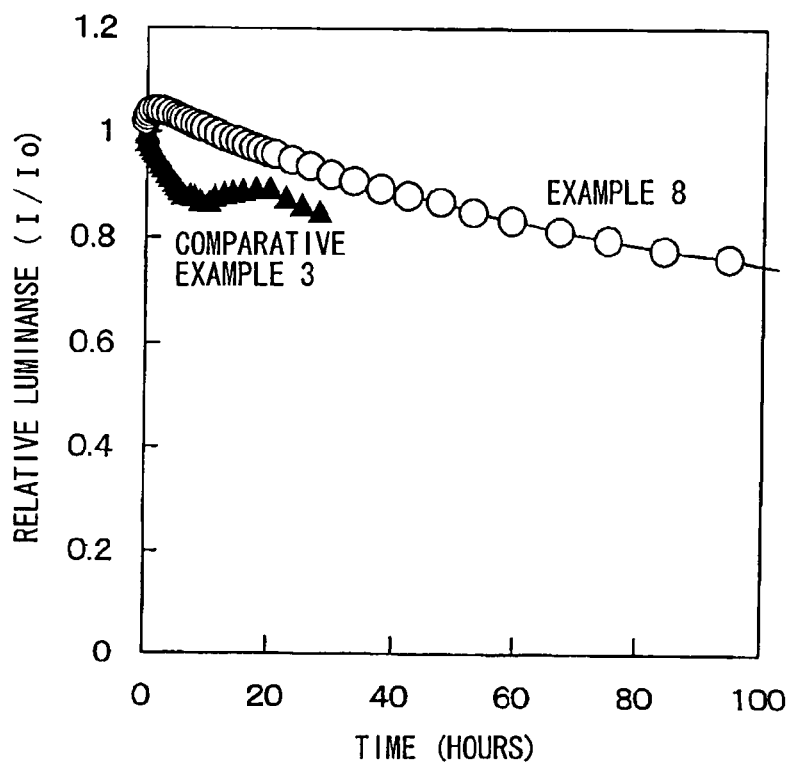
FIG. 27
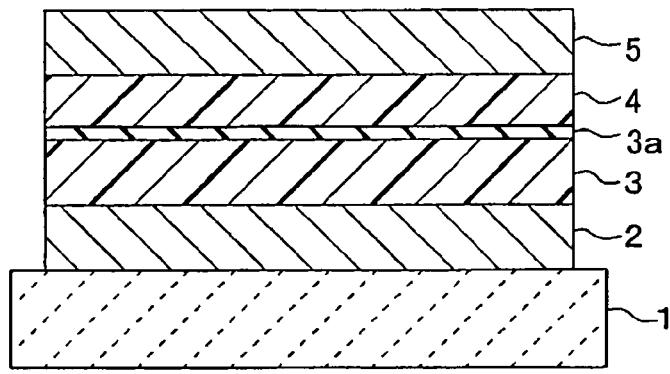
FIG. 28
| | EXAMPLE 16 | EXAMPLE 17 | EXAMPLE 18 | EXAMPLE 19 | EXAMPLE 20 | EXAMPLE 21 | EXAMPLE 22 | EXAMPLE 23 |
|---|---|---|---|---|---|---|---|---|
| I/Io | 2.9 | 1.3 | 3.1 | 1.5 | 2.0 | 3.4 | 3.0 | 2.3 |

【CHEMICAL 22】

【CHEMICAL 23】 (DNA)PP (MOLECULAR WEIGHT 792, Tg 194°C)

(8)

【CHEMICAL 24】 TFLFL (MOLECULAR WEIGHT 993, Tg 186°C)

(9)

【CHEMICAL 25】 TNFL (MOLECULAR WEIGHT 728, Tg 169°C)

(10)

【CHEMICAL 26】 NPB-CH$_2$-NPB (MOLECULAR WEIGHT 1189, Tg 120°C)

(11)

【CHEMICAL 27】 (PTB)DNPP (MOLECULAR WEIGHT 1029, Tg 127°C)

(12)

【CHEMICAL 28】 s-TPT (MOLECULAR WEIGHT 975, Tg 120°C)

(13)

【CHEMICAL 29】 TBATA (MOLECULAR WEIGHT 1209)

(14)

ORGANIC LUMINESCENT DEVICE AND MANUFACTURING METHOD THEREOF

CROSS REFERENCE TO RELATED APPLICATIONS

The present application is based on Japanese Patent Application No. 2008-128207 filed on May 15, 2008, Japanese Patent Application No. 2008-243435 filed on Sep. 23, 2008, Japanese Patent Application No. 2009-21390 filed on Feb. 2, 2009, and Japanese Patent Application No. 2009-33935 filed on Feb. 17, 2009, the disclosures of which are herein incorporated by reference.

TECHNICAL FIELD

The present invention relates to an organic luminescent device using a polymer luminescent material and a manufacturing method thereof.

BACKGROUND ART

Conventionally, in Patent Documents 1 and 2, there are disclosed organic EL devices each in a structure in which a light-emitting layer is formed directly on a hole transport layer or an anode. In the organic EL device, the hole transport layer is formed of a polymer thin film, and the light-emitting layer is formed of a polymer phosphor and an electron-donating and/or electron-accepting organic compound. Whereas, in Patent Document 3, there is disclosed a structure of lamination of a low-molecular-weight hole transport layer formed with a deposition method, and a polymer light-emitting layer formed with a coating method.

However, as in the case where an organic EL device is applied as an in-vehicle display device, when the organic EL device is used under severe environment, it is important that the hole transport layer is formed of low-molecular-weight material. However, it is not preferable that the hole transport layer is formed of a polymer thin film as with the structures described in Patent Documents 1 and 2. With the mechanism by which the polymer hole transport layer transports holes, the polymer material repeats an oxidation-reduction cycle, and thereby carries out hole transport. However, the oxidized polymer material is not necessarily returned to the original state, but may become another reaction product upon oxidation. This conceivably results in that the layer partially ceases to function as the hole transport layer, thereby to be deteriorated. Particularly, the polymer hole transport layer is considered to be more remarkably deteriorated than the low-molecular-weight hole transport material. Thus, the hole transport layer including a polymer material has a problem in durability.

Whereas, in Patent Document 3, the hole transport layer is formed of a low-molecular-weight material. For this reason, there is no problem in terms of durability. However, when the light-emitting layer is formed of a mere polymer material, the interface between the hole transport layer and the light-emitting layer is the interface between the low-molecular weight material and the polymer material. Accordingly, the differences in physical states such as film density at the interface unfavorably result in a low adhesion, and also a low carrier injectability.

Further, conventionally, there are a low-molecular-weight compound type organic EL device and a polymer type organic EL device. When a low-molecular-weight compound type organic EL is adopted, it is possible to form an organic EL device with a high high-temperature durability and a long lifetime; but, a large-scale apparatus including a large number of combined vacuum deposition devices (vacuum deposition chambers) is required, unfavorably resulting in a very high manufacturing cost. Whereas, when a polymer type organic EL device is adopted, the vacuum deposition step required during the manufacturing process is only a cathode formation step, and for other steps, a non-vacuum process can be used. This allows a reduction of the manufacturing cost. However, on the other hand, there are problems such as low high-temperature durability due to instability of the polymer hole transport layer including PEDOT: PSS, or the like, short lifetime, and voltage increase associated with driving.

For use as an in-vehicle display device, particularly a segment display device, there is required an organic EL device low in cost, high in high-temperature durability, and long in lifetime. For this reason, both the devices are difficult to use so long as they remain as they are.

For this reason, an organic EL device is under consideration which has solved the respective problems by adopting a multilayer structure of a low-molecular-weight hole transport layer formed with a vacuum deposition method and a polymer light-emitting layer formed with a coating method. However, when the low-molecular-weight hole transport layer and the polymer light-emitting layer are in contact with each other, the low-molecular-weight material forming the low-molecular-weight hole transport layer dissolves into the solvent of the polymer coating solution.

Thus, in Patent Document 3, there is proposed an organic EL device configured such that the low-molecular-weight material forming the low-molecular-weight layer is less likely to dissolve in the solvent of the polymer coating solution. Specifically, to the low-molecular-weight hole transport material, a crosslinkable organic compound having a siloxane skeleton, a crosslinkable organic compound including a silane coupling compound, or a crosslinkable organic compound including at least one of a double bond group, an epoxy group, and a cyclic ether group is mixed, and the resulting mixture is deposited. After deposition, the material is subjected to heat polymerization, photopolymerization, or electron beam polymerization, thereby to be made poorly soluble. As a result, the low-molecular-weight material becomes less likely to dissolve in the solvent of the polymer coating solution.

Whereas, as a technology of reducing the solubility in the solvent of an organic coating film, there is also known solubility reduction by photopolymerization using a photosensitive coating solution used in a photolithography method.

However, as shown in Patent Document 3, with the method of solubility reduction by effecting heat polymerization, photopolymerization, or electron beam polymerization after deposition, or solubility reduction by photopolymerization using a photosensitive coating solution, a material containing an instable crosslinkable functional group is required to be used. For this reason, the device characteristics tend to become instable. Further, unpolymerized radicals remain in the film, which tends to result in a short lifetime. Further, for example, even when solubility reduction is accomplished, with the foregoing method, it is not that dissolution is completely inhibited. Accordingly, although improved, there still remains a problem that the constituent material of the low-molecular-weight hole transport layer dissolves into the solvent of the polymer coating solution.

Further, self light-emitting devices such as EL (electroluminescence) devices are capable of high-luminance light emission, and is capable of being reduced in power consumption and being reduced in thickness of the apparatus. Thus, the self light-emitting devices receive attention as next-generation display devices or light source devices. In an organic EL device which is one kind of the self light-emitting devices, for the light-emitting layer provided between the hole injection electrode and the electron injection electrode, an organic material is used. This results in high degree of freedom for the light emission color. On the other hand, there are problems such as low durability due to the low coverage resulting from the very small film thickness of the light-emitting layer or the like, and the low durability of the adopted organic material itself. Thus, there have been conducted research and development for enhancing the durability.

For such organic EL devices, there have been proposed a low-molecular-weight compound type organic EL device using a low-molecular-weight material as the organic luminescent material and a polymer type organic EL device using a polymer material. In the case of the low-molecular-weight compound type organic EL device, not only for the light-emitting layer but also for the hole transport layer or the electron transport layer, low-molecular-weight organic materials are respectively used. Respective layers can be sequentially stacked on a substrate with a vacuum deposition method or the like. Such a low-molecular-weight compound type organic EL device has already come into practical use. Thus, not only as individual low-molecular-weight materials used but also as the whole device, the reliability is being improved.

On the other hand, for the EL device using a polymer material as a luminescent material, as a method for stacking the polymer material on a substrate, there can be adopted a method of coating, printing, or the like. Whereas, a single polymer organic material often includes both of the light-emitting function and the carrier transport function. This makes it easy to obtain an organic EL device of a simple configuration in which a monolayer polymer organic material layer is formed between electrodes. Further, as described above, the polymer organic material can be formed with a printing method. For this reason, it is easy to pattern the polymer organic material on a per RGB pixels basis.

Further, there is also a trial to adopt both of the low-molecular-weight organic material and the polymer organic material for the organic EL device. For example, in Patent Document 4, there is shown an organic EL device configured as follows: on a substrate, a first electrode is formed; on the first electrode, a first organic film layer formed of a low-molecular-weight light-emitting material is formed; on the first organic film layer, a second organic film layer formed of a polymer electron transport material is formed; and on the second organic film layer, a second electrode is formed. For the organic EL device, not that the first and second organic film layers are sequentially stacked on the first electrode, but that the second organic film layer and the first organic film layer are provided sequentially from the film side on an additionally adopted donor film. From the donor film, the first organic film layer (low-molecular-weight light-emitting substance layer) and the second organic film layer (polymer electron transport substance) are simultaneously transferred onto the first electrode on the substrate with a laser induced thermal transfer imaging (LITI) method.

In Patent Document 5, there is proposed an organic EL device which includes functional layers including at least a light-emitting layer between a first electrode and a second electrode. The organic EL device includes, as the functional layers, from the first electrode side, a light-emitting layer using a polymer organic material, and on the light-emitting layer, an electron transport layer farmed of, a low-molecular-weight organic material. Further, it is proposed that a hole injection/transport layer using a polymer organic material as with the light-emitting layer is formed between the first electrode and the light-emitting layer. The hole injection/transport layer and the light-emitting layer using a polymer organic material are formed with an ink jet printing method.

In Patent Document 6, there is proposed an organic EL device including a hole injection/transport layer, and a light-emitting layer stacked from the anode side between the anode and the cathode. For the hole injection/transport layer, a polymer material is used, and the layer is formed with a wet method. For the light-emitting layer, a low-molecular-weight light-emitting material is used, and the layer is stacked using a wet method.

Whereas, Patent Document 7 describes as follows. Between a first electrode layer and a second electrode layer, a light-emitting medium lamination is included. The light-emitting medium lamination includes a layer formed as a low-molecular-weight material layer including a low-molecular-weight material having a weight-average molecular weight of 1000 or less, and a layer formed as a polymer material layer including a polymer material having a weight-average molecular weight of 1000 or more. Further, at least one low-molecular-weight material layer and at least one polymer material layer are stacked with the surfaces in contact with each other. In other words, the polymer material layers and the low-molecular-weight material layers are stacked alternately one on another. This configuration can inhibit the occurrences of crystallization and aggregation on the surface of the low-molecular-weight material layer.

As described above, the low-molecular-weight compound type organic EL device is capable of forming an organic EL device high in high-temperature durability and long in lifetime. However, deposition using a vacuum deposition method requires deposition in a vacuum chamber. When a different light-emitting layer is formed for each of RGB pixels, patterning using a deposition mask is required. Further, as a single low-molecular-weight organic material, a material having all the functions of hole transport, light emission, and electron transport has not yet been developed. Thus, multiple layers are required to be stacked to form the device. This requires a large-scale apparatus including a large number of combined vacuum deposition devices (vacuum deposition chambers). Accordingly, the manufacturing cost tends to be very high.

On the other hand, for the polymer type organic EL device, the vacuum deposition step is used only for a cathode formation step. For other steps, a non-vacuum process can be used. Therefore, the manufacturing cost can be reduced. Further, as described above, patterning is easy. Also in this respect, the polymer type organic EL device is advantageous in reduction of the manufacturing cost. However, the organic EL device using a polymer organic material has more problems in terms of low high-temperature durability, short lifetime, voltage increase associated with driving, and the like than the low-molecular-weight compound type organic EL device.

As in Patent Documents 4 to 7, for the organic EL device, both of a low-molecular-weight material and a polymer material are used. This creates the possibility of obtaining advantages of polymer/low-molecular-weight compound. However, in actuality, in aiming at practical implementation, there are many problems including problems in durability, stability, and the like, and problems in terms of control of voltage increase and the like. Particularly, the requirement in terms of durability, especially, the durability under high-temperature high-humidity environment cannot be satisfied even when the multilayer structure of polymer/low-molecular weight compound is merely adopted.

PRIOR ART DOCUMENTS

Patent Documents

Patent Document 1: JP-A-H9-59614
Patent Document 2: Japanese Patent No. 4045691
Patent Document 3: JP-A-2008-16336
Patent Document 4: JP-A-2005-63977
Patent Document 5: JP-A-2005-285617
Patent Document 6: JP-A-2006-190759
Patent Document 7: JP-A-2007-242816

DISCLOSURE OF THE INVENTION

The present disclosure was done in view of the foregoing problems. It is an object of the present invention to provide an organic EL device which is high in durability, and is also high in adhesion of the interface between a hole transport layer and a light-emitting layer.

Further, it is another object thereof to provide an organic EL device and a manufacturing method thereof. The organic EL device is capable of, while adopting a structure of lamination of a low-molecular-weight hole transport layer and a polymer light-emitting layer, inhibiting the dissolution of the low-molecular-weight hole transport layer in the polymer light-emitting layer, and stabilizing the device characteristics and improving the lifetime.

Still further, it is a still other object of the present invention to provide an organic luminescent device which is low in cost, high in high-temperature durability, and long in lifetime.

In a first embodiment of the present disclosure, an organic EL device, includes: an electrode substrate; a hole injection electrode disposed on the electrode substrate; a hole transport layer disposed on the hole injection electrode; a light-emitting layer disposed on the hole transport layer; and an electron injection electrode disposed on the light-emitting layer. The hole transport layer is formed of a first low-molecular-weight material having a smaller molecular weight than a prescribed first molecular weight; and the light-emitting layer is formed of a mixture of a polymer material having a larger molecular weight than a prescribed second molecular weight and a second low-molecular-weight material having a smaller molecular weight than a prescribed third molecular weight.

Thus, by using the low-molecular-weight hole transport layer, it is possible to enhance the durability. Then, the light-emitting layer includes a mixture of a polymer material and a low-molecular-weight material. For this reason, the low-molecular-weight material added to the polymer material serves as a binder filling the gap of the steric hindrance to form entanglement of the polymer material and the low-molecular-weight material. This can enhance the adhesion of the interface between the low-molecular-weight hole transport layer and the light-emitting layer. Therefore, it is possible to implement an organic EL device high in durability, and also high in adhesion of the interface between the low-molecular-weight hole transport layer and the light-emitting layer.

In a second embodiment of the present disclosure, an organic EL device has: an electrode substrate; a hole injection electrode disposed on the electrode substrate; a hole transport layer disposed on the hole injection electrode; a poorly soluble layer disposed on the surface of the hole transport layer; a light-emitting layer disposed on the poorly soluble layer; and an electron injection electrode disposed on the light-emitting layer. The device is characterized in that the hole transport layer is formed of a low-molecular-weight material having a smaller molecular weight than a prescribed first molecular weight; the poorly soluble layer is formed of a surface-treated film obtained by treating the surface of the hole transport layer with an ether compound; and the light-emitting layer is formed of a polymer material having a larger molecular weight than a prescribed second molecular weight.

Thus, by surface-treating the low-molecular-weight hole transport layer with an ether compound, it is possible to form the poorly soluble layer. The poorly soluble layer can prevent the constituent material of the low-molecular-weight hole transport layer from dissolving into the polymer light-emitting layer. Therefore, while a structure of lamination of the low-molecular-weight hole transport layer and the polymer light-emitting layer is adopted, the low-molecular-weight hole transport layer is inhibited from dissolving into the polymer light-emitting layer, and stabilization of the device characteristics and the lifetime improvement can be achieved.

In a third embodiment of the present disclosure, a method for manufacturing an organic EL device, includes: a step of forming a hole injection electrode on an electrode substrate; a step of forming a hole transport layer on the hole injection electrode; a step of treating the surface of the hole transport layer with an ether compound, and thereby forming a poorly soluble layer on the surface of the hole transport layer; a step of forming a light-emitting layer on the surface of the poorly soluble layer; and a step of forming an electron injection electrode on the light-emitting layer. The method is characterized in that the hole transport layer is formed of a low-molecular-weight material having a smaller molecular weight than a prescribed first molecular weight; and the light-emitting layer is formed of a polymer material having a larger molecular weight than a prescribed second molecular weight.

Thus, the poorly soluble layer can be formed by subjecting the low-molecular-weight hole transport layer to a surface treatment with an ether compound. The detailed structure of the poorly soluble layer formed by the surface treatment is not definite. However, the poorly soluble layer is assumed to be in any of: a state in which the surface of the low-molecular-weight hole transport layer is coated with an ether compound in a film; a state in which molecules forming an ether compound are introduced in the low-molecular-weight hole transport layer, resulting in a mixture with the low-molecular-weight material; or a state in which a chemical reaction with the low-molecular-weight material forming the low-molecular-weight hole transport layer results in an ether compound. With such a manufacturing method, it is possible to manufacture the organic EL device of the second embodiment of the present disclosure.

In a fourth embodiment of the present disclosure, an organic EL device, has: an electrode substrate; a hole injection electrode disposed on the electrode substrate; a hole transport layer disposed on the hole injection electrode; a poorly soluble layer disposed on the surface of the hole transport layer; a light-emitting layer disposed on the poorly soluble layer; and an electron injection electrode disposed on the light-emitting layer. The device is characterized in that the hole transport layer is formed of a low-molecular-weight material having a smaller molecular weight than a prescribed first molecular weight; the poorly soluble layer is formed of a surface-treated film obtained by treating the surface of the hole transport layer with an organic acid; and the light-emitting layer is formed of a polymer material having a larger molecular weight than a prescribed second molecular weight.

Thus, by surface-treating the low-molecular-weight hole transport layer with an organic acid, it is possible to form the poorly soluble layer. The poorly soluble layer can prevent the constituent material of the low-molecular-weight hole transport layer from dissolving into the polymer light-emitting layer. Therefore, while a structure of lamination of the lowmolecular-weight hole transport layer and the polymer light-emitting layer is adopted, the low-molecular-weight hole transport layer is inhibited from dissolving into the polymer light-emitting layer, and stabilization of the device characteristics and the lifetime improvement can be achieved.

In a fifth embodiment of the present disclosure, a method for manufacturing an organic EL device, includes: a step of forming a hole injection electrode on an electrode substrate; a step of forming a hole transport layer on the hole injection electrode; a step of treating the surface of the hole transport layer with an organic acid, and thereby forming a poorly soluble layer on the surface of the hole transport layer; a step of forming a light-emitting layer on the surface of the poorly soluble layer; and a step of forming an electron injection electrode on the light-emitting layer. The method is characterized in that the hole transport layer is formed of a low-molecular-weight material having a smaller molecular weight than a prescribed first molecular weight; and the light-emitting layer is formed of a polymer material having a larger molecular weight than a prescribed second molecular weight.

Thus, the poorly soluble layer can be formed by subjecting the low-molecular-weight hole transport layer to a surface treatment with an organic acid. The detailed structure of the poorly soluble layer formed by the surface treatment is not definite. However, the poorly soluble layer is assumed to be in any of: a state in which the surface of the low-molecular-weight hole transport layer is coated with an organic acid in a film; a state in which molecules forming an organic acid are introduced in the low-molecular-weight hole transport layer, resulting in a mixture with the low-molecular-weight material; or a state in which a chemical reaction with the low-molecular-weight material forming the low-molecular-weight hole transport layer results in an organic acid compound. With such a manufacturing method, it is possible to manufacture the organic EL device according to the fourth embodiment of the present disclosure.

In a sixth embodiment of the present disclosure, an organic luminescent device, includes: a hole injection electrode; an electron injection electrode; a light-emitting layer disposed between the hole injection electrode and the electron injection electrode; and a hole transport layer disposed between the hole injection electrode and the light-emitting layer. The organic luminescent device is characterized in that the hole transport layer is formed of a low-molecular-weight material having a smaller molecular weight than a prescribed first molecular weight; the hole transport layer is formed of a vacuum deposition film; the light-emitting layer covers the hole transport layer; and the light-emitting layer is formed of a polymer material having a larger molecular weight than a prescribed second molecular weight as a luminescent material.

In accordance with the present invention, in the organic luminescent device, as the hole transport layer, a vacuum deposition layer of a low-molecular-weight hole transport material is used. A light-emitting layer using a polymer material as a luminescent material is formed in such a manner as to cover the hole transport layer. As a result, it is possible to obtain an organic EL device high in high-temperature durability and long in lifetime at a low cost. The organic EL device can also be preferably adopted in uses requiring durability under high-temperature high-humidity environment, such as for an in-vehicle display device. Further, the device can be manufactured at a low cost, and hence can be adopted for a segment type display device, or the like, strongly required to be low in cost.

BRIEF DESCRIPTION OF THE DRAWINGS

The above and other aspects, features and advantages of the present invention will become more apparent from the following detailed description made with reference to the accompanying drawings. In the drawings:

FIG. 1 is a cross-sectional view of an organic EL device for illustrating a first embodiment of the present invention;

FIG. 2 is a view summarizing the initial driving voltages V0, the luminance half decay lifetimes LT50, and the numbers of dark spots formed N, determined for samples manufactured in respective Examples and a sample of Comparative Example 1;

FIG. 3 is a graph showing the results of investigation of changes in $I/I_0$ where $I_0$ (cd/A) denotes the maximum luminous efficiencies for Example 1 and Comparative Example 1;

FIG. 23 is a cross-sectional view of an organic EL device described in a second embodiment of the present invention;

FIG. 24 shows an X-ray electron spectroscopy spectrum of the poorly soluble layer surface formed by forming a low-molecular-weight hole transport layer including a low-molecular-weight material with a vacuum deposition method, and then, performing a surface treatment with 1,1'-dibutyl ether;

FIG. 25 is a diagram showing the ratio of respective maximum luminous efficiencies of a sample shown in each Example and a sample of Comparative Example;

FIG. 26 is a view showing the changes with time in each luminance when Example 8 and Comparative Example 1 are constant-current driven at an initial luminance of 600 cd/m$^2$ under 25° C. environment;

FIG. 27 is a cross-sectional view of an organic EL device 300 described in a third embodiment of the present invention;

FIG. 28 is a diagram showing the ratio of respective maximum luminous efficiencies of a sample shown in each Example and a sample of Comparative Example in the third embodiment of the present invention;

PREFERRED EMBODIMENTS FOR CARRYING OUT THE INVENTION

First Embodiment

Figure 4:
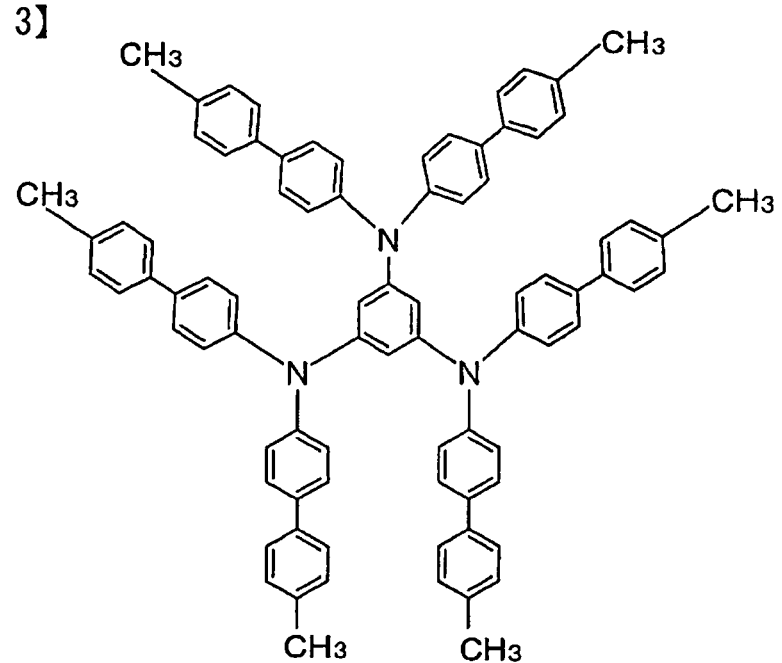
FIG. 4 shows a triphenylamine derivative material corresponding to Chemical Formula 3.
Figure 5:
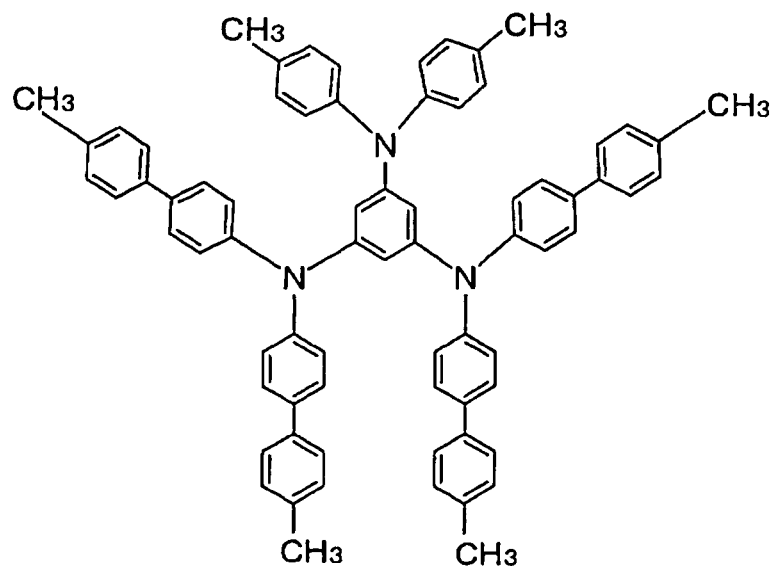
FIG. 5 shows a triphenylamine derivative material corresponding to Chemical Formula 4.
Figure 6:
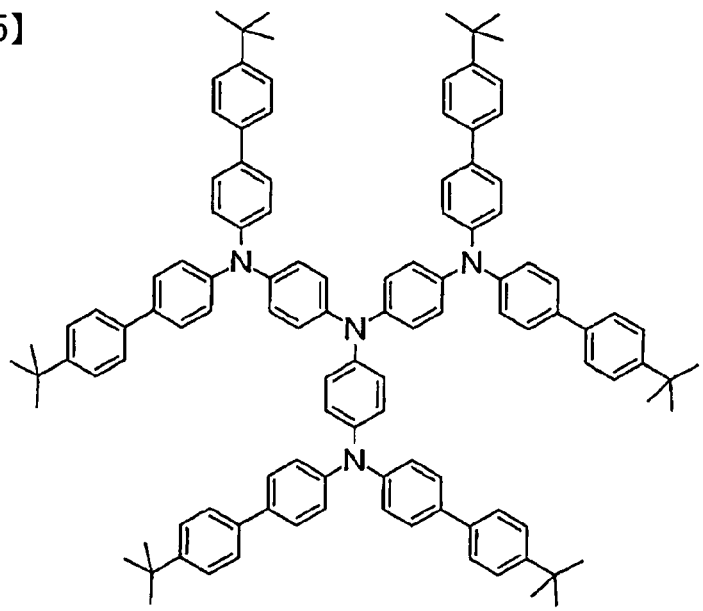
FIG. 6 shows a triphenylamine derivative material corresponding to Chemical Formula 5.
Figure 7:
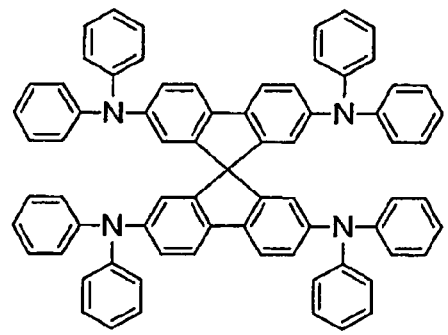
FIG. 7 shows a triphenylamine derivative material corresponding to Chemical Formula 6.
Figure 8:
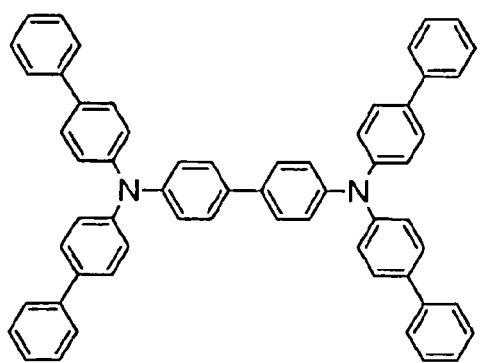
FIG. 8 shows a triphenylamine derivative material corresponding to Chemical Formula 7.
Figure 9:
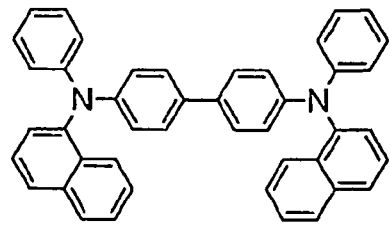
FIG. 9 shows a hole transportable material corresponding to Chemical Formula 8.
Figure 10:
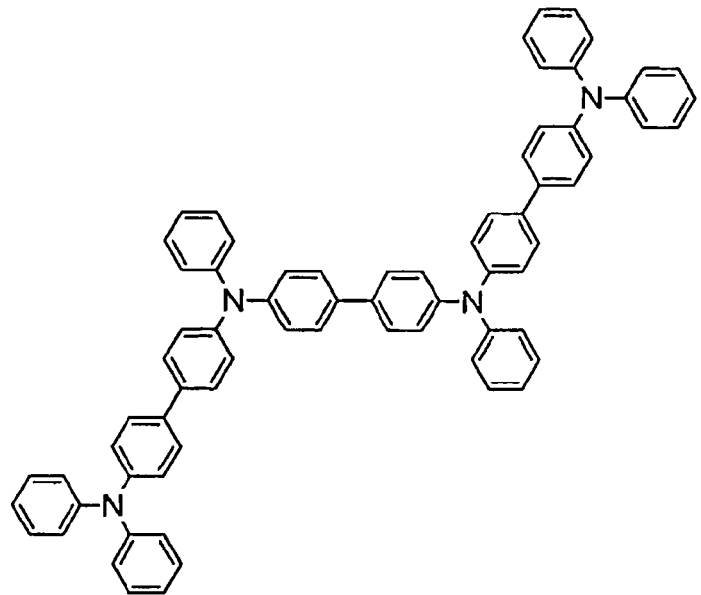
FIG. 10 shows a hole transportable material corresponding to Chemical Formula 9.
Figure 11:
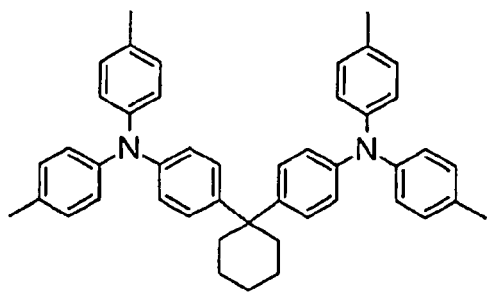
FIG. 11 shows a hole transportable material corresponding to Chemical Formula 10.
Figure 12:
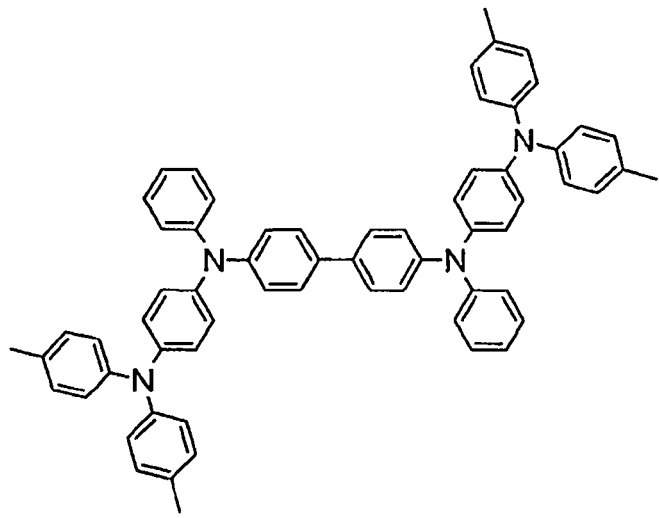
FIG. 12 shows a hole transportable material corresponding to Chemical Formula 11.
Figure 13:
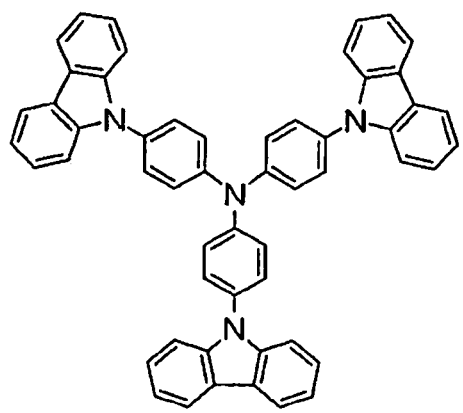
FIG. 13 shows a hole transportable material corresponding to Chemical Formula 12.
Figure 14:
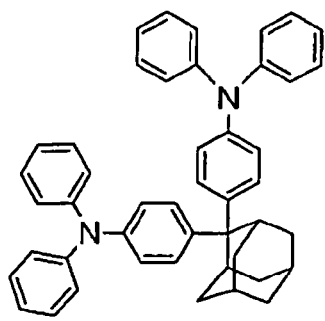
FIG. 14 shows a hole transportable material corresponding to Chemical Formula 13.
Figure 15:
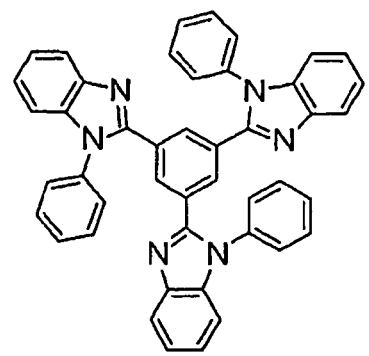
FIG. 15 shows an electron transportable material corresponding to Chemical Formula 14.
Figure 16:
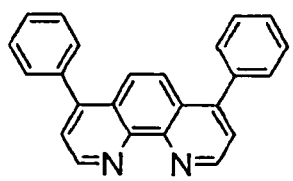
FIG. 16 shows an electron transportable material corresponding to Chemical Formula 15.
Figure 17:
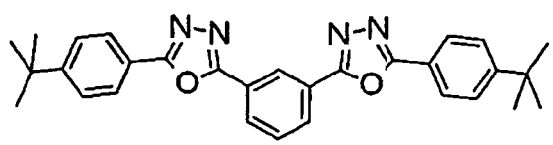
FIG. 17 shows an electron transportable material corresponding to Chemical Formula 16.
Figure 18:
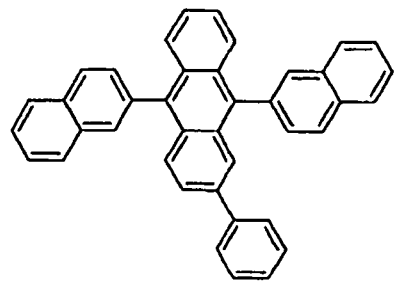
FIG. 18 shows an electron transportable material corresponding to Chemical Formula 17.
Figure 19:
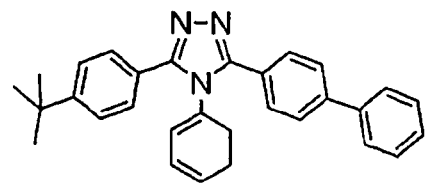
FIG. 19 shows an electron transportable material corresponding to Chemical Formula 18.
Figure 20:
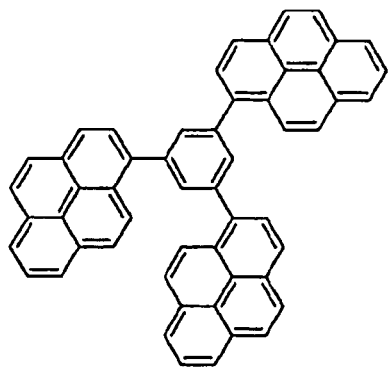
FIG. 20 shows an electron transportable material corresponding to Chemical Formula 19.
Figure 21:
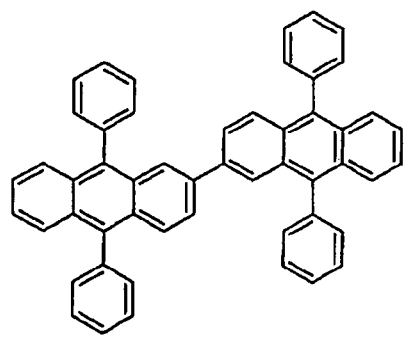
FIG. 21 shows an electron transportable material corresponding to Chemical Formula 20.
Figure 22:
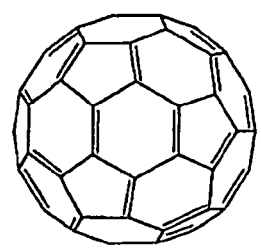
FIG. 22 shows a fullerene corresponding to Chemical Formula 21.

FIG. 1 is a schematic cross-sectional view showing a configuration of an organic EL device 100 in accordance with an embodiment of the present invention. As shown in this figure, on a substrate 1, a hole injection electrode 2, a low-molecular-weight hole transport layer 3 including a poorly soluble layer 3a, a light-emitting layer 4, and an electron injection electrode 5 are sequentially stacked. Further, these respective parts are covered with a metal can 6. This structure forms the organic EL device 100 in accordance with this embodiment.

The organic EL device 100 of such a structure is manufactured, for example, in the following manner. First, on the substrate 1, the hole injection electrode 2 is formed. Then, the low-molecular-weight hole transport layer 3 is formed with a vacuum deposition method. Subsequently, the surface of the low-molecular-weight hole transport layer 3 is subjected to a surface treatment with an ether compound or an organic acid. As a result, at the surface of the low-molecular-weight hole transport layer 3 to be the interface with the light-emitting layer 4, the poorly soluble layer 3a is formed which includes a mixture of the constituent material of the low-molecular-weight hole transport layer 3 and an ether compound or an organic acid. Then, the light-emitting layer 4 is formed with a coating method, and then, the electron injection electrode 5 is formed with a vacuum deposition method. Finally, by carrying out sealing by bonding of the metal can 6 in a dry nitrogen atmosphere, the organic EL device 100 shown in FIG. 1 is manufactured. The transport method between respective steps has no particular restriction. However, transport in a dry atmosphere is desirable.

Incidentally, the steps of surface treatment with an ether compound or an organic acid, formation of the light-emitting layer 4, and sealing are not restricted. However, the steps are desirably carried out in a dry inert gas atmosphere in a glove box or the like. Whereas, as the sealing method, other than sealing by the metal can 6, there are applicable various sealing methods such as sealing by bonding of glass or a film with a barrier, and a thin film sealing method in which a thin film such as a silicon nitride film is directly formed.

The substrate 1 includes an electrode substrate including, for example, transparent glass, quartz glass, a resin substrate with a barrier film, or a metal substrate.

The hole injection electrode 2 is formed of a given conductive substance capable of forming a transparent or translucent electrode. Specifically, as oxides, there are usable indium tin oxide (ITO), indium zinc oxide (IZO), tin oxide, zinc oxide, indium oxide, zinc aluminum oxide, zinc gallium oxide, titanium niobium oxide, and the like. However, out of these, particularly, ITO is a preferable material having advantages of being low in resistance, having a solvent resistance, being excellent in transparency, and the like. Further, there are also a method in which a metal material such as aluminum, gold, or silver is evaporated to deposit a translucent layer, and a method using an organic semiconductor such as polyaniline. Further, it is also possible to use still other methods. The hole injection electrode 2 may be, if required, subjected to patterning by etching, or may be subjected to surface activation by an UV treatment, a plasma treatment, or the like.

The low-molecular-weight hole transport layer 3 is desirably a triphenylamine derivative material high in hole transportability out of the low-molecular-weight materials. In the solvent drying step to be carried out after polymer material coating for forming the light-emitting layer 4, generally, about 120° C. heating is carried out. However, when the temperature of this heating step exceeds the glass transition point of the low-molecular-weight material, an increase in interface roughness due to aggregation of the low-molecular-weight material, mixing of both the materials, and the like are caused, resulting in deterioration of characteristics. For this reason, it is preferable that a low-molecular-weight material having a glass transition point equal to or higher than the solvent drying temperature after polymer material coating, i.e., 120° C. or more is used for the low-molecular-weight hole transport layer 3. Further, the constituent material of the low-molecular-weight hole transport layer 3 desirably has a sublimation temperature of 300° C. or more at a degree of vacuum of 1 Pa. This is for the following reason. In the case of a sublimation temperature of lower than 300° C., when a deposition film is formed under vacuum as high as $10^{-5}$ Pa or less, the deposition temperature is 200° C. or less, resulting in a difficulty in controlling the deposition rate. This makes it impossible to form a deposition film with a uniform film density. As those satisfying these conditions, mention may be made of, for example, the materials shown in Chemical Formulae 3 to 7. FIGS. 4 to 8 show Chemical Formulae 3 to 7, respectively.

Chemical Formula 3 represents N,N,N',N',N",N"-Hexakis-(4'-methyl-biphenyl-4-yl)-benzene-1,3,5-triamine (molecular weight 1119, glass transition point not observed, melting point 402 degrees); Chemical Formula 4, N,N,N',N'-Tetrakis-(4'-methyl-biphenyl-4-yl)-N",N",-biskis-(4'-methyl-phenyl)benzene-1,3,5-triamine (molecular weight 967, glass transition point 180 degrees); Chemical Formula 5, t-Bu-TBATA (N,N,N',N',N",N"-Hexakis-(4'-tert-butylbiphenyl-4-yl)-tris(4-aminophenyl)amine) (molecular weight 1540, glass transition point 203 degrees); Chemical Formula 6, Spiro-1-TAD (2,2',7,7'-tetrakis(diphenylamino)spiro-9,9'-bifluorene) (molecular weight 973, glass transition point 133 degrees); and Chemical Formula 7, TBPB (N,N,N',N'-tetrakis(4-biphenyl)-4,4'-diaminobiphenyl) (molecular weight 793, glass transition point 131.8 degrees). Incidentally, herein, specific examples of the triphenylamine derivative Materials represented by Chemical Formulae 3 to 7 were mentioned. However, these specific examples are not exclusive. Such a low-molecular-weight hole transport layer 3 can be formed with, for example, a vacuum deposition method in which a thin film is formed by heating and evaporating a low-molecular-weight material in vacuum.

As the formation method of the low-molecular-weight hole transport layer 3, a vacuum deposition method was mentioned. However, other than the vacuum deposition method, there may be used coating methods such as ink jet, printing, and spin coating, a laser induced thermal imaging (LITI) method, a vapor deposition method, and the like. However, in order to implement the vehicle mountability of the organic EL device, the quality of the low-molecular-weight hole transport layer 3 is important. Thus, formation with a vacuum deposition method capable of providing a film with the highest quality is most desirable in view of the purity/density/flatness of the formed film. Further, in order to further enhance the quality of the formed low-molecular-weight hole transport layer, a heat treatment may be performed.

Incidentally, herein, a description was given to the case where the low-molecular-weight hole transport layer 3 was formed on the monolayer hole injection electrode 2. However, the monolayer structure is not necessarily required to be adopted. For example, the following structure may also be adopted: on the side closest to the light-emitting layer 4, the low-molecular-weight hole transport layer high in treatment effect with an ether compound or an organic acid is disposed; in addition, under this, a low-molecular-weight hole transport layer lower in cost or higher in hole mobility is disposed, or a hole injection layer higher in hole injection efficiency is stacked. By adopting such a structure, it becomes possible to further reduce the cost and reduce the driving voltage of the organic EL device. Further, for materials each having a center of symmetry out of the triphenylamine derivative materials, particularly, for a starburst amine among them, when the material is formed in a thin film, molecules tend to be arrayed, resulting in an improvement of the solvent resistance. For this reason, a starburst amine can be more reduced in solubility, and is preferable.

The poorly soluble layer 3a is, as described above, formed by subjecting the surface of the low-molecular-weight hole transport layer 3 to a surface treatment with an ether compound or an organic acid. The poorly soluble layer 3a is formed as the one having a relatively strong bond due to the intermolecular interaction between ether and amine in the case of the surface treatment with an ether compound, or the one having a strong bond due to the acid-base reaction in the case of the surface treatment with an organic acid.

When an ether compound is used for the surface treatment in order to form the poorly soluble layer 3a, the ether compound desirably includes 5 or more and 15 or less carbon atoms. Further, the ether compound is desirably a compound represented by Chemical Formula 1 or Chemical Formula 2, where R1, R2, and R3 are each an alkyl group having 2 or more and 6 or less carbon atoms.

R1—O—R2  (Chemical Formula 1)

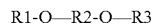

R1—O—R2—O—R3  (Chemical Formula 2)

The ether compound satisfying the conditions shows a high intermolecular interaction to the constituent material of the low-molecular-weight hole transport layer 3. For this reason, the surface of the low-molecular-weight hole transport layer 3 treated thereby shows a high solvent slight solubility. Further, the boiling point of the ether compound is desirably 50° C. or more and 250° C. or less. When the boiling point is less than 50° C., the ether compound rapidly volatilizes. This results in a possibility that the poorly soluble layer 3a can not be formed sufficiently. When the boiling point is higher than 250° C., removal of the excess ether compound after performing the surface treatment requires a treatment at high temperatures for a long time. This results in reduction of the productivity.

Specific examples satisfying these conditions may include dipropyl ether, dibutyl ether, dipentyl ether, dihexyl ether, ethylene glycol diethyl ether, ethylene glycol dipropyl ether, and ethylene glycol dibutyl ether. Further specifically, mention made of: dipropyl ethers such as 1,1'-dipropyl ether and di-iso-propyl ether; dibutyl ethers such as 1,1'-dibutyl ether, 2,2'-dibutyl ether, and di-tert-butyl ether; dipentyl ethers such as 1,1'-dipentyl ether, 2,2'-dipentyl ether, and 3,3'-dipentyl ether; dihexyl ethers such as 1,1'-dihexyl ether, 2,2'-dihexyl ether, and 3,3'-dihexyl ether; ethylene glycol dipropyl ethers such as ethylene glycol-1,1'-dipropyl ether and ethylene glycol di-iso-propyl ether; ethylene glycol dibutyl ethers such as ethylene glycol-1,1'-dibutyl ether, ethylene glycol-2,2'-dibutyl ether; and ethylene glycol di-tert-butyl ether; and the like.

Whereas, when an organic acid is used for the surface treatment for forming the poorly soluble layer 3a, as the organic acid, mention may be made of a sulfonic acid compound, a carboxylic acid compound, a hydroxy compound, a thiol compound, an enol compound, or an organic phosphoric acid compound. Particularly, a sulfonic acid compound having a strong acidity is desirable. Secondly, a carboxylic acid compound and an organic phosphoric acid compound are desirable. Specifically, as the sulfonic acid compounds, mention may be made of benzenesulfonic acid, para-toluenesulfonic acid, dodecylbenzenesulfonic acid, and ethanesulfonic acid. As the carboxylic acid compounds, mention may be made of 4-methylbenzoic acid, acetic acid, formic acid, oxalic acid, phthalic acid, and malonic acid. As the hydroxy compounds, mention may be made of phenol and picric acid. As the thiol compound, mention may be made of 1-propanethiol; as the enol compound, pentanedione; and as the organic phosphoric acid compound, bis(2-ethylhexyl) phosphate, or the like.

As the surface treatment methods of the low-molecular-weight hole transport layer 3 with an ether compound or an organic acid for forming the poorly soluble layer 3a, mention may be made of a method of coating of a solution containing an ether compound or an organic acid with a spin coating method, a dipping method, a spray method, or the like, a method of exposure in a vapor containing an ether compound or an organic acid, and other techniques. These are non-limiting. However, the foregoing methods are desirable in view of mass productivity, and the like.

Further, in order to remove an excess ether compound or an excess organic acid present on the surface after performing the surface treatment, the surface of the low-molecular-weight hole transport layer 3 may be cleaned with alcohol or a hydrocarbon-based solvent, or the low-molecular-weight hole transport layer 3 may be heated. In this manner, the excess ether compound or the excess organic acid can also be removed. For this reason, the concentration of the solution containing an ether compound or an organic acid, or the vapor concentration of an ether compound or an organic acid has no particular restriction unless the molecular structure of the material of the low-molecular-weight hole transport layer 3 is changed. Alternatively, the following procedure is also acceptable: after forming the light-emitting layer 4 on the low-molecular-weight hole transport layer 3 subjected to the surface treatment with an ether compound or an organic acid, a heat treatment is carried out; as a result, the ether compound or the organic acid is volatilized and removed. The heat treatment temperature is, desirably set at the glass transition point or lower of the low-molecular-weight hole transport material, or, at the melting point or lower when there is no glass transition point. This can reduce the amount of the ether compound or the organic acid which is a different kind of compound remaining on the interface. Accordingly, it becomes possible to further reduce the driving voltage and elongate the lifetime. However, when the ether compound or the organic acid is volatilized, the reactive bond between the low-molecular-weight hole transport material and the ether compound, or the bond resulting from the acid-base reaction between the low-molecular-weight hole transport material and the organic acid may be partially decomposed, resulting in degradation in the slight solubility. For this reason, in order to allow expression of effects thereof, the combination with a low-molecular-weight hole transport material low in solubility in the light-emitting layer coating solution solvent is desirable.

Further, in order to make the solubility-reducing effect still stronger, a heat treatment may be carried out. However, the heating temperature at this step and the heating temperature for removing the excess ether compound or the excess organic acid is desirably set at the glass transition point or lower of the low-molecular-weight material forming the low-molecular-weight hole transport layer 3, or the melting point or lower when there is no glass transition point.

Whereas, the film thickness of the poorly soluble layer 3a is preferably 10 nm or less. This is for the following reasons: the poorly soluble layer 3a is lower in hole mobility than the low-molecular-weight hole transport layer 3; and when the film thickness of the poorly soluble layer 3a is larger than 10 nm, the driving voltage is increased.

The light-emitting layer 4 includes a mixture of a polymer material (polymer organic luminescent material) and a low-molecular-weight material. As the polymer material, there can be used a polyfluorene (PFO) type polymer, a polyphenylene vinylene (PPV) type polymer, a polyvinyl carbazole (PVK) type polymer, or the like. There can be also used the one obtained by dispersing a fluorescent dye or a phosphorescent dye in the polymer, a polystyrene type polymer, a polythiophene type polymer, a polymethyl methacrylate type polymer, or the like. The polymer material is dissolved with the low-molecular-weight material in a single solvent such as toluene, xylene, acetone, anisole, methyl anisole, dimethyl anisole, tetralin, ethyl benzoate, methyl benzoate, methyl ethyl ketone, cyclohexanone, methanol, ethanol, isopropyl alcohol, ethyl acetate, butyl acetate, or water, or a mixed solvent thereof. As a result, a coating solution is prepared. With a coating method using the coating solution, the light-emitting layer 4 can be formed. Out of the solvents, particularly, aromatic solvents such as toluene, xylene, anisole, methyl anisole, dimethyl anisole, tetralin, ethyl benzoate, and methyl benzoate are good in solubility for the polymer materials, and are also easy to handle. For this reason, the aromatic solvents are more preferable solvents.

As the coating method for forming the polymer material of the light-emitting layer 4, there can be used a method such as spin coating method, ink jet method, printing method, dip coating method, or spray method. Further, when the light-emitting layer 4 is formed with a coating method, a high-temperature drying treatment is carried out in order to volatilize the solvent. However, when the treatment temperature exceeds the glass transition point of the low-molecular-weight hole transport layer material, degradation of the characteristics due to mixing of both at the interface, or the like is caused. For this reason, the glass transition point of the constituent material of the low-molecular-weight hole transport layer 3 is desirably 120° C. or more which is the commonly used drying temperature.

Further, the low-molecular-weight material to be added to the polymer material may be any of the hole transportable material and the electron transportable material, or both thereof. However, the light emitted at the light-emitting layer 4 may be absorbed by the low-molecular-weight material, resulting in reduction of the efficiency; or the low-molecular-weight material itself may emit light, which causes deviation from the desirable chromaticity. In order to prevent this phenomenon from occurring, the HOMO-LUMO gap of the low-molecular-weight material included in the light-emitting layer 4 is desirably larger than the luminous energy of the light emitted from the light-emitting layer 4. For example, as the hole transportable materials, mention may be made of the materials represented by Chemical Formulae 8 to 13; and as the electron transportable materials, the materials represented by Chemical Formulae 14 to 20.

Chemical Formula 8 represents NPB (N,N'-Bis(naphthalen-1-yl)-N,N'-bis(phenyl)-benzidine) (molecular weight 588, glass transition point 98° C.); Chemical Formula 9, TPTE (N,N'-bis(4-diphenylamino-4'-biphenyl)-N,N'-diphenyl-4,4'-diaminobiphenyl), (molecular weight 975, glass transition point 143° C.); Chemical Formula 10, TAPC (Di-[4-(N,N-ditolyl-amino)-phenyl]cyclohexane); Chemical Formula 11, NTNPB (N,N'-di-phenyl-N,N'-di-[4-(N,N-ditolyl-amino)phenyl]benzidine); Chemical Formula 12, TCTA (4,4',4"-Tris(carbazol-9-yl)triphenylamine) (molecular weight 740, glass transition point 151° C.); and Chemical Formula 13, TAPA (Di-[4-N,N-diphenyl-amino)-phenyl]adamantane). Further, Chemical Formula 14 represents TPBi (2,2'2"-(1,3,5-Benzinetriyl)-tris(1-phenyl-1-H-benzimidazole)); Chemical Formula 15, Bphen (4,7-Diphenyl-1,10-phenanthroline); Chemical Formula 16, OXD-7 (1,3-Bis[2-(4-tert-butylphenyl)1,3,4-oxadiazo-5-yl]benzene); Chemical Formula 17, PADN (2-phenyl-9,10-di(naphethalen-2-yl)-anthracene); Chemical Formula 18, TAZ (3-(4-Biphenylyl)-4-phenyl-5-tert-butylphenyl-1,2,4-triazole); Chemical Formula 19, TPB3 (1,3,5-Tri(pyren-1-yl)benzene); and Chemical Formula 20, TPBA (2,2'-Bi(9,10-diphenyl-anthracene).

Incidentally, herein, mention was specifically made of the hole transportable materials represented by Chemical Formulae 8 to 13, or the electron transportable materials represented by Chemical Formulae 14 to 20. However, these specific examples are non-limiting. Further, when the mixing amount of such a low-molecular-weight material is 1 wt % or more of the total amount of the polymer material and the low-molecular-weight material forming the light-emitting layer 4, the binder effect can be obtained with reliability. However, when the mixing amount of the low-molecular-weight material is 50 wt % or more, the added low-molecular-weight material itself acts as a quenching site, resulting in reduction of the efficiency. For this reason, in order to prevent the occurrence of the efficiency reduction phenomenon due to mixing of the low-molecular-weight material with the polymer material, it is desirable that the mixing amount of the low-molecular-weight material is preferably set at less than 50 wt %.

Further, the low-molecular-weight material included in the light-emitting layer 4 desirably includes either the hole transportable material or the electron transportable material, or both thereof, and more desirably includes at least the hole transportable material. This is for the following reason. Any of the hole transportable material and the electron transportable material can lead to expectation of the reliability improving effect resulting from the interface adhesion improvement due to the binder effect. However, with the hole transportable material, the effect of improving the hole injectability from the hole transport layer into the light-emitting layer 4 is also expectable. This enables still higher efficiency. Further, by further adding a luminous dye to the light-emitting layer 4, it is also possible to more enhance the luminous efficiency and to enhance the color rendering property.

The electron injection electrode 5 is configured in, for example, a low work function electrode structure. As the electron injection electrode 5, there can be used an alkali metal or an alkaline-earth metal, a lamination of an alkali metal or an alkaline-earth metal and a metal electrode such as aluminum, a lamination of a halide of an alkali metal or an alkaline-earth metal, and a metal electrode such as aluminum, or the like. Specifically, the electron injection electrode 5 includes Al/Ca, Al/Ba, Al/Li, Al/LiF, Al/CsF, Al/Ca/LiF, Al/BaO, or the like.

In this manner, the organic EL device 100 in accordance with this embodiment is formed and manufactured. Then, the function and the effect of such an organic EL device 100 will be described.

For the organic EL device 100 in accordance with this embodiment, there is adopted a lamination structure of the low-molecular-weight hole transport layer 3 formed with a vacuum deposition method and the light-emitting layer 4 including a mixture of a polymer material and a low-molecular-weight material. Namely, on the low-molecular-weight hole transport layer 3, the light-emitting layer 4 including a polymer material is disposed, thereby to form a polymer/low-molecular-weight compound lamination type organic EL device. The device is configured such that the low-molecular-weight material is mixed in the polymer material forming the light-emitting layer 4. Such a structure can provide the following effects.

With a low-molecular-weight compound type organic EL device in which the hole transport layer includes a low-molecular-weight material, it is possible to form an organic EL device with a high high-temperature durability and a long lifetime. On the other hand, a large-scale apparatus including a large number of combined vacuum deposition devices (vacuum deposition chambers) is required, unfavorably resulting in a very high manufacturing cost. Whereas, with a polymer type organic EL device in which the hole transport layer includes a polymer material, the vacuum deposition step includes only a cathode formation step, and for other steps, a non-vacuum process can be used. This allows low-cost formation. However, on the other hand, there are problems such as low high-temperature durability due to instability of the polymer hole transport layer including a polymer material such as PEDOT: PSS, a short lifetime, and a voltage increase associated with driving. When an organic EL device is use as an in-vehicle device, particularly used as a segment display device, there is required an organic EL device low in cost, high in high-temperature durability, and long in lifetime. For this reason, both the devices are difficult to use so long as they remain as they are.

In contrast, in this embodiment, not that the hole transport layer includes a polymer material as with the configuration regarded as a problem for a polymer type organic EL device, but that the hole transport layer is replaced with a hole transport layer of a low-molecular-weight material formed with a vacuum deposition method, and high in high-temperature durability and having stable characteristics. Namely, on the low-molecular-weight hole transport layer 3, the light-emitting layer 4 including a polymer material is disposed, thereby to form a polymer/low-molecular-weight compound lamination type organic EL device. This enables improvements of the high-temperature durability, lifetime, voltage increase associated with driving as with the low-molecular-weight compound organic EL device. Incidentally, the steps of forming the low-molecular-weight hole transport layer 3 and forming the electron injection electrode 5 are carried out by vacuum deposition steps. Accordingly, the number of vacuum deposition steps for forming the low-molecular-weight hole transport layer 3 increases as compared with the polymer type organic EL device, resulting in a little higher manufacturing cost. However, as compared with the low-molecular-weight compound type organic EL device for which all the steps require vacuum deposition, the manufacturing method of this embodiment can enable reduction of the cost. As a result, it is possible to form an organic EL device suitably usable as an in-vehicle display device.

However, for such a polymer/low-molecular-weight compound lamination type organic EL device, the light-emitting layer 4 including a polymer material is formed with a coating method on the low-molecular-weight hole transport layer 3. For this reason, the low-molecular-weight material forming the low-molecular-weight hole transport layer 3 dissolves into a solvent of the coating solution including the polymer material dissolved therein. As a result, an interface mixture layer is formed, which causes a problem of a reduced luminous efficiency. As a method for improving the problem, there are conceivable a method in which a poorly soluble material is, used for the low-molecular-weight hole transport layer 3, a method in which the poorly soluble layer 3a is formed by a surface treatment with an organic acid or an ether compound, thereby to make the surface poorly soluble, and other methods. This can inhibit the following: the low-molecular-weight material dissolves into the solvent of the coating solution to form the interface mixture layer. Accordingly, it is possible to stabilize the device characteristics and to improve the lifetime. In addition, it is possible to obtain an effect of enabling the inhibition of reduction of the luminous efficiency.

However, with such a structure in which the polymer material is stacked on the poorly soluble surface, the polymer material and the low-molecular-weight material are stacked in a phase-separated state. For this reason, there is no entanglement between the polymer material and the low-molecular-weight material. Further, alkyl groups and the like introduced in order to make the polymer material easily soluble in the solvent cause steric hindrance. This results in the interface low in adhesion and low in carrier injectability. With such an interface, even when the formation conditions and the materials are optimized to make an attempt to further enhance the reliability and elongate the lifetime, it is difficult to improve the characteristics due to the polymer/low-molecular-weight compound interfacial characteristic rate control. For this reason, although it was possible to inhibit the reduction of the luminous efficiency, it was not possible to implement an organic EL device high in durability, and also high in adhesion of the interface between the low-molecular-weight hole transport layer 3 and the light-emitting layer 4.

In contrast, for the polymer/low-molecular-weight compound lamination type organic EL device using a mixture of a polymer material and a low-molecular-weight material for the light-emitting layer 4 as in this embodiment, the low-molecular-weight material added to the polymer material serves as a binder filling the gap of the steric hindrance to form entanglement of the polymer material and the low-molecular-weight material. This results in that the interface between the low-molecular-weight hole transport layer 3 and the light-emitting layer 4 is an interface high in adhesion and also high in carrier injectability. Further, optimization of the formation conditions and the materials also enables further enhancement of the reliability and elongation of the lifetime. Further, the low-molecular-weight material added to the polymer material acts so as to inhibit crystallization of the polymer material. This enables drying of the light-emitting layer 4 at a higher temperature than in the related art after coating and formation thereof. As a result, the concentration of the solvent remaining in the film can be reduced, which enables further elongation of the lifetime. Further, by adjusting the concentration of the low-molecular-weight material added to the polymer material at the efficiency reduction concentration due to the foregoing interface mixing, or lower, it is possible to form an interface structure free from efficiency reduction.

Then, further, in this embodiment, the following are combined: the poorly soluble layer 3a is formed by a surface treatment with an organic acid or an ether compound, so that the surface is made poorly soluble; and a mixture of the polymer material and the low-molecular-weight material is used for the light-emitting layer 4. For this reason, there can be obtained an effect produced upon making the surface poorly soluble by forming the poorly soluble layer 3a by a surface treatment with an organic acid or an ether compound, Whereas, the problem occurring in this case can be solved. Namely, the poorly soluble layer 3a can prevent the constituent material of the low-molecular-weight hole transport layer 3 from dissolving into the light-emitting layer 4. This can stabilize the device characteristics and can improve the lifetime. In addition, while there is produced an effect of enabling the inhibition of reduction of the luminous efficiency, it further becomes possible to form an organic EL device high in durability, and also high in adhesion of the interface between the low-molecular-weight hole transport layer 3 and the light-emitting layer 4.

Below, various examples corresponding to the foregoing embodiments will be described.

Example 1

First, as the substrate 1, a glass substrate was used. On the glass substrate, an ITO electrode serving as the hole injection electrode 2 was formed to 150 nm. Then, as the low-molecular-weight hole transport layer 3, N,N,N',N',N'',N''-Hexakis-(4'-methyl-biphenyl-4-yl)-benzene-1,3,5-triamine (molecular weight 1119, glass transition point not observed, melting point 402 degrees) represented by the Chemical Formula 3 was deposited to 60 nm with a vacuum deposition method. Then, the surface of the low-molecular-weight hole transport layer 3 thus formed on the substrate 1 was immersed in a 1,1'-dibutyl ether solution for 10 minutes for coating. As a result, the poorly soluble layer 3a was formed. Further, a heat treatment was performed at 180° C.

Subsequently, on the poorly soluble layer 3a, a coating solution was coated with a spin coating method. The coating solution was prepared in the following manner: Poly[(9,9-dioctylfluorenyl-2,7-diyl)-co-(1,4-benzo-[2,1',3]-thiadiazole)] (ADS233YE) manufactured by American Dye Source, Inc., was purified, resulting in a polymer material with a weight-average molecular weight of about 40000; the polymer material and a hole transportable low-molecular-weight material represented as TPTE (N,N'-bis(4-diphenylamino-4'-biphenyl)-N,N'-diphenyl-4,4'-diaminobiphenyl) of Chemical Formula 9 were dissolved in a xylene solvent in a weight mixing ratio of 3:1 (the concentration of the low-molecular-weight material in the light-emitting layer 4 being 25 wt %). Then, drying was performed at 120° C., thereby to form the light-emitting layer 4 to 100 nm.

Further, as the electron injection electrode 5, an Al/Ca electrode was formed with a vacuum deposition method. Then, finally, in a glove box, the metal can 6 and the glass substrate with the device formed thereon were bonded together with a photocurable resin. Thus, a sample with the manufactured device sealed therein was prepared.

Whereas, as Comparative Example 1, a sample was prepared with the same configuration as that of Example 1, except that the low-molecular-weight material was not added to the light-emitting layer 4.

Then, there were determined the initial driving voltage V0 (V) at a driving current density of 10 mA/cm$^2$, the luminance half decay lifetime LT50 (hour) when room-temperature constant-current driving was performed at an initial luminance of 2400 cd/m$^2$, and the number of dark spots formed N (spots) per square centimeters upon luminance reduction to half for each of the sample of Example 1 and the sample of Comparative Example 1. As a result, it was found as follows: for Example 1, V0=5.3, LT50=156, and N=0; and for Comparative Example 1, V0=7.3, LT50=16, and N=18.

Example 1 is lower in initial driving voltage V0 than Comparative Example 1. This indicates as follows: addition of the low-molecular-weight material to the light-emitting layer 4 enhances the adhesion at the polymer/low-molecular-weight compound interface, resulting in improvement of the carrier injectability. Further, the dark spots are conceivably formed due to peeling at the polymer/low-molecular-weight compound interface. However, the driving lifetime has been dramatically improved, and no dark spot has been formed at all. For this reason, it can be said that the polymer/low-molecular-weight compound interface which is high in adhesion and is stable has been obtained.

Thus, it is indicated as follows: use of the mixture of the polymer material and the low-molecular-weight material for the light-emitting layer 4 can provide a polymer/low-molecular-weight compound interface which is high in adhesion, is stable, and is good in carrier injectability; as a result, it is possible to form a long-lifetime and high-reliability device.

Example 2

In this example, using a different low-molecular-weight material from that of Example 1, specifically, the hole transportable low-molecular-weight material represented by TAPA (Di-[4-N,N-diphenyl-amino)-phenyl]adamantane) of Chemical Formula 13 as the low-molecular-weight material of the light-emitting layer 4, a sample of the organic EL device 100 was manufactured in the same manner as in Example 1.

Then, for the sample of this example, as with Example 1, there were determined the initial driving voltage V0, the luminance half decay lifetime LT50, and the number of dark spots formed N. As a result, in this example, it was found as follows: V0=6.2, LT50=73, and N=0.

Thus, also in this example, the initial driving voltage V0 is lower than that of Comparative Example 1. This indicates as follows: the adhesion at the polymer/low-molecular-weight compound interface is enhanced, resulting in improvement of the carrier injectability. Further, the driving lifetime has been also dramatically improved, and no dark spot has been formed at all. For this reason, it can be said that the polymer/low-molecular-weight compound interface which is high in adhesion and is stable has been obtained. Therefore, the same effects as those in Example 1 can be obtained.

Example 3

In this example, using a different low-molecular-weight material from that of Example 1, specifically, the electron transportable low-molecular-weight material represented by OXD-7 (1,3-Bis[2-(4-tert-butylphenyl)1,3,4-oxadiazo-5-yl] benzene) of Chemical Formula 16 as the low-molecular-weight material of the light-emitting layer 4, a sample of the organic EL device 100 was manufactured in the same manner as in Example 1.

Then, for the sample of this example, as with Example 1, there were determined the initial driving voltage V0, the luminance half decay lifetime LT50, and the number of dark spots formed N. As a result, in this example, it was found as follows: V0=6.9, LT50=108, and N=0.

Thus, also in this example, the initial driving voltage V0 is lower than that of Comparative Example 1. This indicates as follows: the adhesion at the polymer/low-molecular-weight compound interface is enhanced, resulting in improvement of the carrier injectability. Further, the driving lifetime has been also dramatically improved, and no dark spot has been formed at all. For this reason, it can be said that the polymer/low-molecular-weight compound interface which is high in adhesion and is stable has been obtained. Therefore, the same effects as those in Example 1 can be obtained.

Example 4

In this example, a different low-molecular-weight material from that of Example 1, specifically, a mixture of the hole transportable low-molecular-weight material represented as TPTE (N,N'-bis(4-diphenylamino-4'-biphenyl)-N,N'-diphenyl-4,4'-diaminobiphenyl) of Chemical Formula 9 and the electron transportable low-molecular-weight material represented by OXD-7 (1,3-Bis[2-(4-tert-butylphenyl)-1,3,4-oxadiazo-5-yl]benzene) of Chemical Formula 16 was used as the low-molecular-weight material of the light-emitting layer 4. Then, the weight mixing ratio of the hole transportable low-molecular-weight material and the electron transportable low-molecular-weight material was set at 1:1. In addition, the weight mixing ratio of the total amounts of the polymer material and the low-molecular-weight material was set at 3:1. Thus, a sample of the organic EL device 100 was manufactured in the same manner as in Example 1.

Then, for the sample of this example, as with Example 1, there were determined the initial driving voltage V0, the luminance half decay lifetime LT50, and the number of dark spots formed N. As a result, in this example, it was found as follows: V0=6.0, LT50=134, and N=0.

Thus, also in this example, the initial driving voltage V0 is lower than that of Comparative Example 1. This indicates as follows: the adhesion at the polymer/low-molecular-weight compound interface is enhanced, resulting in improvement of the carrier injectability. Further, the driving lifetime has been also dramatically improved, and no dark spot has been formed at all. For this reason, it can be said that the polymer/low-molecular-weight compound interface which is high in adhesion and is stable has been obtained. Therefore, the same effects as those in Example 1 can be obtained.

Discussion on Examples 1 to 4

FIG. 2 is a diagram summarizing the initial driving voltages V0, the luminance half decay lifetimes LT50, and the numbers of dark spots formed N determined for the samples manufactured in the respective examples and the sample of Comparative Example 1. As also indicated from this diagram, in each of all the examples, as compared with Comparative Example 1, the initial driving voltage V0 has been reduced, and the driving lifetime has been also improved. Further, no dark spots have been also formed. For this reason, as described, in the foregoing embodiments, in the polymer/low-molecular-weight compound lamination type organic EL device in which the light-emitting layer 4 including a polymer material is disposed on the low-molecular-weight hole transport layer 3, the light-emitting layer 4 includes a mixture of the polymer material and the low-molecular-weight material. This results in a polymer/low-molecular-weight compound interface high in adhesion, being stable, good in carrier injectability, which allows implementation of an organic EL device high in durability and high in reliability. Particularly, a remarkable reduction is observed when the hole transportable low-molecular-weight material is added. For the improvement of the injectability of holes from the low-molecular-weight hole transport layer 3 to the light-emitting layer 4, it is particularly effective to add the hole transportable low-molecular-weight material to the polymer material forming the light-emitting layer 4.

Example 5

This example is an example in which the crystallization inhibiting effect upon high-temperature drying by the low-molecular-weight material added to the polymer material has been confirmed.

In this example, using the same material as that in Example 1 as the low-molecular-weight material included in the light-emitting layer 4, the light-emitting layer 4 was coated. Then, the drying temperature after coating of the light-emitting layer 4 was set at 180° C., thereby to dry the light-emitting layer 4. As for others, the same method as in Example 1 was used to manufacture a sample of the organic EL device 100.

Whereas, as Comparative Example 3, a sample was prepared with the same configuration as that of the Comparative Example 1, except that the drying temperature after coating of the light-emitting layer 4 was set at 180° C.

Example 5 and Comparative Example 3 were room-temperature constant-current driven at an initial luminance of 2400 cd/m². As a result, for Example 5, a short circuit was not caused during driving at a luminance half decay lifetime LT50 of 215 hours. In contrast, for Comparative Example 3, the device short-circuited in 20 hours before the elapsed time reached the half decay lifetime, so that luminescence ceased to occur. In Comparative Example 3, crystallization of the light-emitting layer 4 due to high-temperature drying occurred, which facilitated short-circuiting of the device. In contrast, in Example 5, the added low-molecular-weight material acted so as to inhibit the crystallization of the polymer. Accordingly, even when high-temperature drying was performed, neither crystallization nor short-circuit occurred. Further, Example 5 is longer in lifetime than Example 1. Thus, there was confirmed an increase in lifetime due to the effect of reducing the solvent concentration remaining in the film by high-temperature drying.

Example 6

In this example, for the case where the HOMO-LUMO gap of the low-molecular-weight material added to the polymer material is smaller than the luminous energy, the efficiency was determined. Specifically, in this example, as the low-molecular-weight material included in the light-emitting layer 4, fullerene $C_{60}$ represented by the following Chemical Formula 21 was used. Thus, the weight mixing ratio of the polymer material and the low-molecular-weight material was set at 10:1. Thus, a sample of the organic EL device 100 was manufactured in the same manner as in Example 1. The HOMO-LUMO gap of the fullerene $C_{60}$ represented by Chemical Formula 21 was 1.7 eV, which is smaller than the luminous energy. The value of I6/I1 was 0.45, where I1 (cd/A) denotes the maximum luminous efficiency per unit current density of Example 1, and I6 (cd/A) denotes the maximum luminous efficiency of this example. Namely, it has been indicated as follows: when a material small in HOMO-LUMO gap is added, the light emitted at the light-emitting layer 4 is absorbed by the low-molecular-weight material, resulting in reduction of the efficiency.

Thus, the light emitted at the light-emitting layer 4 is absorbed by the low-molecular-weight material, resulting in reduction of the efficiency. For this reason, it can be said that, as in Example 1 and the like, the HOMO-LUMO gap of the low-molecular-weight material included in the light-emitting layer 4 is desirably larger than the luminous energy of the light emitted from the light-emitting layer 4.

Example 7

In this example, there was examined the effect when the concentration of the low-molecular-weight material added to the polymer material was changed.

Specifically, there were manufactured various samples having varied concentrations of the low-molecular-weight material in the light-emitting layer 4 in Example 1. Then, changes in $I/I_0$ were determined where I (cd/A) denotes the maximum luminous efficiency of each sample, and $I_0$ (cd/A) denotes the maximum luminous efficiency of Comparative Example 1 with a low-molecular-weight material concentration of 0 wt %. As a result, the graph shown in FIG. 3 was obtained.

As shown in this diagram, the efficiency is larger at 1 wt % or more than at 0 wt %. However, the efficiency is smaller at 50 wt % or more than 0 wt %. This indicates that a concentration of 1 wt % or more and less than 50 wt % is desirable.

Other Embodiments

In the foregoing embodiments, the following structure was adopted: while the slight soluble layer 3a is formed by a surface treatment with an organic acid or an ether compound, the light-emitting layer 4 including a mixture of the polymer material and the low-molecular-weight material is disposed on the low-molecular-weight hole transport layer 3. This however shows a better combination. For this reason, the following structure may also be adopted: the poorly soluble layer 3a is not formed, and simply, on the low-molecular-weight hole transport layer 3, the light-emitting layer 4 including a mixture of the polymer material and the low-molecular-weight material is disposed.

Second Embodiment

FIG. 23 is a schematic cross-sectional view showing a configuration of an organic EL device 200 in accordance with an embodiment of the present invention. As shown in this figure, on a substrate 1, a hole injection electrode 2, a low-molecular-weight hole transport layer 3, a poorly soluble layer 3a, a polymer light-emitting layer 4, and an electron injection electrode 5 are sequentially stacked. This structure forms the organic EL device 200 in accordance with this embodiment.

The organic EL device 200 of such a structure is manufactured, for example, in the following manner. First, on the substrate 1, the hole injection electrode 2 is formed. Then, the low-molecular-weight hole transport layer 3 is formed with a vacuum deposition method. Subsequently, the surface of the low-molecular-weight hole transport layer 3 is subjected to a surface treatment with an ether compound. As a result, at the interface between the low-molecular-weight hole transport layer 3 and the polymer light-emitting layer 4, the poorly soluble layer 3a is formed. Then, the polymer light-emitting layer 4 is formed with a coating method, and then, the electron injection electrode 5 is formed with a vacuum deposition method. Finally, by carrying out sealing by bonding of a metal can not shown in a dry nitrogen atmosphere, the organic EL device 200 shown in FIG. 23 is manufactured. The transport method between respective steps has no particular restriction. However, transport in a dry atmosphere is desirable.

The low-molecular-weight hole transport layer 3 is desirably a triphenylamine derivative material high in hole transportability capable of providing a relatively high intermolecular interaction effect with the ether compound. In the solvent drying step to be carried out after polymer material coating for forming the polymer light-emitting layer 4, generally, about 120° C. heating is carried out. However, when the temperature of this heating step exceeds the glass transition point of the low-molecular-weight material, an increase in interface roughness due to aggregation of the low-molecular-weight material, mixing of both the materials, and the like are caused, resulting in deterioration of characteristics. For this reason, it is preferable that a low-molecular-weight material having a glass transition point equal to or higher than the solvent drying temperature after polymer material coating, i.e., 120° C. or more is used for the low-molecular-weight hole transport layer 3.

Further, the constituent material of the low-molecular-weight hole transport layer 3 desirably has a sublimation temperature of 300° C. or more at a degree of vacuum of 1 Pa. This is for the following reason. In the case of a sublimation temperature of lower than 300° C., when a deposition film is formed under vacuum as high as $10^{-5}$ Pa or less, the deposition temperature is 200° C. or less, resulting in a difficulty in controlling the deposition rate. This makes it impossible to form a deposition film with a uniform film density.

The poorly soluble layer 3a is, as described above, formed by subjecting the surface of the low-molecular-weight hole transport layer 3 to a surface treatment with an ether compound. FIG. 24 shows the X-ray electron spectroscopy spectrum of the poorly soluble layer surface formed in the following manner: the low-molecular-weight hole transport layer 3 including the low-molecular-weight material represented by Chemical Formula 3 is formed with a vacuum deposition method, then, a surface treatment is performed with 1,1'-dibutyl ether. In addition to the peak derived from the ether compound, the peak derived from the reaction between the ether compound and the low-molecular-weight material was detected. This indicates that the reaction compound of the ether compound and the low-molecular-weight material forming the low-molecular-weight hole transport layer 3 is the poorly soluble layer forming material.

The polymer light-emitting layer 4 includes a polymer organic luminescent material. As the polymer organic luminescent material, there can be used a polyfluorene (PFO) type polymer, a polyphenylene vinylene (PPV) type polymer, a polyvinyl carbazole (PVK) type polymer, or the like. There can be also used the one obtained by dispersing a fluorescent dye or a phosphorescent dye in the polymer, a polystyrene type polymer, a polythiophene type polymer, a polymethyl methacrylate type polymer, or the like. The polymer organic luminescent material is dissolved in a single solvent such as toluene, xylene, acetone, anisole, methyl anisole, dimethyl anisole, tetralin, ethyl benzoate, methyl benzoate, methyl ethyl ketone, cyclohexanone, methanol, ethanol, isopropyl alcohol, ethyl acetate, butyl acetate, or water, or a mixed solvent thereof. As a result, a coating solution is prepared. With a coating method using the coating solution, the polymer light-emitting layer can be formed. Out of the solvents, particularly, aromatic solvents such as toluene, xylene, anisole, methyl anisole, dimethyl anisole, tetralin, ethyl benzoate, and methyl benzoate are good in solubility for the polymer organic luminescent materials, and are also easy to handle. For this reason, the aromatic solvents are more preferable solvents.

In this manner, the organic EL element 200 in accordance with this embodiment is formed and manufactured. Then, the function and the effect of such an organic EL device 200 will be described.

For the organic EL device 200 in accordance with this embodiment, there is adopted a lamination structure of the low-molecular-weight hole transport layer 3 formed with a vacuum deposition method and the polymer light-emitting layer 4 formed with a coating method. This enables the solution of respective problems of the low-molecular-weight compound type organic EL device and the polymer type organic EL device.

Namely, the polymer hole transport layer regarded as a problem in the polymer type organic EL device is replaced with the low-molecular-weight hole transport layer 3 formed with a vacuum deposition method, and high in high-temperature durability and having stable characteristics. This results in a polymer/low-molecular-weight compound lamination type organic EL device. This enables improvements of the high-temperature durability, lifetime, voltage increase associated with driving. Further, the number of vacuum deposition steps increases to 2, resulting in a little higher manufacturing cost than that for the polymer type organic EL device. However, as compared with the low-molecular-weight compound type organic EL device for which all the steps require vacuum deposition, the manufacturing can be reduced.

Accordingly, it becomes possible to use the organic EL device 200 of this embodiment as, for example, an in-vehicle display device, particularly, a segment display device.

However, for such a polymer/low-molecular-weight compound lamination type organic EL device, on the low-molecular-weight hole transport layer 3, the polymer light-emitting layer 4 is formed with a coating method. This may cause the following: the low-molecular-weight material forming the low-molecular-weight hole transport layer 3 dissolves into a solvent of the coating solution of the polymer light-emitting layer 4; as a result, an interface mixture layer is formed, which reduces the luminous efficiency.

However, in this embodiment, the low-molecular-weight hole transport layer 3 is surface treated with an ether compound. As a result, the poorly soluble layer 3a resulting from the reaction compound can be formed at the interface between the low-molecular-weight hole transport layer 3 and the polymer light-emitting layer 4. An experiment was carried out with the poorly soluble layer 3a being formed. As a result, it has been shown as follows: even when, on the surface of the poorly soluble layer 3a, the polymer light-emitting layer 4 is formed with a coating method, the low-molecular-weight hole transport material hardly dissolves into the solvent of the polymer light-emitting layer coating solution.

Therefore, as in this embodiment, the low-molecular-weight hole transport layer 3 is surface treated with an ether compound, which can inhibit the reduction of the luminous efficiency. This enables the organic EL device 200 to be a high-efficiency polymer/low-molecular-weight compound lamination type organic EL device. Further, an enhancement in efficiency leads to an elongation of the lifetime of the device. Further, with the method of solubility reduction by an ether compound, no instable crosslinkable functional group is included as compared with the method of solubility reduction by polymerization of crosslinkable organic compound. For this reason, the characteristics are stable over a long period, and a lifetime reducing phenomenon due to unpolymerized radicals does not also occur. This also enables an elongation of the lifetime of the device. This enables the organic EL device 200 to be used as an in-vehicle display device required to be low in Cost, high in high-temperature durability, and long in lifetime, particularly, as a segment display device.

Incidentally, even for the case where an organic acid is used in place of an ether compound, the same effects can be obtained. However, when an organic acid is used, handling of the organic acid requires a container capable of resisting the organic acid. This and other requirements result in a higher device cost. In contrast, when the surface treatment method by an ether compound is employed as in this embodiment, there is no such a restriction. Thus, a low-cost container can be used, which enables reduction of the device cost.

Below, various examples corresponding to the foregoing embodiment will be described.

Example 8

First, as the substrate 1, a glass substrate was used. On the glass substrate, an ITO electrode serving as the hole injection electrode 2 was formed to 150 nm. Then, as the low-molecular-weight hole transport layer 3, N,N,N',N',N'',N''-Hexakis-(4'-methyl-biphenyl-4-yl)-benzene-1,3,5-triamine (molecular weight 1119, glass transition point not observed, melting point 402° C.) represented by the Chemical Formula 3 was deposited to 60 nm with a vacuum deposition method. Then, the surface of the low-molecular-weight hole transport layer 3 thus formed on the substrate 1 was immersed in a 1,1'-dibutyl ether solution for 10 minutes for coating. As a result, the poorly soluble layer 3a was formed. Further, a heat treatment was performed at 180° C.

Subsequently, on the poorly soluble layer 3a, a coating solution was coated with a spin coating method. The coating solution was prepared in the following manner: Poly[(9,9-dioctylfluorenyl-2,7-diyl)-co-(1,4-benzo-[2,1',3]-thiadiazole)] (ADS233YE) manufactured by American Dye Source, Inc., was purified, resulting in a polymer luminescent material with a weight-average molecular weight of about 40000; the resulting polymer luminescent material was dissolved in a xylene solvent. Then, drying was performed at 120° C., thereby to form the polymer light-emitting layer 4 to 100 nm.

Further, as the electron injection electrode 5, an Al/Ca electrode was formed with a vacuum deposition method. Then, finally, in a glove box, the metal can and a glass substrate with the device formed thereon were bonded together with a photocurable resin. Thus, a sample with the manufactured device sealed therein was prepared.

Whereas, as Comparative Example 3, a sample was prepared with the same configuration as that of Example 8, except that the surface treatment with an ether compound was not performed.

Then, the value of $I/I_0$ was 5.0, where I (cd/A) denotes the maximum luminous efficiency per unit current density of the sample of Example 8, and $I_0$ (cd/A) denotes the maximum luminous efficiency of the sample of Comparative Example 3. The results indicate as follows: as compared with the case where a surface treatment with an ether compound is not performed, so that no poorly soluble layer 3a is formed, a larger luminous efficiency is obtained. This shows that the enhancement of the efficiency is possible.

Example 9

In this example, using a different ether compound from that of Example 8, and in the same manner as in Example 8, a sample of the organic, EL device 200 was manufactured. Specifically, as an ether compound, di-iso-propyl ether was used.

Then, the value of $I/I_0$ was 1.5, where I (cd/A) denotes the maximum luminous efficiency per unit current density of the sample of this example, and $I_0$ (cd/A) denotes the maximum luminous efficiency of the sample of Comparative Example 3. The results indicate as follows: even when the type of the ether compound is changed, a large luminous efficiency is obtained. This shows that the enhancement of the efficiency is possible.

Example 10

Also in this example, using a different ether compound from that of Example 8, and in the same manner as in Example 8, a sample of the organic EL device 200 was manufactured. Specifically, as an ether compound, 1,1'-dihexyl ether was used.

Then, the value of $I/I_0$ was 4.0, where I (cd/A) denotes the maximum luminous efficiency per unit current density of the sample of this example, and $I_0$ (cd/A) denotes the maximum luminous efficiency of the sample of Comparative Example 3. The results indicate as follows: even when the type of the ether compound is changed, a large luminous efficiency is obtained. This shows that the enhancement of the efficiency is possible.

Example 11

Also in this example, using a different ether compound from that of Example 8, and in the same manner as in Example 8, a sample of the organic EL device 200 was manufactured. Specifically, as an ether compound, ethylene glycol diethyl ether was used.

Then, the value of $I/I_0$ was 2.0, where I (cd/A) denotes the maximum luminous efficiency per unit current density of the sample of this example, and $I_0$ (cd/A) denotes the maximum luminous efficiency of the sample of Comparative Example 3. The results indicate as follows: even when the type of the ether compound is changed as the ether compound, a large luminous efficiency is obtained. This shows that the enhancement of the efficiency is possible.

Example 12

In this example, with a method in which the surface of the low-molecular-weight hole transport layer 3 is exposed in a vapor containing an ether compound, the poorly soluble layer 3a is formed. For other steps, in the same manner as in Example 8, a sample of the organic EL device 200 was manufactured. Specifically, as the ether compound, 1,1'-dibutyl ether was used. As the treatment method, the following method was performed: in a nitrogen gas, 1,1'-dibutyl ether was heated to 80° C., resulting in a saturated vapor pressure state; and in such an atmosphere, the surface of the low-molecular-weight hole transport layer 3 was exposed for 4 hours.

Then, the value of $I/I_0$ was 4.2, where I (cd/A) denotes the maximum luminous efficiency per unit current density of the sample of this example, and $I_0$ (cd/A) denotes the maximum luminous efficiency of the sample of Comparative Example 3. The results indicate as follows: even when the type of the ether compound and the formation method of the poorly soluble layer 3a using an ether compound are changed, a large luminous efficiency is obtained. This shows that the enhancement of the efficiency is possible.

Example 13

In this example, there was performed a step of performing a surface treatment with an ether compound, thereby to form a polymer layer, and then, performing a heat treatment, thereby to volatilize and remove the ether compound. However, for other steps, in the same manner as in Example 8, a sample of the organic EL device 200 was manufactured. Specifically, as the ether compound, ethylene glycol diethyl ether was used. After the formation of the polymer light-emitting layer 4, a 150° C. heat treatment was performed.

Then, the value of $I/I_0$ was 2.5, where I (cd/A) denotes the maximum luminous efficiency per unit current density of the sample of this example, and $I_0$ (cd/A) denotes the maximum luminous efficiency of the sample of Comparative Example 3. The results indicate as follows: even when the type of the ether compound is changed, or after the formation of the poorly soluble layer 3a, the ether compound is volatilized and removed, a large luminous efficiency is obtained. This shows that the enhancement of the efficiency is possible.

Discussion on Examples 8 to 13

FIG. 25 is a' diagram summarizing the comparison results $I/I_0$ between the maximum luminous efficiencies I (cd/A) per unit current density of the respective Examples and the maximum luminous efficiency $I_0$ (cd/A) of Comparative Example 3.

As indicated from the diagram, in every example, a larger luminous efficiency can be obtained as compared with Comparative Example 3. This indicates that the organic EL device 200 shown in the embodiment enables the enhancement of the efficiency.

Whereas, in Example 13, the ether compound is volatilized and removed by a heat treatment. This enables a further improvement of the luminous efficiency as compared with Example 11 with the same configuration. This indicates that volatilization and removal of an ether compound by performing a heat treatment or the like is effective.

Further, FIG. 26 is a view showing the changes with time in each luminance when Example 8 and Comparative Example 3 are constant-current driven at an initial luminance of 600 cd/m$^2$ under 25° C. environment. This view indicates as follows: Example 8 is a device which is less reduced in luminance than Comparative Example 3, and is stable and has a long lifetime. Herein, Example 8 was taken as an example. However, other examples also provide the same results. This also indicates that the organic EL device 200 shown in the foregoing embodiment has an elongated lifetime.

Example 14

In this example, the low-molecular-weight hole transport layer 3 is formed of a different material from that of Example 8. For other steps, in the same manner as in Example 8, a sample of the organic EL device 200 was manufactured. Specifically, N,N,N',N'-Tetrakis-(4'-methyl-biphenyl-4-yl)-N'',N'',-biskis-(4'-methyl-phenyl)benzene-1,3,5-triamine (molecular weight 976, glass transition point 180° C.) represented by the Chemical Formula 4 was used as the constituent material of the low-molecular-weight hole transport layer 3.

Whereas, as Comparative Example 4, a sample was prepared with the same configuration as that of Example 14, except that a surface treatment with an ether compound was not carried out.

Then, the value of I/I$_0$ was 3.3, where I (cd/A) denotes the maximum luminous efficiency per unit current density of the sample of this example, and I$_0$ (cd/A) denotes the maximum luminous efficiency of the sample of Comparative Example 4. The results indicate as follows: even when the constituent material of the low-molecular-weight hole transport layer 3 is changed, a large luminous efficiency is obtained. This shows that the enhancement of the efficiency is possible.

Example 15

Also in this example, the low-molecular-weight hole transport layer 3 is formed of a different material from that of Example 8. For other steps, in the same manner as in Example 8, a sample of the organic EL device 200 was manufactured. Specifically, t-Bu-TBATA (N,N,N',N',N'',N''-Hexakis-(4'-tert-butylbiphenyl-4-yl)-tris(4-aminophenyl)amine) (molecular weight 1540, glass transition point 203° C.) represented by the Chemical Formula 5 was used as the constituent material of the low-molecular-weight hole transport layer 3.

Whereas, as Comparative Example 5, a sample was prepared with the same configuration as that of Example 15, except that a surface treatment with an ether compound was not carried out.

Then, the value of I/I$_0$ was 2.9, where I (cd/A) denotes the maximum luminous efficiency per unit current density of the sample of this example, and I$_0$ (cd/A) denotes the maximum luminous efficiency of the sample of Comparative Example 5. The results indicate as follows: even when the constituent material of the low-molecular-weight hole transport layer 3 is changed, a large luminous efficiency is obtained. This shows that the enhancement of the efficiency is possible.

From the results up to this point, it can be said that as the constituent materials of the low-molecular-weight hole transport layer 3 of the organic EL device 200 shown in the Embodiment, a plurality of triphenylamine derivative materials are effective.

Third Embodiment

FIG. 27 is a schematic cross-sectional view showing a configuration of an organic EL device 300 in accordance with an embodiment of the present invention. As shown in this figure, on a substrate. 1, a hole injection electrode 2, a low-molecular-weight hole transport layer 3, a poorly soluble layer 3a, a polymer light-emitting layer 4, and an electron injection electrode 5 are sequentially stacked. This structure forms the organic EL device 300 in accordance with this embodiment.

The organic EL device 300 of such a structure is manufactured, for example, in the following manner. First, on the substrate 1, the hole injection electrode 2 is formed. Then, the low-molecular-weight hole transport layer 3 is formed with a vacuum deposition method. Subsequently, the surface of the low-molecular-weight hole transport layer 3 is subjected to a surface treatment with an organic acid. As a result, at the interface between the low-molecular-weight hole transport layer 3 and the polymer light-emitting layer 4, the poorly soluble layer 3a is formed. Then, the polymer light-emitting layer 4 is formed with a coating method, and then, the electron injection electrode 5 is formed with a vacuum deposition method. Finally, by carrying out sealing by bonding of a metal can not shown in a dry nitrogen atmosphere, the organic EL device 300 shown in FIG. 27 is manufactured. The transport, method between respective steps has no particular restriction. However, transport in a dry atmosphere is desirable.

Incidentally, the steps of surface treatment with an organic acid, formation of the polymer light-emitting layer, and sealing are not restricted. However, the steps are desirably carried out in a dry inert gas atmosphere in a glove box or the like. Whereas, as the sealing method, other than sealing by the metal can, there are applicable various sealing methods such as sealing by bonding of glass or a film with a barrier, and a thin film sealing method in which a thin film such as a silicon nitride film is directly formed.

The low-molecular-weight hole transport layer 3 is desirably a triphenylamine derivative material capable of providing an acid-base reaction effect with the organic acid, and high in hole transportability. In the solvent drying step to be carried out after polymer material coating for forming the polymer light-emitting layer 4, generally, about 120° C. heating is carried out. However, when the temperature of this heating step exceeds the glass transition point of the low-molecular-weight material, an increase in interface roughness due to aggregation of the low-molecular-weight material, mixing of both the materials, and the like are caused, resulting in deterioration of characteristics. For this reason, it is preferable that a low-molecular-weight material having a glass transition point equal to or higher than the solvent drying temperature after polymer material coating, i.e., 120° C. or more is used for the low-molecular-weight hole transport layer 3. As those satisfying these conditions, specifically, mention may be made of the materials shown in Chemical Formulae 3 to 7, and 9.

Incidentally, herein, a description was given to the case where the low-molecular-weight hole transport layer 3 was formed on the monolayer hole injection electrode 2. However, the monolayer structure is not necessarily required to be adopted. For example, the following structure may also be adopted: on the side closest to the polymer light-emitting layer 4, the low-molecular-weight hole transport layer high in organic acid treatment effect is disposed; in addition, under this, a low-molecular-weight hole transport layer lower in cost or higher in hole mobility is disposed, or a hole injection layer higher in hole injection efficiency is stacked. By adopting such a structure, it becomes possible to further reduce the cost and reduce the driving voltage of the organic EL device.

The poorly soluble layer 3a is, as described above, formed by subjecting the surface of the low-molecular-weight hole transport layer 3 to a surface treatment with an organic acid. The detailed structure of the poorly soluble layer 3a formed by the surface treatment is not definite. However, the poorly soluble layer 3a is assumed to be in any of: a state in which the surface of the low-molecular-weight hole transport layer 3 is coated with an organic acid in a film; a state in which molecules forming an organic acid are introduced in the low-molecular-weight hole transport layer 3, resulting in a mixture with the low-molecular-weight material; or a state in which a chemical reaction with the low-molecular-weight material forming the low-molecular-weight hole transport layer 3 results in an organic acid compound.

As the organic acid for use in the surface treatment for forming the poorly soluble layer 3a, mention may be made of a sulfonic acid compound, a carboxylic acid compound, a hydroxy compound, a thiol compound, an enol compound, or an organic phosphoric acid compound. Particularly, a sulfonic acid compound having a strong acidity is desirable. Secondly, a carboxylic acid compound and an organic phosphoric acid compound are desirable. Specifically, as the sulfonic acid compounds, mention may be made of benzenesulfonic acid, para-toluenesulfonic acid, dodecylbenzenesulfonic acid, and ethanesulfonic acid. As the carboxylic acid compounds, mention may be made of 4-methylbenzoic acid, acetic acid, formic acid, oxalic acid, phthalic acid, and malonic acid. As the hydroxy compounds, mention may be made of phenol and picric acid. As the thiol compound, mention may be made of 1-propanethiol; as the enol compound, pentanedione; and as the organic phosphoric acid compound, bis(2-ethylhexyl)phosphate, or the like.

As the surface treatment methods of the low-molecular-weight hole transport layer 3 with an organic acid for forming the poorly soluble layer 3a, mention may be made of a method of coating of a solution containing an organic acid with a spin coating method, a dipping, method, a spray method, or the like, a method of exposure in a vapor containing an organic acid, and other techniques. These are non-limiting. However, the foregoing two methods are desirable in view of mass productivity, and the like. Further, in order to remove an excess organic acid after performing the surface treatment, rinsing with an organic solvent such as alcohol or a hydrocarbon-based solvent, or an aqueous solution may be carried out, or the low-molecular-weight hole transport layer 3 may be heated. In this manner, the excess organic acid can also be removed afterward. For this reason, the concentration of the solution containing an organic acid, or the vapor concentration of an organic acid has no particular restriction unless the molecular structure of the material of the low-molecular-weight hole transport layer is changed. Alternatively, by performing a heat treatment, the organic acid may be volatilized and removed. The heat treatment temperature is desirably set at the glass transition point or lower of the constituent material of the low-molecular-weight hole transport layer 3, or, at the melting point or lower when there is no glass transition point. This can reduce the amount of the organic acid which is a different kind of compound remaining on the interface. Accordingly, it becomes possible to further reduce the driving voltage and elongate the lifetime. However, when the organic acid is volatilized, the bond resulting from the acid-base reaction between the low-molecular-weight hole transport material and the organic acid may be partially decomposed, resulting in deterioration of the slight solubility. For this reason, in order to allow expression of effects thereof, the combination with a low-molecular-weight hole transport material low in solubility in the light-emitting layer coating solution solvent is desirable.

However, in this embodiment, the low-molecular-weight hole transport layer 3 is surface treated with an organic acid. As a result, although the detailed structure is not definite, the poorly soluble layer 3a can be formed at the interface between the low-molecular-weight hole transport layer 1 and the polymer light-emitting layer 4 by the surface treatment. An experiment was carried out with the poorly soluble layer 3a being formed. As a result, it has been shown as follows: even when, on the surface of the poorly soluble layer 3a, the polymer light-emitting layer 4 is formed with a coating method, the low-molecular-weight hole transport material hardly dissolves into the solvent of the polymer light-emitting layer coating solution. For example, when the poorly soluble layer 3a includes a chemical reaction product between the constituent material of the low-molecular-weight hole transport layer 3 and an organic acid, it results that an organic acid compound having a strong bond resulting from the acid-base reaction is formed in a thin region in the vicinity of the surface. The organic acid compound is very poorly soluble in the solvent of the coating solution. This conceivably led to the foregoing results. Similarly, even in a state in which the surface of the low-molecular-weight hole transport layer 3 is coated with an organic acid in a film; or, a state in which molecules forming an organic acid are introduced in the low-molecular-weight hole transport layer 3, resulting in a mixture with the low-molecular-weight material, the organic acid is very poorly soluble in the solvent of the coating solution. This conceivably led to the foregoing results.

Therefore, as in this embodiment, the low-molecular-weight hole transport layer 3 is surface treated with an organic acid, which can inhibit the reduction of the luminous efficiency. This enables the organic EL device 300 to be a high-efficiency polymer/low-molecular-weight compound lamination type organic EL device. Further, an enhancement in efficiency leads to a further elongation of the lifetime of the device. Further, with the method of solubility reduction by an organic acid, no instable crosslinkable functional group is included as compared with the method of solubility reduction by polymerization of a crosslinkable organic compound. For this reason, the characteristics are stable over a long period, and a lifetime reducing phenomenon due to unpolymerized radicals does not also occur. This also enables an elongation of the lifetime of the device. This enables the organic EL device 300 to be used as an in-vehicle display device required to be low in cost, high in high-temperature durability, and long in lifetime, particularly, as a segment display device.

Below, various examples corresponding to the foregoing embodiment will be described.

Example 16

First, as the substrate 1, a glass substrate was used. On the glass substrate, an ITO electrode serving as the hole injection electrode 2 was formed to 150 nm. Then, as the low-molecular-weight hole transport layer 3, N,N,N',N',N'',N''-Hexakis-(4'-methyl-biphenyl-4-yl)-benzene-1,3,5-triamine (molecular weight 1119, glass transition point not observed, melting point 402° C.) represented by the Chemical Formula 1 was deposited to 60 nm with a vacuum deposition method. Thereon, a solution obtained by dissolving dodecylbenzenesulfonic acid as an organic acid in an amount of 0.7 wt % in 2-propanol was coated with a spin coating method. As a result, the poorly soluble layer 3a was formed. Further, after rinsing with 2-propanol, a heat treatment was performed at 120° C.

Subsequently, on the poorly soluble layer 3a, a coating solution was coated with a spin coating method. The coating solution was prepared in the following manner: Poly[(9,9-dioctylfluorenyl-2,7-diyl)-co-(1,4-benzo-[2,1',3]-thiadiazole)] (ADS233YE) manufactured by American Dye Source, Inc., was purified, resulting in a polymer luminescent material with a weight-average molecular weight of about 40000; and the resulting polymer luminescent material was dissolved in a xylene solvent. Then, drying was performed at 120° C., thereby to form the polymer light-emitting layer 4 to 100 nm:

Further, as the electron injection electrode 5, an Al/Ca electrode was formed with a vacuum deposition method. Then, finally, in a glove box, a metal can and a glass substrate with a device formed thereon were bonded together with a photocurable resin. Thus, a sample with the manufactured device sealed therein was prepared.

Whereas, as Comparative Example 6, a sample was prepared with the same configuration as that of Example 16, except that the surface treatment with an organic acid was not carried, out.

Then, the value of $I/I_0$ was 2.9, where I (cd/A) denotes the maximum luminous efficiency per unit current density of the sample of Example 16, and $I_0$ (cd/A) denotes the maximum luminous efficiency of the sample of Comparative Example 6. The results indicate as follows: as compared with the case where a surface treatment with an organic acid is not performed, so that no poorly soluble layer 3a is formed, a larger luminous efficiency is obtained. This shows that the enhancement of the efficiency is possible.

Incidentally, herein, the concentration of the dodecylbenzenesulfonic acid solution was set at 0.7 wt %. However, this concentration has no particular restriction. It has been confirmed that even use of the one with a concentration of 30 wt % can provide almost the same results as described above.

Example 17

In this example, using a different organic acid from that of Example 16, and in the same manner as in Example 16, a sample of the organic EL device 300 was manufactured. Specifically, as an organic acid, para-toluenesulfonic acid was used.

Then, the value of $I/I_0$ was 1.3, where I (cd/A) denotes the maximum luminous efficiency per unit current density of the sample of this example, and $I_0$ (cd/A) denotes the maximum luminous efficiency of the sample of Comparative Example 6. The results indicate as follows: even when the type of the organic acid is changed as the organic acid, a large luminous efficiency is obtained. This shows that the enhancement of the efficiency is possible.

Example 18

Also in this example, using a different organic acid from that of Example 16, and in the same manner as in Example 16, a sample of the organic EL device 300 was manufactured. Specifically, as an organic acid, ethanesulfonic acid was used for the organic acid.

Then, the value of $I/I_0$ was 3.1, where I (cd/A) denotes the maximum luminous efficiency per unit current density of the sample of this example, and $I_0$ (cd/A) denotes the maximum luminous efficiency of the sample of Comparative Example 6. The results indicate as follows: even when the type of the organic acid is changed as the organic acid, a large luminous efficiency is obtained. This shows that the enhancement of the efficiency is possible.

Example 19

Also in this example, using a different organic acid from that of Example 16, and in the same manner as in Example 16, a sample of the organic EL device 300 was manufactured. Specifically, as an organic acid, acetic acid was used for the organic acid.

Then, the value of $I/I_0$ was 1.5, where I (cd/A) denotes the maximum luminous efficiency per unit current density of the sample of this example, and $I_0$ (cd/A) denotes the maximum luminous efficiency of the sample of Comparative Example 6. The results indicate as follows: even when the type of the organic acid is changed as the organic acid, a large luminous efficiency is obtained. This shows that the enhancement of the efficiency is possible.

Example 20

Also in this example, using a different organic acid from that of Example 16, and in the same manner as in Example 16, a sample of the organic EL device 300 was manufactured. Specifically, as an organic acid, bis(2-ethylhexyl)phosphate was used for the organic acid.

Then, the value of $I/I_0$ was 2.0, where I (cd/A) denotes the maximum luminous efficiency per unit current density of the sample of this example, and $I_0$ (cd/A) denotes the maximum luminous efficiency of the sample of Comparative Example 6. The results indicate as follows: even when the type of the organic acid is changed as the organic acid, a large luminous efficiency is obtained. This shows that the enhancement of the efficiency is possible.

Example 21

In this example, with a method in which the surface of the low-molecular-weight hole transport layer 3 is exposed in a vapor containing an organic acid, the poorly soluble layer 3a was formed. For other steps, in the same manner as in Example 16, a sample of the organic EL device 300 was manufactured. Specifically, as the organic acid, ethanesulfonic acid was used. As the treatment method, the following method was performed: in a nitrogen gas, ethanesulfonic acid was heated to 80° C., resulting in a saturated vapor pressure state; and in such an atmosphere, the surface of the low-molecular-weight hole transport layer 3 was exposed for 2 hours.

Then, the value of $I/I_0$ was 3.4, where I (cd/A) denotes the maximum luminous efficiency per unit current density of the sample of this example, and $I_0$ (cd/A) denotes the maximum luminous efficiency of the sample of Comparative Example 6. The results indicate as follows: even when the type of the organic acid is changed as the organic acid, a large luminous efficiency is obtained. This shows that the enhancement of the efficiency is possible.

Example 22

Also in this example, with a method in which the surface of the low-molecular-weight hole transport layer 3 is exposed in a vapor containing an organic acid, the poorly soluble layer 3a was formed. For other steps, in the same manner as in Example 16, a sample of the organic EL device 300 was manufactured. Specifically, as the organic acid, acetic acid was used. As the treatment method, the following method was performed: in a nitrogen gas, acetic acid was heated to 50° C., resulting in a saturated vapor pressure state; and in such an atmosphere, the surface of the low-molecular-weight hale transport layer 3 was exposed for 2 hours.

Then, the value of $I/I_0$ was 3.0, where I (cd/A) denotes the maximum luminous efficiency per unit current density of the sample of this example, and $I_0$ (cd/A) denotes the maximum luminous efficiency of the sample of Comparative Example 6. The results indicate as follows: even when the type of the organic acid is changed as the organic acid, a large luminous efficiency is obtained. This shows that the enhancement of the efficiency is possible.

Example 23

In this example, a surface treatment with an organic acid was carried out to form a polymer layer. Then, a heat treatment was carried out. Thus, a step of volatilizing and removing the organic acid was carried out. However, for other steps, in the same manner as in Example 16, a sample of the organic EL device 300 was manufactured. Specifically, the organic acid was acetic acid. Thus, the polymer light-emitting layer 4 was formed. Then, a 150-° C. 10-minute heat treatment was carried out.

Then, the value of $I/I_0$ was 2.3, where I (cd/A) denotes the maximum luminous efficiency per unit current density of the sample of this example, and $I_0$ (cd/A) denotes the maximum luminous efficiency of the sample of Comparative Example 6. The results indicate as follows: even when the type of the organic acid is changed as the organic acid, a large luminous efficiency is obtained. This shows that the enhancement of the efficiency is possible.

Discussion on Examples 16 to 8

FIG. 28 is a diagram summarizing the comparison results $I/I_0$ between the maximum luminous efficiencies I (cd/A) per unit current density of the respective Examples and the maximum luminous efficiency $I_0$ of Comparative Example 6.

As indicated from the diagram, in every example, a larger luminous efficiency can be obtained as compared with Comparative Example 6. This indicates that the organic EL device 300 shown in the embodiment enables the enhancement of the efficiency.

Whereas, in Example 23, acetic acid is volatilized and removed by a heat treatment. This enables a further improvement of the luminous efficiency as compared with Example 19 with the same configuration. This indicates that volatilization and removal of an organic acid by performing a heat treatment or the like is effective.

Further, with any of organic acids used in respective examples, the improvement of the luminous efficiency was observed. Out of these, ethanesulfonic acid in Examples 18 and 6 each provided a particularly high luminous efficiency. This is conceivably due to the following: ethanesulfonic acid is high in volatility, so that excess ethanesulfonic acid for formation of the poorly soluble layer 3a volatilizes during device formation.

Whereas, similarly, also in the case of using a vapor of acetic acid of Example 22, conceivably, excess acetic acid volatilized during device formation, resulting in a high luminous efficiency. Thus, when an organic acid having a high volatility is used, the treatment of making the low-molecular-weight hole transport material poorly soluble can be carried out more optimally. This enables the organic EL device 300 to be low in cost, high in high-temperature durability, and long in lifetime.

Figure 29:
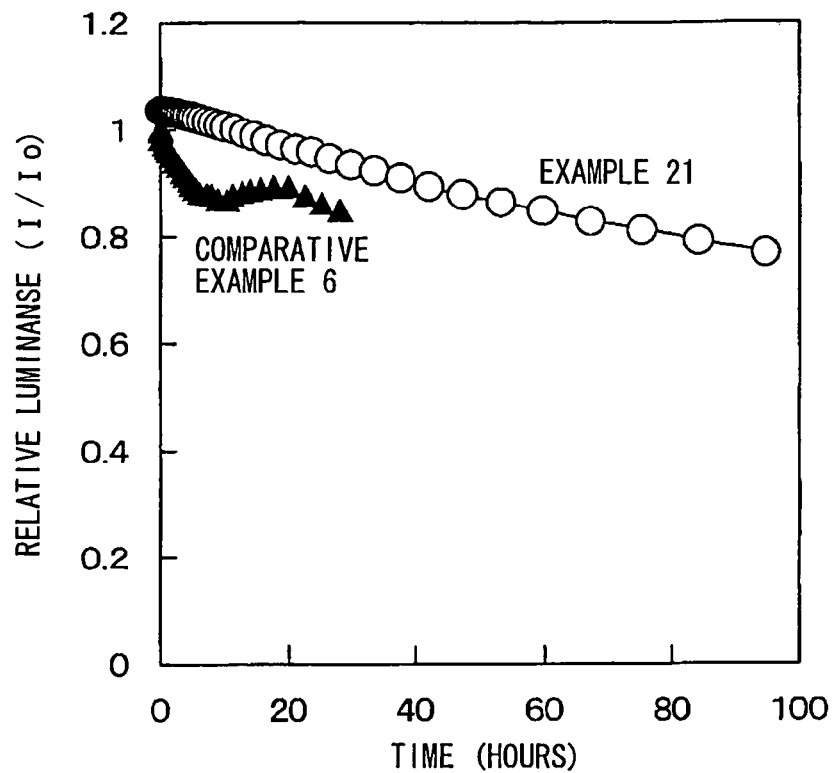
FIG. 29 is a view showing the changes with time in each luminance when Example 21 and Comparative Example 6 are constant-current driven at an initial luminance of 600 cd/m² under 25° C. environment.

Whereas, FIG. 29 is a view showing the changes with time in each luminance when Example 21 and Comparative Example 6 are constant-current driven at an initial luminance of 600 cd/m$^2$ under 25° C. environment. This view indicates as follows: Example 21 is a device which is less reduced in luminance than Comparative Example 6, and is stable and has a long lifetime. Herein, Example 21 was taken as an example. However, other examples also provide the same results. This also indicates that the organic EL device 300 shown in the foregoing embodiment has an elongated lifetime.

Example 24

In this example, with a different constituent material from that of Example 16, the low-molecular-weight hole transport layer 3 was formed. As for other steps, in the same manner as in Example 16, a sample of the organic EL device 300 was manufactured. Specifically, TPT represented by the Chemical Formula 2 was used as the constituent material of the low-molecular-weight hole transport layer 3.

Whereas, as Comparative Example 7, a sample was prepared with the same configuration as that of Example 16, except that the surface treatment with an organic acid was not carried out.

Then, the value of $I/I_0$ was 1.4, where I (cd/A) denotes the maximum luminous efficiency per unit current density of the sample of this example, and $I_0$ (cd/A) denotes the maximum luminous efficiency of the sample of Comparative Example 7. The results indicate as follows: even when the constituent material of the low-molecular-weight hole transport layer 3 is changed, a large luminous efficiency is obtained. This shows that the enhancement of the efficiency is possible.

Example 25

Also in this example, with a different constituent material from that of Example 16, the low-molecular-weight hole transport layer 3 was formed. As for other steps, in the same manner as in Example 16, a sample of the organic EL device 300 was manufactured. Specifically, TBPB represented by the Chemical Formula 3 was used as the constituent material of the low-molecular-weight hole transport layer 3.

Whereas, as Comparative Example 8, a sample was prepared with the same configuration as that of Example 25, except that the surface treatment with an organic acid was not carried out.

Then, the value of $I/I_0$ was 1.8, where I (cd/A) denotes the maximum luminous efficiency per unit current density of the sample of this example, and $I_0$ (cd/A) denotes the maximum luminous efficiency of the sample of Comparative Example 8. The results indicate as follows: even when the constituent material of the low-molecular-weight hole transport layer 3 is changed, a large luminous efficiency is obtained. This shows that the enhancement of the efficiency is possible.

From the results up to this point, it can be said that as the constituent materials of the low-molecular-weight hole transport layer 3 of the organic EL device 300 shown in the Embodiment, a plurality of triphenylamine derivative materials are effective.

Fourth Embodiment

As a result of a study by the present inventors, it has been revealed that, for an organic luminescent device using a polymer material, the instability of the polymer hole transport material such as PEDOT:PSS (poly(3,4-ethylenedioxythiophene)-poly-(styrenesulfonate)) currently proposed as a polymer hole transport functional material causes deterioration of the device. However, in this embodiment, as the hole transport layer, there is used a low-molecular-weight hole transport layer formed with a vacuum deposition method, and high in high-temperature durability and having stable characteristics. This can improve the high-temperature durability, lifetime, voltage increase associated with driving, as described above. Further, as compared with the case where in a low-molecular-weight compound type organic luminescent device including a multilayer lamination structure between electrodes, all the layers are formed by vacuum deposition, reduction of the light-emitting layer manufacturing cost can be achieved. This enables the formation of an organic EL device suitably usable as an in-vehicle display device.

As the low-molecular-weight material of the hole transport layer, a material with a molecular weight of 700 or more is used. This results in slight solubility in the solvent for use in formation of the light-emitting layer including a polymer material, and facilitates control of diffusion of the low-molecular-weight material into the light-emitting layer even when the material exhibits some solubility.

In this embodiment, by adopting, as the low-molecular-weight material of the hole transport layer, a material with a glass transition point or a melting point equal to or higher than the temperature of the drying treatment for volatilizing the solvent after coating or printing and forming of the polymer material of the light-emitting layer, it is possible to prevent deterioration of the characteristics in the light-emitting layer drying treatment.

In this embodiment, before stacking the light-emitting layer on the hole transport layer, a heat treatment is performed at a temperature equal to or higher than the glass transition point of the low-molecular-weight material of the hole transport layer, or when there is no glass transition point, equal to or higher than the melting point thereof. This enables further improvements of the durability of the hole transport layer for formation of the light-emitting layer, such as the durability against the solvent for use in formation of the light-emitting layer.

Further, under the low-molecular-weight hole transport layer not dissolvable in the solvent, the low-molecular-weight hole transport layer dissolvable in the solvent is stacked. This structure can improve the current efficiency of the organic EL device, which can reduce the driving voltage.

Further, as the low-molecular-weight material of the first layer on the side in contact with the light-emitting layer of the hole transport layer, there is used a material having a lower solubility in the solvent adopted for light-emitting layer polymer material formation than that of the low-molecular-weight material of the second layer covered with the first layer. This can implement the improvement of the solvent resistance of the hole transport layer at a low cost.

Whereas, in this embodiment, the film thickness of the hole transport layer of the first layer is set smaller than that of the second film. This can ensure the compatibility between the improvement of the solvent resistance of the hole transport layer and the reduction of the manufacturing cost, while reducing the use amount of the low-molecular-weight material for the first layer, being often expensive due to the high solvent resistance.

The organic luminescent device of this embodiment is driven at a duty ratio of 1/3 or less during one frame period. Alternatively, the device is DC driven in which a prescribed DC voltage in accordance with the light emission luminance is supplied across the hole injection electrode and the electron injection electrode during the display period in one frame period. By adopting such a driving method, it is possible to inhibit the deterioration at the interface between the light-emitting layer of the polymer material and the hole transport layer of the low-molecular-weight material. This prevents reduction of the luminance, which facilitates elongation of the device lifetime.

Figure 30:
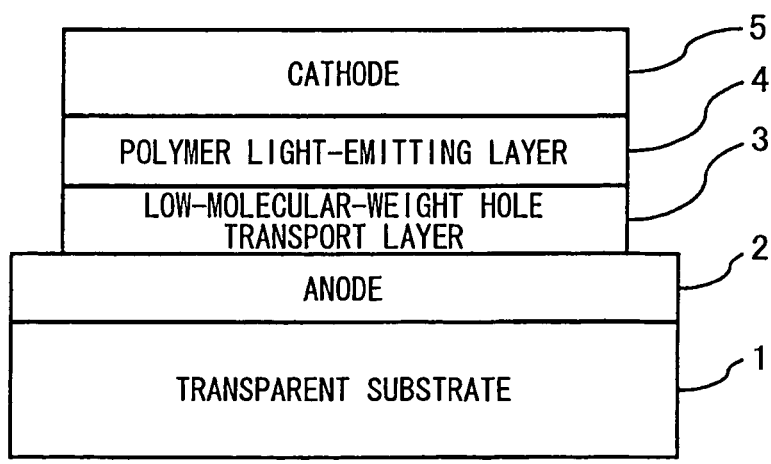
FIG. 30 shows a schematic cross-sectional structure of an organic EL device described in a fourth embodiment of the present invention.

FIG. 30 shows a schematic cross-sectional structure of an organic EL device 400 adopted as an example of the organic luminescent device in accordance with this embodiment.

The organic EL device 400 includes at least a light-emitting layer 4 using a polymer luminescent material between the hole injection electrode 2 functioning as an anode and an electron injection electrode 5 functioning as a cathode. In this embodiment, between the light-emitting layer 4 and the hole injection electrode 2, at least the hole transport layer 3 is formed. For the hole transport layer 3, a deposition film formed of a hole injectable/transportable low-molecular-weight material with a vacuum deposition method is adopted.

On the anode 2, the hole transport layer 3 is stacked with vacuum deposition. Then, on the hole transport layer 3, as the light-emitting layer 4, a polymer luminescent material is formed with a coating method or a printing method. On the light-emitting layer 4, the cathode 5 is stacked with, for example, a vacuum deposition method. Such a device 400 is formed up to the electron injection electrode 5 as a cathode. Then, finally, in a dry nitrogen atmosphere, a sealing can not shown is bonded to the device formation side of the substrate 1 for sealing.

The substrate 1 is a transparent substrate such as glass, but is not limited to glass. Various ones such as a resin substrate with a barrier film and a metal substrate can be used.

The hole injection electrode 2 as an anode is formed of a given conductive substance capable of forming a transparent or translucent electrode. Specifically, as an oxide, indium tin oxide (ITO), indium zinc oxide (IZO), tin oxide, zinc oxide, indium oxide, zinc aluminum oxide, zinc gallium oxide, titanium niobium oxide, or the like is used, and can be stacked with sputtering Or the like. Out of these, particularly, ITO is a material having advantages of being low in resistance, having a solvent resistance, being excellent in transparency, and the like.

On the surface of the conductive layer such as ITO, or, on the substrate 1, a metal material such as aluminum, gold, or silver may be evaporated to form a translucent conductive layer, or an organic semiconductor such as polyaniline may be used to form an anode. Alternatively, still other methods may be used to form the hole injection electrode 2 as an anode.

Further, the hole injection electrode 2 as an anode may be, if required, patterned in a shape required in a display or the like by etching after deposition, or may be subjected to surface activation by an UV treatment, a plasma treatment, or the like.

For the electron injection electrode 5 as a cathode, desirably, a material having a low work function is used, and particularly, the interface with the light-emitting layer 4 has a low work function. For example, there can be used an alkali metal or an alkaline-earth metal, a lamination of an alkali metal or an alkaline-earth metal and a metal electrode such as aluminum, a lamination of a halide of an alkali metal or an alkaline-earth metal, and a metal electrode such as aluminum, or the like. Specifically, there can be adopted a lamination structure configured in Al/Ca (light-emitting layer side), Al/Ba (light-emitting layer side), Al/Li (light-emitting layer side), Al/LiF (light-emitting layer side), Al/CsF (light-emitting layer side), Al/CaF (light-emitting layer side), or Al/Ca/ LiF (light-emitting layer side), or the like. The lamination structures can be formed with, for example, a vacuum deposition method.

The material of the low-molecular-weight hole transport layer 3 will be described in details later. For the hole transport layer 3, a low-molecular-weight material is deposited using a vacuum deposition method. As a result, it is possible to obtain a high-quality film excellent in film purity/density/flatness.

As the formation method of the hole transport layer 3, other than the vacuum deposition method, there are also a printing method by an ink jet method, a general pressing transfer method, a laser induced thermal imaging (LITI) method, or the like, a coating method by spin coating or the like, a vapor deposition method, and the like. However, from the viewpoint of the improvement of the high-temperature high-humidity durability of the organic EL device, the film quality of the hole transport layer 3 is important. As described above, from the viewpoints of the film purity/density/flatness, and the like, use of the vacuum deposition method is most desirable.

Further, after deposition and formation of the low-molecular-weight material with a vacuum deposition method, as described later, a heat treatment is carried out before the formation of the light-emitting layer 4 using a polymer material. This heat treatment can render the hole transport layer 3, particularly, the surface to be the interface with the light-emitting layer 4 smooth and dense, which can improve the resistance to the solvent (solvent resistance) for use in the light-emitting layer formation.

The heat treatment temperature is set at a temperature equal to or higher than the glass transition point of the low-molecular-weight material of the hole transport layer 3, or in the case of a material having no glass transition point, equal to or higher than the melting point. Incidentally, the sample may be heat treated in a deposition chamber for vacuum deposition, or may be transported to a heating unit, separately, to be heat treated. However, in either case, in order to prevent deterioration due to oxygen, moisture, and the like of the low-molecular-weight material, heating is desirably carried out in a non-oxidizing atmosphere. For example, heating is carried out in an atmosphere of an inert gas such as a nitrogen gas or an argon gas.

Incidentally, when, in vacuum deposition, the hole transport layer 3 is required to be patterned in a desirable shape for each pixel, a deposition mask including openings in an objective pattern formed therein is disposed between the deposition source and the substrate which is a deposition target. Thus, simultaneously with deposition, the low-molecular-weight hole transport layer 3 is patterned.

As the formation method of the light-emitting layer 4 using a polymer material to be formed on the hole transport layer 3, there can be adopted a method referred to as a so-called wet treatment. The wet treatment is a method in which a polymer material is dispersed in a solvent, and the solvent is deposited on the forming surface. Mention may be made of coating methods such as spin coating method, dip coating method, and spray method, the printing methods such as ink jet method, transfer, and LITI method, and the like.

The transport between respective steps for forming respective layers of the organic EL device 400 described up to this point has no particular restriction. However, transport in a dry atmosphere is desirable.

As the sealing method of the device, other than sealing by a metal can, there are applicable a sealing method in which glass or a film with a barrier is bonded on the device formation side of the substrate 1, a method in which a protective film such as a silicon nitride film is formed in such a manner as to directly cover the whole substrate after the formation of the electron injection electrode 5 as a cathode, thereby to seal the device from the outside, or other methods. Such a sealing step and the deposition step of the polymer light-emitting layer 4 have no particular restriction. However, the steps can be carried out in, for example, a glove box.

Then, the hole transport layer 3 and the light-emitting layer 4 will be described specifically.

(Low-Molecular-Weight Hole Transport Material)

The molecular weight of the low-molecular-weight hole transport material is preferably 700 or more and 2000 or less. A molecular weight of 700 or more can inhibit the diffusion of the low-molecular-weight material into the light-emitting layer even when the polymer material is dissolved in a small amount in the solvent of the polymer luminescent material dispersion for coating or printing the polymer material. A molecular weight of 2000 or less facilitates heating and deposition of the material when the film is formed with a vacuum deposition method.

Further, after stacking of the polymer material of the light-emitting layer 4, a solvent drying step is performed. In the drying step, heating is carried out to about 120° C. When the temperature in the drying step exceeds the glass transition point of the low-molecular-weight material of the hole transport layer 3, or the melting point when there is no glass transition point, in the drying step, an increase in interface roughness due to aggregation of the low-molecular-weight material, mixing of the low-molecular-weight material and the polymer material, and the like are caused, resulting in deterioration of device characteristics. In this embodiment, as the low-molecular-weight material of the hole transport layer 3, there is adopted a material having a glass transition point or a melting point equal to or higher than the solvent drying temperature after polymer material coating, for example, 120° C. or more.

Further, in this embodiment, the low-molecular-weight material is used as the hole transport layer 3, and hence is required to be a material having a high hole transportability. As one example, a triphenylamine derivative material is desirably adopted. Non-limiting specific examples of the triphenylamine derivative material may include the compounds as represented by Chemical Formulae 5 to 7, and 9.

The foregoing triphenylamine derivative materials can form the low-molecular-weight hole transport layer 3 with a vacuum deposition method. Incidentally, the glass transition temperatures Tg of the triphenylamine derivative materials shown are 143° C. for TPT of Chemical Formula (9), 131.8° C. for TBPB of Chemical Formula (7), 133° C. for Spio-1-TAD of Chemical Formula (6), and 203° C. for t-Bu-TBATA of Chemical Formula (5). When these materials are used for the hole transport layer 3, the heat treatment after vacuum deposition is performed at Tg or more of each of the used materials. Incidentally, when the heating temperature in the heating and drying step after stacking of the polymer light-emitting layer 4 is, for example, 120° C. as described above, any of the foregoing materials also has a glass transition temperature equal to or higher than the heating temperature, and hence deterioration of the hole transport layer 3 can be prevented in the drying step.

As the low-molecular-weight hole transport layer materials, materials each having a center of symmetry out of the triphenylamine derivative materials are preferable because of the following: each material has a molecular shape relatively close to a sphere; thus, when the material is formed in a thin film, molecules tend to be arrayed, resulting in an improvement of the solvent resistance. Out of these, particularly, a starburst amine is more preferable because of the following:

molecules tend to be arrayed, so that a thin film excellent in solvent resistance is formed. Incidentally, any of the triphenylamine derivative materials represented by Chemical Formulae 5 to 7, and 9 has a portion including the triphenylamine units arrayed in a star shape.

As described above, it is preferable that the molecular weight of the low-molecular-weight hole transport material is 2000 or less.

Figure 38:
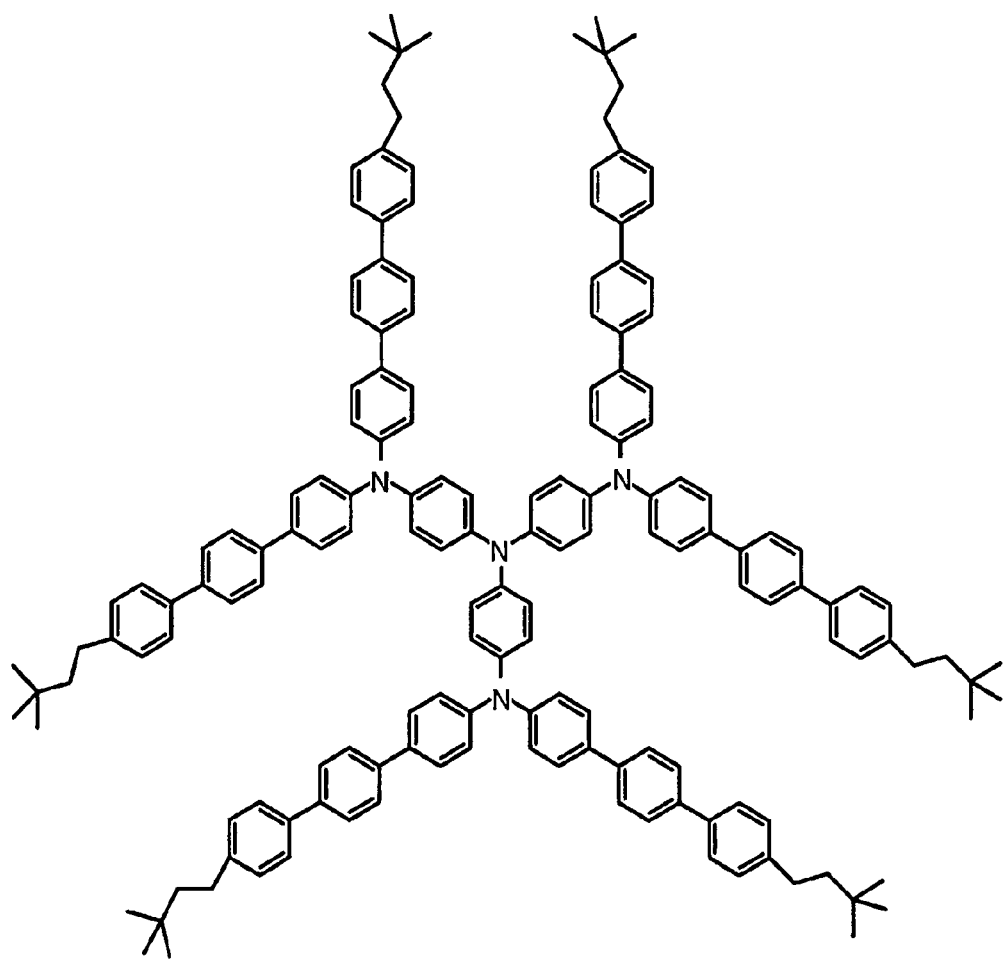
FIG. 38 shows a hole transportable material corresponding to Chemical Formula 22.
Figure 39:
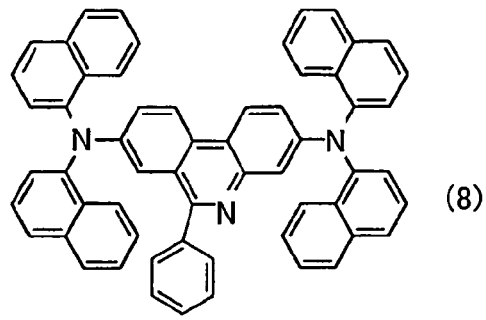
FIG. 39 shows a hole transportable material corresponding to Chemical Formula 23.
Figure 40:
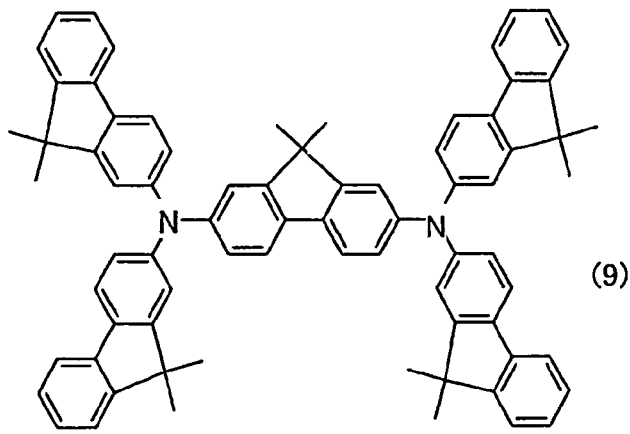
FIG. 40 shows a hole transportable material corresponding to Chemical Formula 24.
Figure 41:
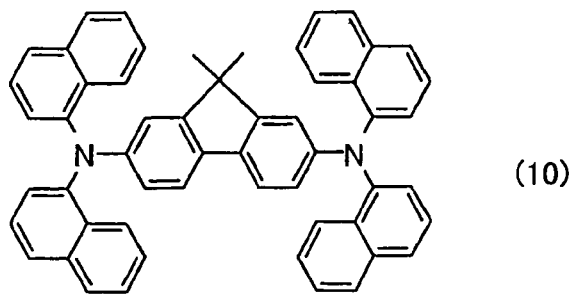
FIG. 41 shows a hole transportable material corresponding to Chemical Formula 25.
Figure 42:
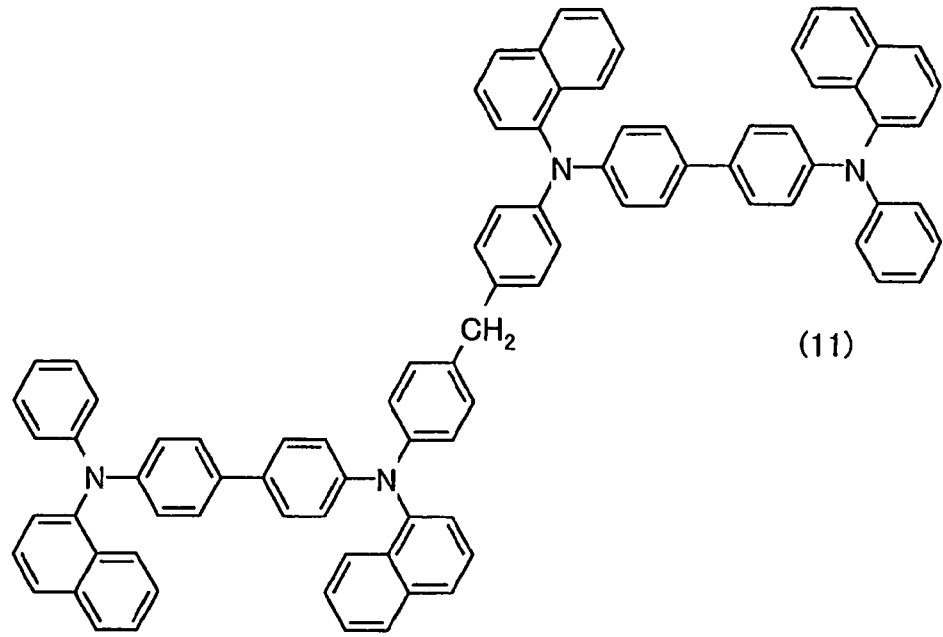
FIG. 42 shows a hole transportable material corresponding to Chemical Formula 26.
Figure 43:
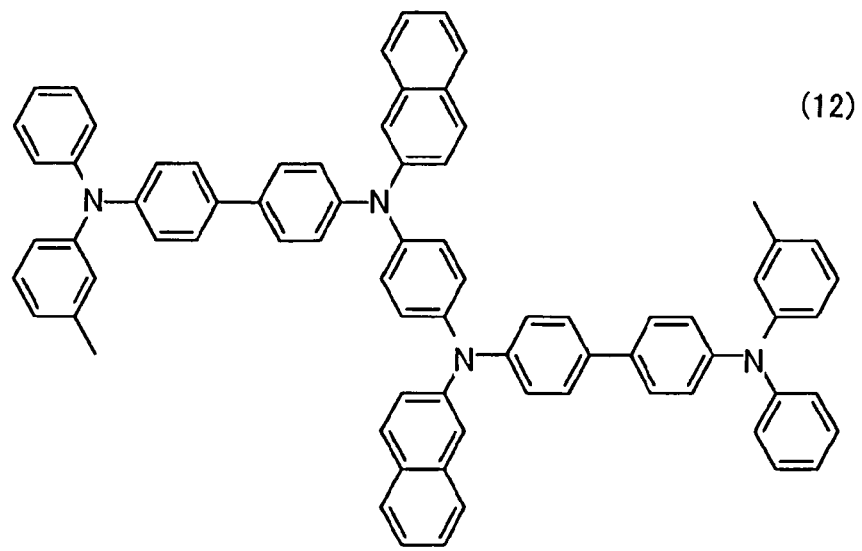
FIG. 43 shows a hole transportable material corresponding to Chemical Formula 27.
Figure 44:
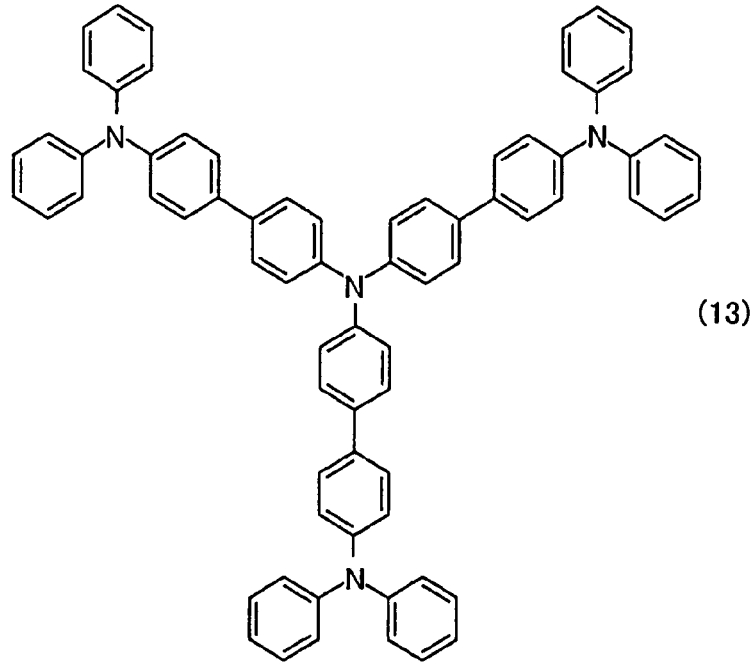
FIG. 44 shows a hole transportable material corresponding to Chemical Formula 28.
Figure 45:
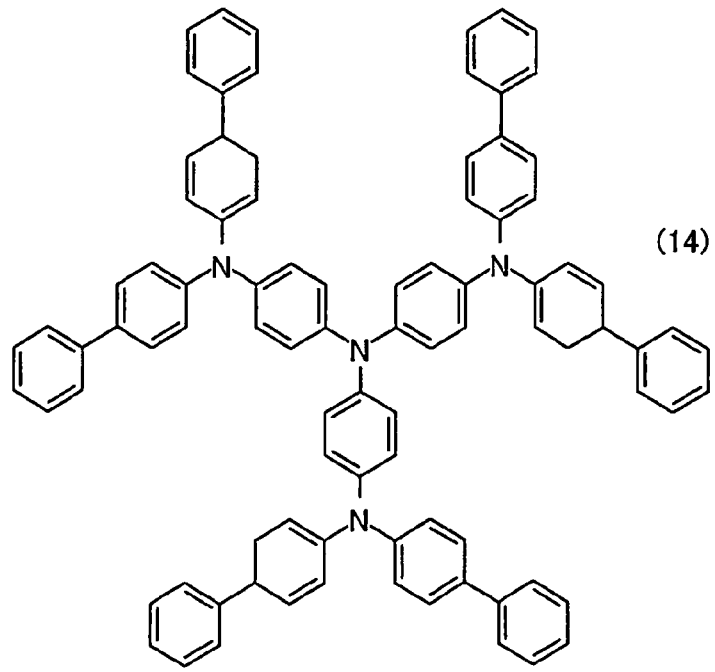
FIG. 45 shows a hole transportable material corresponding to Chemical Formula 29.

The t-Bu-TBATA of the Chemical Formula (5) has a molecular weight of 1540. On the other hand, the compound represented by Chemical Formula (22) is identical in basic skeleton to t-Bu-TBATA, but has a molecular weight of 2165. FIG. 38 shows the compound represented by Chemical Formula (22). Other than the effect of the specific molecular structure, an increase in molecular weight with the same basic skeleton as in the Chemical Formulae (5) and (22) tends to result in a higher evaporation temperature for carrying out vacuum deposition. In actuality, the temperature for depositing the compound of Chemical Formula (22) is required to be set higher than that for t-Bu-TBATA of Chemical Formula (5).

Herein, in this embodiment, in vacuum deposition of the low-molecular-weight material, the sublimation temperature thereof is 300° C. or more at a degree of vacuum of 1 Pa. Therefore, when the molecular weight exceeds 2000, the efficiency of deposition decreases, and the sublimation temperature becomes a still higher temperature. Accordingly, by heating, not only sublimation is effected, but also decomposition of molecules may be caused. When decomposition is caused, the hole transport ability and the like are adversely affected thereby. This leads to an increase in driving voltage of the organic EL device, and the like. Therefore, it is preferable to adopt a material with a molecular weight of 2000 or less.

(Multilayer Structure of Hole Transport Layer)

The hole transport layer 3 is a multilayer of two or more layers. The side thereof in contact with the light-emitting layer 4 is a first layer, and the lower layer covered with the first layer is a second layer. Different low-molecular-weight hole transport materials can be adopted at least between the first layer and the second layer.

For example, as the low-molecular-weight material of the first layer, at least, there can be used a material having a low solubility (poorly soluble) in a solvent substance for use as the solvent of the polymer material; and for the second layer, there can be adopted a material not poorly soluble in the solvent substance.

When a monolayer structure is adopted for the hole transport layer 3, the material of the hole transport layer 3 is required to have the dissolution resistance to the solvent of the polymer material of the light-emitting layer 4. On the other hand, in the case of a multilayer structure, at least, when the first layer in contact with the light-emitting layer 4 has the dissolution resistance, the dissolution of the low-molecular-weight material of the second layer can be prevented even if the dissolution resistance of the low-molecular-weight material of the second layer covered with the first layer is low. For this reason, the degree of freedom in selection of the material of the second layer is high. In other words, when a material poorly soluble in the solvent substance is used for the first layer on the side in contact with the light-emitting layer 4, a material not particularly poorly soluble can be used as the material for the second layer. In this case, the hole transport layer 3 of a multilayer structure has a relation that the solubility of the first layer is lower than the solubility of the second layer in the polymer luminescent material solvent of the second layer.

As one example, for the first layer, the triphenylamine derivative materials as represented by the Chemical Formulae 5 to 7, and 9, and the like are adopted. However, for the second layer, as one example, there can be adopted a material which is well known as a low-molecular-weight hole transport material such as α-NPB represented by the following Chemical Formula (8), but is low in solvent resistance.

The α-NPB represented by the Chemical Formula (8) has a molecular weight of 588 and a glass transition temperature of 98° C. However, even when this material is used for the second layer, an organic EL device high in stability can be obtained. It is naturally understood that the low-molecular-weight hole transport material of the second layer is not limited to the α-NPB. For example, by adopting other materials excellent in hole transportability, and capable of forming a stable film excellent in purity/density/flatness with vacuum deposition, it is possible to obtain organic EL devices excellent in durability.

Further, out of the multilayer structure of the hole transport layer 3, the first layer can be formed thinner than other layers (e.g., the second layer). It is essential only that the thickness of the first layer is at least a thickness approximately enough to prevent dissolution of the second layer when the second layer has no dissolution resistance to the solvent of the polymer light-emitting layer 4. The thickness of the first layer can be set at a thickness within the range of 5 nm or more and less than 50 nm, for example, 10 nm. As described above, the low-molecular-weight hole transport material (e.g., a triphenylamine derivative material such as the foregoing starburst amine) of the first layer showing slight solubility in the solvent of the polymer light-emitting layer 4 includes bulky molecules, and is also often expensive. However, formation with a thickness approximately enough to provide a dissolution preventing effect, and as thin as possible can minimize the amount of the material used. This can suppress the increase in manufacturing cost.

Incidentally, it is preferable from the viewpoints of film purity/density/flatness that all of respective layers of the hole transport layer 3 of a multilayer structure are formed with a vacuum deposition method as with the case of the monolayer. In this case, the boundary between the second layer and the first layer is not necessarily required to be definite. A layer structure is also acceptable in which the concentration changes stepwise from the lamination region of only the second layer component, by co-deposition, gradually to the mixture region with the first layer component, and the lamination region of only the first layer component.

(Hole Injection Layer)

In the organic EL device 400 of FIG. 30, a hole injection layer may be further provided between the hole transport layer 3 and the hole injection electrode 2 as an anode. As the material for the hole injection layer, a material smaller in hole injection barrier from the hole injection electrode 2 as an anode than the hole transport layer 3 is used. This enhances the hole injection efficiency into the light-emitting layer 4, which enables reduction of 10, the driving voltage and the like.

As the materials for the hole injection layer, mention may be made of Copper phthalocyanine, Tetracyanoethylene, 2,3,5,6-Tetrafluoro-7,7,8,8-tetracyanoquinodimethane, 2-[4-((Bis(2-hydroxyethyl)aminophenyl)-cyanomethylene)-2,5-cyclohexadien-1-yldiene]malononitrile, 2,3-Dichloro-5,6-dicyano-1,4-benzoquinone, 2,6-Dimethylbenzoquinone, polyaniline, and the like.

Incidentally, these hole injection layers can also be formed with a vacuum deposition method high in deposition quality.

(Other Examples of Hole Transport Layer)

As the materials for the hole transport layer 3 of a monolayer structure or the materials for the first layer on the side in contact with the light-emitting layer 4 when the multilayer structure is adopted, other than the Chemical Formulae 5 to 7, and 9, there can be respectively used the compounds as represented by the following Chemical Formulae 12, and 23 to 29 (TCTA, (DNA)PP, TFLFL, TNFL, NPB—$CH_2$—NPB, (PTB)DNPP, s-TPT, and TBATA materials).

(Polymer Luminescent Material)

The polymer luminescent material desirably has a mean molecular weight of 10000 or more in view of the surface flatness after coating and formation, and implementation of a lower device driving voltage. As the polymer luminescent materials, for example, there can be used polyfluorene (PF) type polymers, polyphenylene vinylene (PPV) type polymers, polyvinyl carbazole (PVK) type polymers, or the like. There can be also used the ones obtained by dispersing a fluorescent dye or a phosphorescent dye in the polymers, polystyrene type polymers, polythiophene type polymers, polymethyl methacrylate type polymers, or the like.

Further, as other polymers, there can be also adopted polyphenylene ethynylene (PPE) type polymers, polyphenylene (PP) type polymers, polyparaphenylene (PPP) type polymers, and polysilane type polymers such as polymethylphenylsilane (PMPS). Incidentally, these polymers may be used alone, may be used in mixture of two or more thereof, or may be used in mixture with a low-molecular-weight material, or the like.

As the solvent of the polymer organic, luminescent materials, for example, there can be used a single solvent such as toluene, xylene, acetone, anisole, methyl anisole, dimethyl anisole, tetralin, ethyl benzoate, methyl benzoate, methyl ethyl ketone, cyclohexanone, methanol, ethanol, isopropyl alcohol, ethyl acetate, butyl acetate, or water, or a mixed solvent (solution) thereof. The polymer organic luminescent material is dissolved in the solvent to prepare a light-emitting layer solution. The resulting light-emitting layer solution is deposited on the hole transport layer 3 by a wet treatment such as a coating method or a printing method as described above. Then, the solvent is dried and removed. As a result, the polymer light-emitting layer 4 can be formed in such a manner as to cover the hole transport layer 3.

Out of the solvents, particularly, aromatic solvents such as toluene, xylene, anisole, methyl anisole, dimethyl anisole, tetralin, ethyl benzoate, and methyl benzoate are good in solubility for the polymer organic luminescent materials, and are also easy to handle. For this reason, the aromatic solvents are more preferable solvents. Whereas, there can be used a spin coating method, a dip coating method, or a spray method as a coating method, and a method such as an ink jet method or a transfer method as a printing method.

As one example of the polyfluorene type polymers, mention may be made of a Poly[9.9-di(2'-ethylhexylfouorenyl-2, 7'-diyl)] polymer luminescent material which is one kind of the luminescent materials. The luminescent material can be dissolved in, for example, a xylene solvent.

As one example of the polyphenylene vinylene type polymers, mention may be made of a Poly(2-methoxy-5-(2'-ethylhexyloxy)-1,4-phenylenevinylene) polymer luminescent material which is one kind of the luminescent materials. The luminescent material can also be dissolved in, for example, a xylene solvent.

The polyvinyl carbazole type polymer materials can be mixed with, for example, a 2-(4-Biphenylyl)-5-phenyl-1,3,4-oxadiazole low-molecular-weight material, to be dissolved in a solvent for use. As the solvent in this case, for example, dichloroethane can be used.

Incidentally, after forming the luminescent material layer on the hole transport layer 3 using any of the polymers and the solvent which has dissolved this therein, a drying treatment for removing the solvent is carried out. The drying treatment is carried out in an about 120-° C. non-oxidizing atmosphere including an inert gas such as a nitrogen gas or an argon gas.

Figure 31:
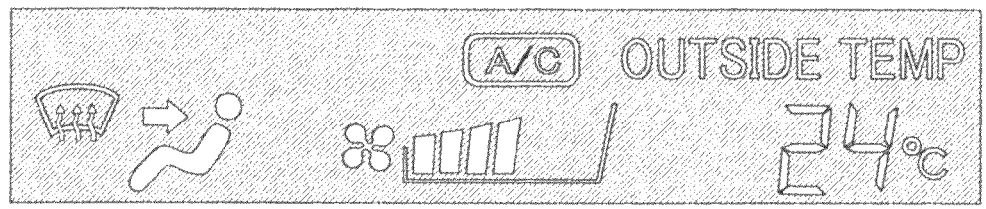
FIG. 31 shows one example of a display using an organic EL device.

FIG. 31 shows one example of a display using the organic EL device in accordance with this embodiment. The organic EL device in accordance with this embodiment can be manufactured at a low cost, and is very high in durability against high-temperature high-humidity environment. For this reason, the organic EL device is very useful, as one example, as an in-vehicle display. FIG. 31 shows an example of the in-vehicle segment type display.

Displays fall into two broad categories: an active matrix type including a switching element in each pixel; and a passive matrix type including no switching element. The passive matrix type displays include: a system in which an anode and a cathode are formed in a stripe in such a manner as to be orthogonal to each other with a light-emitting layer and the like interposed therebetween; and a segment system in which one of the anode and the cathode has a shape to be displayed from the beginning, and the other serves as a common electrode, and has the shape to be displayed by pixels (the segment type displays may be distinguished from the passive matrix type displays).

With such a segment type display or a passive matrix type display based on stripe electrodes with a low pixel count (e.g., 1/3 duty ratio), EL devices including respective pixels are continuously being selected during almost all the period, or during a period of about 1/3 period of one field period, resulting in a display period.

For this reason, during each display period, the EL device of each pixel is supplied with a given voltage according to the display contents. Incidentally, also in the case of the active matrix type display, EL devices are supplied with a given voltage during the display period according to the circuit configuration in pixel, or the like. The EL device in accordance with this embodiment can perform display with high reliability for a long time with a driving method (DC driving) such that a given voltage is applied during such a display period.

Below, Examples and Comparative Examples of this embodiment will be described by reference to a device configuration shown in FIG. 30.

Example 26

As Example 26 of this patent, on a glass substrate 1, an ITO electrode was formed to 150 nm as the hole injection electrode 2 as an anode. Then, as the hole transport layer 3, t-Bu-TBATA represented by Chemical Formula (5) was deposited and formed to 60 nm with a vacuum deposition method.

Then, ADS233YE polymer luminescent material manufactured by American Dye Source, Inc., was dissolved in a xylene solvent. The resulting light-emitting layer solution was used. The solution was deposited to 100 nm as a polymer light-emitting layer on the hole transport layer 3 with a spin coating method. Through a drying step of the solvent, on the light-emitting layer 4, an Al/Ca electrode was formed as the electron injection electrode 5 as a cathode with a vacuum deposition method.

Finally, in a glove box, a metal can and the glass substrate with the organic EL device 400 formed thereon were bonded together with a photocurable resin. Thus, a sample with the organic EL device sealed therein was formed.

As Comparative Example 9, a sample was formed under the same conditions as in Example 26, except that as the material for the hole transport layer 3, a PEDOT:PSS polymer material layer deposited to 100 nm with a spin coating method was used.

Figure 32:
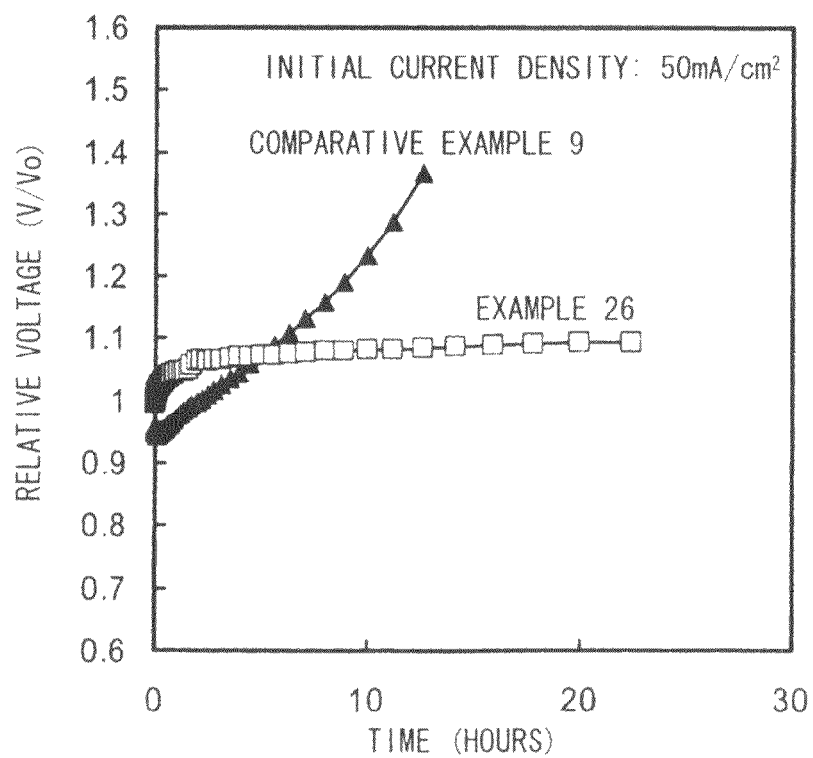
FIG. 32 shows the time dependency of the ratio of driving voltage to initial driving voltage when the organic EL devices of Example 26 and Comparative Example 9 are constant-current driven at a current density of 50 mA/cm².

FIG. 32 shows the time dependency of the ratio of driving voltage to initial driving voltage when the organic EL devices of Example 26 and Comparative Example 9 are constant-current driven at a current density of 50 mA/cm$^2$. For Comparative Example 9, the driving voltage ratio increased by 20% or more in 10 hours. In contrast, for Example 26, even 100-hour driving did not result in more than 20%, and provided stable driving characteristics.

Figure 33:
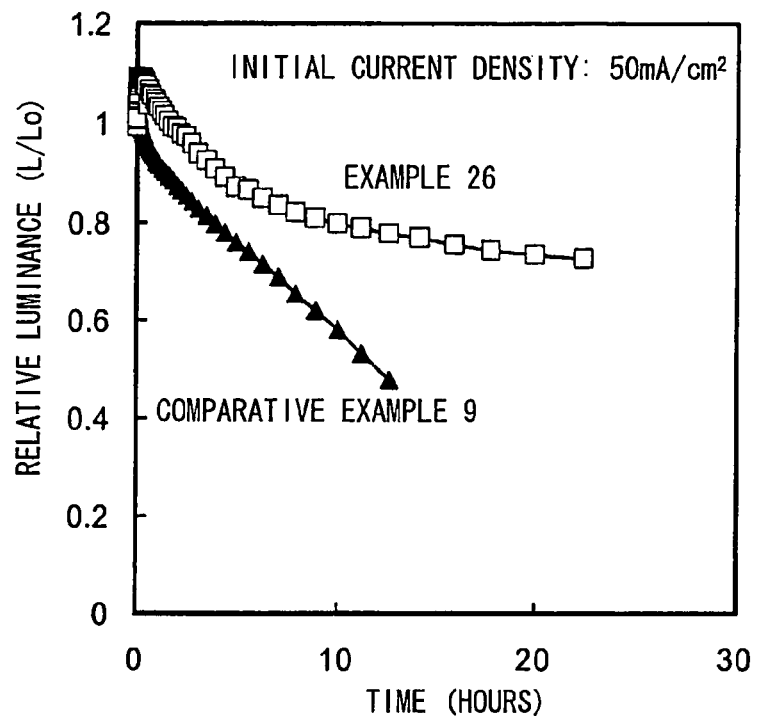
FIG. 33 shows the time dependency of the ratio of light emission luminance to initial luminance when the organic EL devices of Example 26 and Comparative Example 9 are constant-current driven at a current density of 50 mA/cm².

FIG. 33 shows the time dependency of the ratio of light emission luminance to initial luminance when the devices of Example 26 and Comparative Example 9 are constant-current driven at a current density of 50 mA/cm$^2$. It can be understood as follows. For Comparative Example 9, the luminance decreased to half in 10 hours. In contrast, for Example 26, even 10-hour driving resulted in a decrease in luminance by only about 20% and provided stable driving characteristics.

Whereas, also in the case of driving under 85° C. environment, Example 26 was durable for a longer time than Comparative Example 9. This indicates that the device of Example 26 is also excellent in high-temperature durability. Therefore, the organic EL device of the structure of Example 26 is also preferably usable as a device for uses strongly requiring high-temperature durability, such as in-vehicle use.

Example 27

Figure 34:
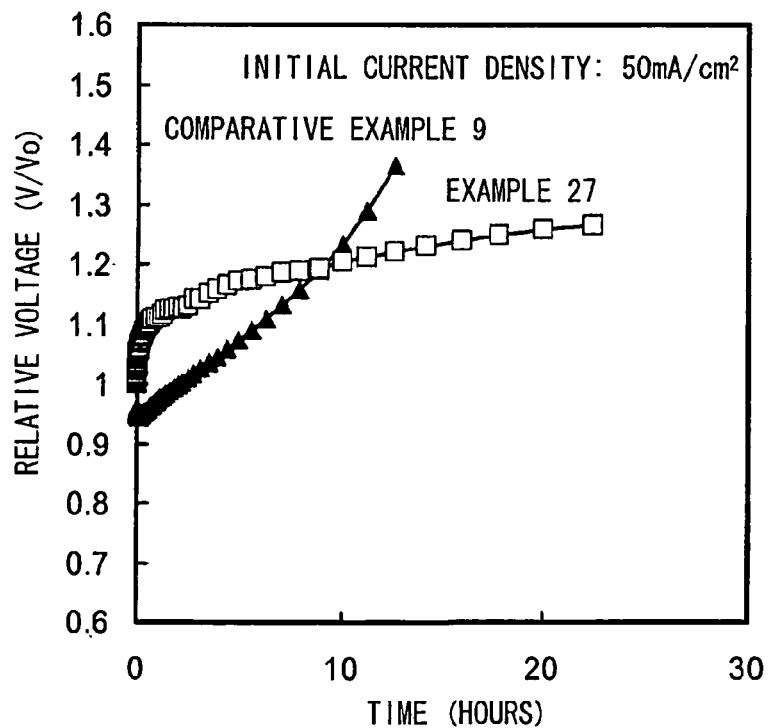
FIG. 34 shows the time dependency of the ratio of driving voltage to initial driving voltage when the organic EL devices of Example 27 and Comparative Example 9 are constant-current driven at a current density of 50 mA/cm².

As Example 27, an organic EL device was formed under the same conditions as in Example 26, except that as the material for the hole transport layer 3, TBPB represented by Chemical Formula (7) was used. FIG. 34 shows the time dependency of the ratio of driving voltage to initial driving voltage when the devices of Example 27 and Comparative Example 9 are constant-current driven at a current density of 50 mA/cm$^2$.

For Example 27, the voltage increase rate associated with driving was more suppressed than for Comparative Example 9. This indicates that the device of Example 27 has stable driving characteristics. Further, the device also showed the same tendency in luminescent characteristic and high-temperature durability. The results indicate that even a different material can produce effects so long as the material satisfies the conditions as in Example 26.

Example 28

As Example 28, an organic EL device was formed under the conditions in common with Example 26, except that as the material for the hole transport layer 3, t-Bu-TBATA represented by Chemical Formula (5) was used.

Specifically, on a glass substrate, an ITO electrode was formed to 150 nm. Then, as the hole transport layer 3, t-Bu-TBATA represented by Chemical Formula (5) was deposited to 60 nm with a vacuum deposition method. For the polymer light-emitting layer 4, a Poly[(9,9-di-(2'-ethylhexylfluorenyl-2,7'-diyl)] polymer luminescent material which is one kind of the polyfluorene type luminescent materials was dissolved in a xylene solvent. Using the resulting light-emitting layer solution, the polymer light-emitting layer 4 was formed to 100 nm with a spin coating method.

After a drying step of the solvent, on the light-emitting layer 4, an Al/Ca electrode was formed with a vacuum deposition method. Finally, in a glove box, a metal can and the glass substrate with the device formed thereon were bonded together with a photocurable resin. Thus, a sample with the manufactured device sealed therein was formed.

Figure 35:
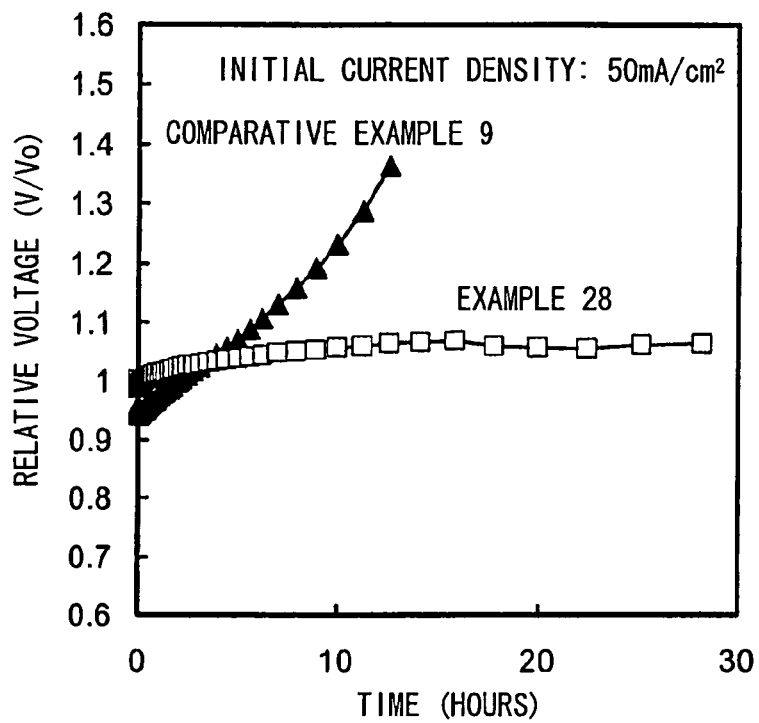
FIG. 35 shows the time dependency of the ratio of driving voltage to initial driving voltage when the organic EL devices of Example 28 and Comparative Example 9 are constant-current driven at a current density of 50 mA/cm².

FIG. 35 shows the time dependency of the ratio of driving voltage to initial driving voltage when the devices of Example 28 and Comparative Example 9 are constant-current driven at a current density of 50 mA/cm$^2$. For Comparative Example 9, the driving voltage ratio increased by 20% or more in 10 hours. In contrast, for Example 28, even 100-hour driving did not result in more than 20%, and provided stable driving characteristics.

Example 29

As Example 29, on a glass substrate 1, an ITO electrode was formed to 150 nm as the hole injection electrode 2 as an anode. Then, as the hole transport layer 3, the material represented by Chemical Formula (5) was used, and deposited to 60 nm with a vacuum deposition method.

For the polymer light-emitting layer 4, a Poly(2-methoxy-5-(2'-ethylhexyloxy)-1,4-phenylenevinylene) polymer luminescent material which is one kind of the polyphenylenevinylene type luminescent materials was dissolved in a xylene solvent. Using the resulting coating solution, the light-emitting layer 4 was formed to 100 nm with a spin coating method. After performing a drying step of the solvent, on the light-emitting layer 4, an Al/Ca electrode was formed as the electron injection electrode 5 as a cathode with a vacuum deposition method. Finally, in a glove box, a metal can and the glass substrate with the device formed thereon were bonded together with a photocurable resin. Thus, a sample with the manufactured device sealed therein was formed.

Figure 36:
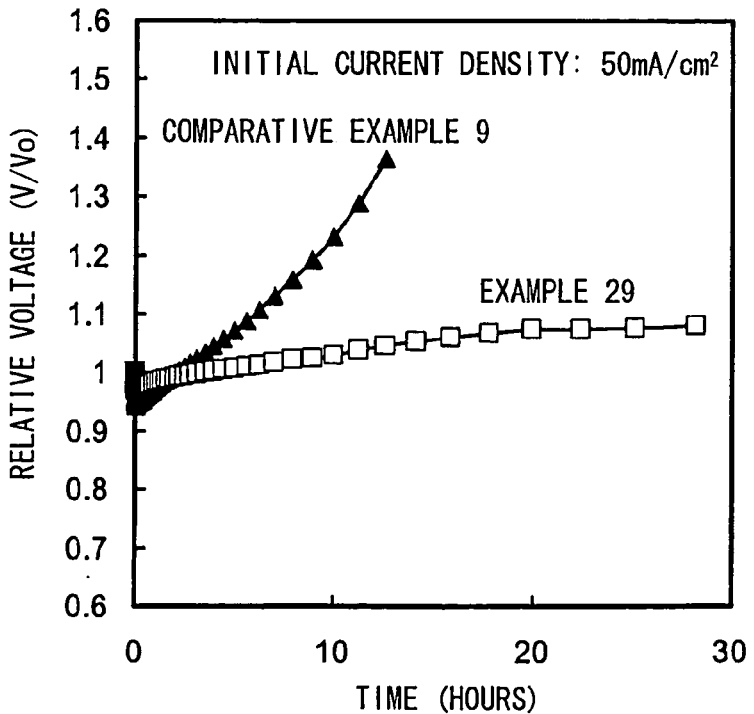
FIG. 36 shows the time dependency of the ratio of driving voltage to initial driving voltage when the devices of Example 29 and Comparative Example 9 are constant-current driven at a current density of 50 mA/cm².

FIG. 36 shows the time dependency of the ratio of driving voltage to initial driving voltage when the devices of Example 29 and Comparative Example 9 are constant-current driven at a current density of 50 mA/cm$^2$. For Comparative Example 9, the driving voltage ratio increased by 20% or more in 10 hours. In contrast, for Example 29, even 100-hour driving did not result in more than 20%, and provided stable driving characteristics.

Example 30

As Example 30, on a glass substrate, an ITO electrode was formed to 150 nm as the hole injection electrode 2 as an anode. As the hole transport layer 3, t-Bu-TBATA represented by Chemical Formula (5) was deposited to 60 nm with a vacuum deposition method. For the light-emitting layer 4, 2-(4-Biphenylyl)-5-phenyl-1,3,4-oxadiazole low-molecular-weight material and a Polyvinyl carbazole polymer material were dissolved in equivalent weights in a dichloroethane solvent. Using the resulting coating solution, the light-emitting layer 4 was deposited to 100 nm with a spin coating method. After performing a solvent drying step, on the polymer light-emitting layer 4, an Al/Ca electrode was formed with a vacuum deposition method. Finally, in a glove box, a metal can and the glass substrate with the device formed thereon were bonded together with a photocurable resin. Thus, a sample with the manufactured device sealed therein was formed.

Figure 37:
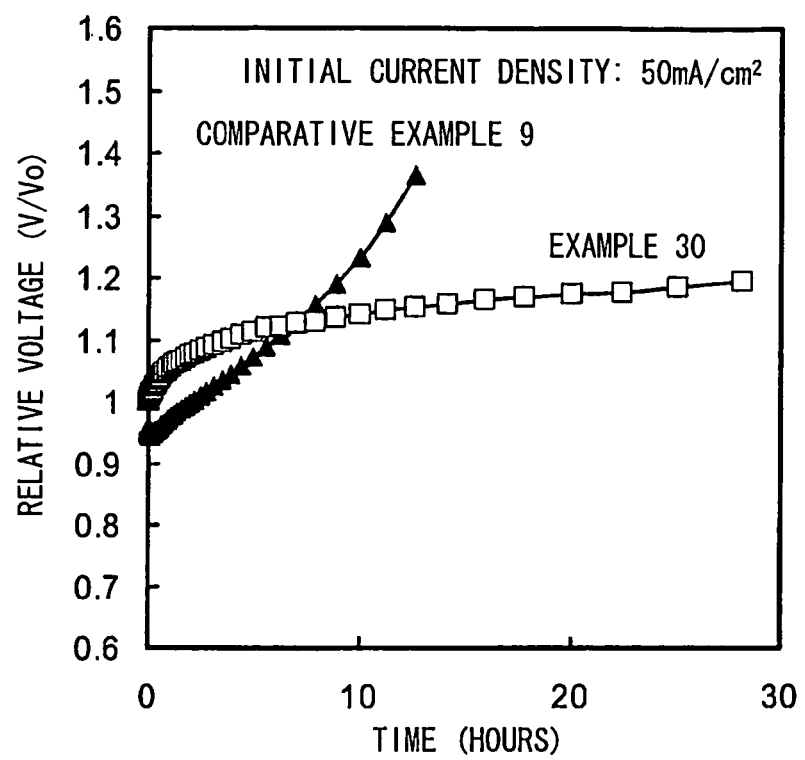
FIG. 37 shows the time dependency of the ratio of driving voltage to initial driving voltage when devices of Example 30 and Comparative Example 9 are constant-current driven at a current density of 50 mA/cm².

FIG. 37 shows the time dependency of the ratio of driving voltage to initial driving voltage when the devices of Example 30 and Comparative Example 9 are constant-current driven at a current density of 50 mA/cm².

For Comparative Example 9, the driving voltage ratio increased by 20% or more in 10 hours. In contrast, for Example 30, even 30-hour driving did not result in more than 20%, and provided stable driving characteristics.

Example 31

As Example 31, a sample was prepared in which the material represented by Chemical Formula (5) was deposited at a deposition rate of 5 nm/min as the hole transport layer 3 under the same conditions as in Example 26. As Comparative Example 2, a sample was prepared in which the material represented by Chemical Formula (22) was deposited at a deposition rate of 5 nm/min as the hole transport layer 3 under the same conditions as in Example 26.

Example 31 and Comparative Example 2 were driven at a current density of 50 mA/cm². As a result, the driving voltage of Comparative Example 2 increased higher than that of Example 31 by 30%. The molecular weight of t-Bu-TBATA represented by the Chemical Formula (5) is 1540. In contrast, the molecular weight of the compound of Chemical Formula (22) is 2165. For this reason, the sublimation temperature for depositing the compound of Chemical Formula (22) is required to be set higher than for the compound of Chemical Formula (5). The sublimation temperature exceeds the decomposition temperature of the material of Chemical Formula (22). This conceivably resulted in degradation of the characteristics of the hole transport layer, which led to an increase in voltage.

From this, it can be understood as follows: when the molecular weight of the low-molecular-weight material exceeds 2000, the deposition temperature (sublimation temperature) may exceed the decomposition temperature; for this reason, the molecular weight of the low-molecular-weight material is preferably set at 2000 or less.

The foregoing disclosure includes the following embodiments.

In the first embodiment of the present disclosure, an organic EL device, includes: an electrode substrate; a hole injection electrode disposed on the electrode substrate; a hole transport layer disposed on the hole injection electrode; a light-emitting layer disposed on the hole transport layer; and an electron injection electrode disposed on the light-emitting layer. The hole transport layer is formed of a first low-molecular-weight material having a smaller molecular weight than a prescribed first molecular weight; and the light-emitting layer is formed of a mixture of a polymer material having a larger molecular weight than a prescribed second molecular weight and a second low-molecular-weight material having a smaller molecular weight than a prescribed third molecular weight.

Thus, by using the low-molecular-weight hole transport layer, it is possible to enhance the durability. Then, the light-emitting layer includes a mixture of a polymer material and a low-molecular weight material. For this reason, the low-molecular-weight material added to the polymer material serves as a binder filling the gap of the steric hindrance to form entanglement of the polymer material and the low-molecular-weight material. This can enhance the adhesion of the interface between the hole transport layer and the light-emitting layer. Therefore, it is possible to implement an organic EL device high in durability, and also high in adhesion of the interface between the low-molecular-weight hole transport layer and the light-emitting layer.

As an alternative, the light-emitting layer is formed of a coating film, and the hole transport layer is formed of a vacuum deposition film. Alternatively, the second low-molecular-weight material has a HOMO-LUMO gap. The HOMO-LUMO gaps is larger than the luminous energy of light emitted from the light-emitting layer. This enables prevention of the following: light emitted at the light-emitting layer is absorbed by the low-molecular-weight material, resulting in reduction of the efficiency; or the low-molecular-weight material itself emits light, which causes deviation from the desirable chromaticity.

As an alternative, the light-emitting layer includes the second low-molecular-weight material in an amount of 1 wt % or more and less than 50 wt % of the total amount of the polymer material and the second low-molecular-weight material. By thus setting the mixing amount of the low-molecular-weight material at 1 wt % or more, it is possible to obtain a binder effect with reliability. Whereas, when the mixing amount of the low-molecular-weight material is set at less than 50%, the added low-molecular-weight material itself acts as a quenching site, which can prevent the efficiency from decreasing.

As an alternative, the second low-molecular-weight material is formed of a hole transportable material or an electron transportable material, or both thereof. Alternatively, the light-emitting layer further has a luminescent dye. By thus adding a luminescent dye to the light-emitting layer, it is also possible to more enhance the luminous efficiency, or to enhance the color rendering property.

As an alternative, the hole transport layer has a poorly soluble layer. The poorly soluble layer is disposed on the surface of the hole transport layer. The poorly soluble layer is formed of a surface-treated film obtained by treating the surface of the hole transport layer with an ether compound or an organic acid. Thus, by surface-treating the low-molecular-weight hole transport layer with an ether compound or an organic acid, it is possible to form the poorly soluble layer. The poorly soluble layer can prevent the constituent material of the low-molecular-weight hole transport layer from dissolving into the light-emitting layer. This can stabilize the device characteristics and can improve the lifetime. In addition, it is also possible to obtain an effect of enabling the inhibition of reduction of the luminous efficiency.

As an alternative, the poorly soluble layer is disposed at a portion of the hole transport layer in contact with the light-emitting layer. Other portions of the hole transport layer than the contact portion includes only the second low-molecular-weight material. Alternatively, the molecular formula of the ether compound includes 5 or more and 15 or less carbon atoms. Specifically, the ether compound is a compound represented by Chemical Formula R1-O—R2, or Chemical Formula R1-O—R2-O—R3, where R1, R2, and R3 are each an alkyl group having 2 or more and 6 or less carbon atoms. Further, the ether compound has a boiling point of 50° C. or more and 250° C. or less. This is for the following reason. In this case, when the boiling point is less than 50° C., the ether compound rapidly volatilizes. This results in a possibility that the poorly soluble layer can not be formed sufficiently. When the boiling point is higher than 250° C., removal of the excess ether compound after performing the surface treatment requires a treatment at high temperatures for a long time. This results in reduction of the productivity. Further, the ether compound is any of dipropyl ether, dibutyl ether, dipentyl ether, dihexyl ether, ethylene glycol diethyl ether, ethylene glycol dipropyl ether, and ethylene glycol dibutyl ether. Alternatively, the organic acid is a sulfonic acid compound, a carboxylic acid compound, a hydroxy compound, a thiol compound, an enol compound, or an organic phosphoric acid compound.

As an alternative, the poorly soluble layer has a film thickness of 10 nm or less. The poorly soluble layer is lower in hole mobility than the low-molecular-weight hole transport layer. For this reason, when the film thickness of the poorly soluble layer is larger than 10 nm, the driving voltage must be increased. Therefore, the film thickness of the poorly soluble layer is desirably set at 10 nm or less.

As an alternative, the low-molecular-weight material forming the low-molecular-weight hole transport layer is characterized by having a glass transition point of 120° C. or more, or a melting point of 120° C. or more when there is no glass transition point. Namely, when the solvent drying step is carried out after polymer material coating for forming the light-emitting layer, generally, about 120° C. heating is carried out. However, when the temperature of this heating step exceeds the glass transition point of the low-molecular-weight material, an increase in interface roughness due to aggregation of the low-molecular-weight material, mixing of both the materials, and the like are caused, resulting in deterioration of characteristics. For this reason, it is preferable to use, as the constituent material of the low-molecular-weight hole transport layer, a material having a glass transition point equal to or higher than the solvent drying temperature after polymer material coating, i.e., 120° C. or more.

As an alternative, the first low-molecular-weight material has a sublimation temperature of 300° C. or more at a degree of vacuum of 1 Pa. In the case of a sublimation temperature of lower than 300° C., when a deposition film is formed under vacuum as high as $10^{-5}$ Pa or less, the deposition temperature is 200° C. or less, resulting in a difficulty in controlling the deposition rate. This makes it impossible to form a deposition film with a uniform film density. Therefore, it is desirable to use, as the constituent material of the low-molecular-weight hole transport layer, the one with a sublimation temperature of 300° C. or more at a degree of vacuum of 1 Pa.

As an alternative, the first low-molecular-weight material is a triphenylamine derivative material. Further, the structure of the triphenylamine derivative material has a center of symmetry. Still further, the triphenylamine derivative material is a starburst amine.

In the second embodiment of the present disclosure, an organic EL device, has: an electrode substrate; a hole injection electrode disposed on the electrode substrate; a hole transport layer disposed on the hole injection electrode; a poorly soluble layer disposed on the surface of the hole transport layer; a light-emitting layer disposed on the poorly soluble layer; and an electron injection electrode disposed on the light-emitting layer; the organic EL device is characterized in that: the hole transport layer is formed of a low-molecular-weight material having a smaller molecular weight than a prescribed first molecular weight; the poorly soluble layer is formed of a surface-treated film obtained by treating the surface of the hole transport layer with an ether compound; and the light-emitting layer is formed of a polymer material having a larger molecular weight than a prescribed second molecular weight.

Thus, by surface-treating the low-molecular-weight hole transport layer with an ether compound, it is possible to form the poorly soluble layer. The poorly soluble layer can prevent the constituent material of the low-molecular-weight hole transport layer from dissolving into the polymer light-emitting layer. Therefore, while a structure of lamination of the low-molecular-weight hole transport layer and the polymer light-emitting layer is adopted, the low-molecular-weight hole transport layer is inhibited from dissolving into the polymer light-emitting layer, and stabilization of the device characteristics and the lifetime improvement can be achieved.

As an alternative, the ether compound has a boiling point of 50° C. or more and 250° C. or less. This is for the following reason. When the boiling point is less than 50° C., the ether compound rapidly volatilizes. This results in a possibility that the poorly soluble layer can not be formed sufficiently. When the boiling point is higher than 250° C., removal of the excess ether compound after performing the surface treatment requires a treatment at high temperatures for a long time. This results in reduction of the productivity.

As an alternative, the low-molecular-weight material has a glass transition point of 120° C. or more, or a melting point of 120° C. or more when there is no glass transition point. Namely, when the solvent drying step is carried out after polymer material coating for forming the light-emitting layer, generally, about 120° C. heating is carried out. However, when the temperature of this heating step exceeds the glass transition point of the low-molecular-weight material, an increase in interface roughness due to aggregation of the low-molecular-weight material, mixing of both the materials, and the like are caused, resulting in deterioration of characteristics. For this reason, it is preferable to use, as the constituent material of the low-molecular-weight hole transport material, a material having a glass transition point equal to or higher than the solvent drying temperature after polymer material coating, i.e., 120° C. or more.

As an alternative, the low-molecular-weight material has a sublimation temperature of 300° C. or more at a degree of vacuum of 1 Pa. In the case of a sublimation temperature of lower than 300° C., when a deposition film is formed under vacuum as high as $10^{-5}$ Pa or less, the deposition temperature is 200° C. or less, resulting in a difficulty in controlling the deposition rate. This makes it impossible to form a deposition film with a uniform film density. Therefore, it is desirable to use, as the constituent material for the low-molecular-weight hole transport layer, the one with a sublimation temperature of 300° C. or more at a degree of vacuum of 1 Pa.

As an alternative, the poorly soluble layer has a film thickness of 10 nm or less. The poorly soluble layer is lower in hole mobility than the low-molecular-weight hole transport layer. For this reason, when the film thickness of the poorly soluble layer is larger than 10 nm, the driving voltage must be increased. Therefore, the film thickness of the poorly soluble layer is desirably set at 10 nm or less.

In the third embodiment of the present disclosure, a method for manufacturing an organic EL device, includes: a step of forming a hole injection electrode on an electrode substrate; a step of forming a hole transport layer on the hole injection electrode; a step of treating the surface of the hole transport layer with an ether compound, and thereby forming a poorly soluble layer on the surface of the hole transport layer; a step of forming a light-emitting layer on the surface of the poorly soluble layer; and a step of forming an electron injection electrode on the light-emitting layer. The method is characterized in that the hole transport layer is formed of a low-molecular-weight material having a smaller molecular weight than a prescribed first molecular weight; and the light-emitting layer is formed of a polymer material having a larger molecular weight than a prescribed second molecular weight.

Thus, the poorly soluble layer can be formed by surface-treating the low-molecular-weight hole transport layer with an ether compound. The detailed structure of the poorly soluble layer formed by the surface treatment is not definite. However, the poorly soluble layer is assumed to be in any of: a state in which the surface of the low-molecular-weight hole transport layer is coated with an ether compound in a film; a state in which molecules forming an ether compound are introduced in the low-molecular-weight hole transport layer, resulting in a mixture with the low-molecular-weight material; or a state in which a chemical reaction with the low-molecular-weight material forming the low-molecular-weight hole transport layer results in an ether compound. With such a manufacturing method, it is possible to manufacture the organic EL device of the second embodiment of the present disclosure.

As an alternative, the method for manufacturing an organic EL device further includes a step of, after forming the light-emitting layer, performing a heat treatment, and thereby volatilizing and removing the ether compound. Thus, the ether compound is volatilized and removed with a heat treatment. This enables a further improvement of the luminous efficiency as compared with an organic EL device with the same configuration and not subjected to a heat treatment.

In the fourth embodiment of the present disclosure, an organic EL device, has: an electrode substrate; a hole injection electrode disposed on the electrode substrate; a hole transport layer disposed on the hole injection electrode; a poorly soluble layer disposed on the surface of the hole transport layer; a light-emitting layer disposed on the surface of the poorly soluble layer; and an electron injection electrode disposed on the light-emitting layer. The organic EL device is characterized in that: the hole transport layer is formed of a low-molecular-weight material having a smaller molecular weight than a prescribed first molecular weight; the poorly soluble layer is formed of a surface-treated film obtained by treating the surface of the hole transport layer with an organic acid; and the light-emitting layer is formed of a polymer material having a larger molecular weight than a prescribed second molecular weight.

Thus, by surface-treating the low-molecular-weight hole transport layer with an organic acid, it is possible to form the poorly soluble layer. The poorly soluble layer can prevent the constituent material of the low-molecular-weight hole transport layer from dissolving into the polymer light-emitting layer. Therefore, while a structure of lamination of the low-molecular-weight hole transport layer and the polymer light-emitting layer is adopted, the hole transport layer is inhibited from dissolving into the polymer light-emitting layer, and stabilization of the device characteristics and the lifetime improvement can be achieved.

As an alternative, the organic EL device is characterized in that the organic acid is a sulfonic acid compound, a carboxylic acid compound, a hydroxy compound, a thiol compound, an enol compound, or an organic phosphoric acid compound.

In the fifth embodiment of the present disclosure, a method for manufacturing an organic EL device, includes: a step of forming a hole injection electrode on an electrode substrate; a step of forming a hole transport layer on the hole injection electrode; a step of treating the surface of the hole transport layer with an organic acid, and thereby forming a poorly soluble layer on the surface of the hole transport layer; a step of forming a light-emitting layer on the surface of the poorly soluble layer; and a step of forming an electron injection electrode on the light-emitting layer. The method is characterized in that the hole transport layer is formed of a low-molecular-weight material having a smaller molecular weight than a prescribed first molecular weight; and the light-emitting layer is formed of a polymer material having a larger molecular weight than a prescribed second molecular weight.

Thus, the poorly soluble layer can be formed by surface-treating the low-molecular-weight hole transport layer with an organic acid. The detailed structure of the poorly soluble layer formed by the surface treatment is not definite. However, the poorly soluble layer is assumed to be in any of: a state in which the surface of the low-molecular-weight hole transport layer is coated with an organic acid in a film; a state in which molecules forming an organic acid are introduced in the low-molecular-weight hole transport layer, resulting in a mixture with the low-molecular-weight material; or a state in which a chemical reaction with the low-molecular-weight material forming the low-molecular-weight hole transport layer results in an organic acid compound. With such a manufacturing method, it is possible to manufacture the organic EL device of the fourth embodiment of the present disclosure.

As an alternative, the method is characterized in that the step of forming the poorly soluble layer includes a step of coating a solution containing an organic acid on the hole transport layer. Further, the method is characterized in that the step of forming the poorly soluble layer includes a step of exposing the surface of the hole transport layer into a vapor containing an organic acid. Alternatively, the method for manufacturing an organic EL device is characterized by including, further, after forming the light-emitting layer, performing a heat treatment, and thereby volatilizing and removing the organic acid. Thus, the organic acid is volatilized and removed by a heat treatment. This enables a further improvement of the luminous efficiency as compared with the organic EL device with the same configuration and not subjected to a heat treatment.

In the sixth embodiment of the present disclosure, an organic luminescent device, includes: a hole injection electrode; an electron injection electrode; a light-emitting layer disposed between the hole injection electrode and the electron injection electrode; and a hole transport layer disposed between the hole injection electrode and the light-emitting layer. The organic luminescent device is characterized in that the hole transport layer is formed of a low-molecular-weight material having a smaller molecular weight than a prescribed first molecular weight; the hole transport layer is formed of a vacuum deposition film; the light-emitting layer covers the hole transport layer; and the light-emitting layer is formed of a polymer material having a larger molecular weight than a prescribed second molecular weight as the luminescent material.

In accordance with the present invention, in the organic luminescent device, as the hole transport layer, a vacuum deposition layer of a low-molecular-weight hole transport material is used. A light-emitting layer using a polymer material as a luminescent material is formed in such a manner as to cover the hole transport layer. As a result, it is possible to obtain an organic EL device high in high-temperature durability and long in lifetime at a low cost. The organic EL device can also be preferably adopted in uses requiring durability under high-temperature high-humidity environment, such as for an in-vehicle display device. Further, the device can be manufactured at a low cost, and hence can also be adopted for a segment type display device, or the like, strongly required to be low in cost.

The present invention was disclosed by reference to preferable embodiments. However, it is understood that the present invention is not limited to the preferred embodiments and the structures thereof. The present invention is intended to cover various modifications and equivalent arrangements. In addition, preferable, or various other combinations and embodiments such as to merely include one more or less element are also included within the gist and scope of the present invention.

The invention claimed is:

1. An organic EL device comprising:
an electrode substrate;
a hole injection electrode disposed on the electrode substrate;
a hole transport layer disposed on the hole injection electrode;
a light-emitting layer disposed on the hole transport layer; and
an electron injection electrode disposed on the light-emitting layer,
wherein the hole transport layer is made of a first low-molecular-weight material having a molecular weight smaller than a predetermined first molecular weight, and
wherein the light-emitting layer is made of a mixture of a polymer material having a molecular weight larger than a predetermined second molecular weight and a second low-molecular-weight material having a molecular weight smaller than a predetermined third molecular weight.

2. The organic EL device of claim 1,
wherein the light-emitting layer is made of a coating film, and
wherein the hole transport layer is made of a vacuum deposition film.

3. The organic EL device of claim 1,
wherein the second low-molecular-weight material has a HOMO-LUMO gap, and
wherein the HOMO-LUMO gap is larger than luminescent energy of light emitted from the light-emitting layer.

4. The organic EL device of claim 1,
wherein the light-emitting layer includes the second low-molecular-weight material in an amount of 1 wt % or more and less than 50 wt % of a total amount of the polymer material and the second low-molecular-weight material.

5. The organic EL device of claim 1,
wherein the second low-molecular-weight material is made of a hole transport material or an electron transport material, or both thereof.

6. The organic EL device of claim 1,
wherein the light-emitting layer further includes a luminescent dye.

7. The organic EL device of claim 1,
wherein the hole transport layer includes a poorly soluble layer,
wherein the poorly soluble layer is disposed on a surface of the hole transport layer; and
the poorly soluble layer is made of a surface-treated film prepared by processing the surface of the hole transport layer with an ether compound or an organic acid.

8. The organic EL device of claim 7,
wherein the poorly soluble layer is disposed at a portion of the hole transport layer in contact with the light-emitting layer, and
wherein other portions of the hole transport layer than the contact portion include only the second low-molecular-weight material.

9. The organic EL device of claim 7,
wherein a molecular formula of the ether compound includes 5 or more and 15 or less carbon atoms.

10. The organic EL device of claim 9,
wherein the ether compound is a compound represented by Chemical Formula R1-O—R2, or Chemical Formula R1-O—R2-O—R3, and
wherein each of R1, R2, and R3 is an alkyl group having 2 or more and 6 or less carbon atoms.

11. The organic EL device of claim 10,
wherein the ether compound has a boiling point of 50° C. or more and 250° C. or less.

12. The organic EL device of claim 11,
wherein the ether compound is selected from the group consisting of dipropyl ether, dibutyl ether, dipentyl ether, dihexyl ether, ethylene glycol diethyl ether, ethylene glycol dipropyl ether, and ethylene glycol dibutyl ether.

13. The organic EL device of claim 7,
wherein the organic acid is selected from the group consisting of a sulfonic acid compound, a carboxylic acid compound, a hydroxy compound, a thiol compound, an enol compound, and an organic phosphoric acid compound.

14. The organic EL device of claim 7,
wherein the poorly soluble layer has a film thickness of 10 nm or less.

15. The organic EL device of claim 1,
wherein the first low-molecular-weight material has a glass transition point of 120° C. or more, or a melting point of 120° C. or more when the first low-molecular-weight material does not have the glass transition point does.

16. The organic EL device of claim 1,
wherein the first low-molecular-weight material has a sublimation temperature of 300° C. or more at a degree of vacuum of 1 Pa.

17. The organic EL device of claim 1,
wherein the first low-molecular-weight material is a triphenylamine derivative material.

18. The organic EL device of claim 17,
wherein a structure of the triphenylamine derivative material has a center of symmetry.

19. The organic EL device of claim 18,
wherein the triphenylamine derivative material is a starburst amine.

20. An organic EL device comprising:
an electrode substrate;
a hole injection electrode disposed on the electrode substrate;
a hole transport layer disposed on the hole injection electrode;
a poorly soluble layer disposed on a surface of the hole transport layer;
a light-emitting layer disposed on a surface of the poorly soluble layer; and
an electron injection electrode disposed on the light-emitting layer,
wherein the hole transport layer is made of a low-molecular-weight material having a molecular weight smaller than a predetermined first molecular weight,
wherein the poorly soluble layer is made of a surface-treated film prepared by processing the surface of the hole transport layer with an ether compound, and
wherein the light-emitting layer is made of a polymer material having a molecular weight larger than a predetermined second molecular weight.

21. The organic EL device of claim 20,
wherein a molecular formula of the ether compound includes 5 or more and 15 or less carbon atoms.

22. The organic EL device of claim 21,
wherein the ether compound is a compound represented by Chemical Formula R1-O—R2, or Chemical Formula R1-O—R2-O—R3, and
wherein each of R1, R2, and R3 is an alkyl group having 2 or more and 6 or less carbon atoms.

23. The organic EL device of claim 22,
wherein the ether compound has a boiling point of 50° C. or more and 250° C. or less.

24. The organic EL device of claim 23,
wherein the ether compound is selected from the group consisting of dipropyl ether, dibutyl ether, dipentyl ether, dihexyl ether, ethylene glycol diethyl ether, ethylene glycol dipropyl ether, and ethylene glycol dibutyl ether.

25. The organic EL device of claim 20,
wherein the hole transport layer is made of a vacuum deposition film; and
the light-emitting layer is made of a coating film.

26. The organic EL device of claim 20,
wherein the hole transport layer includes a triphenylamine derivative material.

27. The organic EL device of claim 20,
wherein the low-molecular-weight material has a glass transition point of 120° C. or more, or a melting point of 120° C. or more when the low-molecular-weight material does not have the glass transition point.

28. The organic EL device of claim 20,
wherein the low-molecular-weight material has a sublimation temperature of 300° C. or more at a degree of vacuum of 1 Pa.

29. The organic EL device of claim 20,
wherein the poorly soluble layer has a film thickness of 10 nm or less.

30. An organic EL device comprising:
an electrode substrate;
a hole injection electrode disposed on the electrode substrate;
a hole transport layer disposed on the hole injection electrode;
a poorly soluble layer disposed on a surface of the hole transport layer;
a light-emitting layer disposed on the poorly soluble layer; and
an electron injection electrode disposed on the light-emitting layer,
wherein the hole transport layer is made of a low-molecular-weight material having a molecular weight smaller than a predetermined first molecular weight;
the poorly soluble layer is made of a surface-treated film prepared by processing the surface of the hole transport layer with an organic acid; and
the light-emitting layer is made of a polymer material having a molecular weight larger than a predetermined second molecular weight.

31. The organic EL device of claim 30,
wherein the organic acid is selected from the group consisting of a sulfonic acid compound, a carboxylic acid compound, a hydroxy compound, a thiol compound, an enol compound, and an organic phosphoric acid compound.

32. The organic EL device of claim 30,
wherein the hole transport layer is made of a vacuum deposition film, and
the light-emitting layer is made of a coating film.

33. The organic EL device of claim 30,
wherein the hole transport layer includes a triphenylamine derivative material.

34. The organic EL device of claim 30,
wherein the low-molecular-weight material has a glass transition point of 120° C. or more, or a melting point of 120° C. or more when the low-molecular-weight material does not have the glass transition point.

35. The organic EL device of claim 30,
wherein the low-molecular-weight material has a sublimation temperature of 300° C. or more at a degree of vacuum of 1 Pa.

36. The organic EL device of claim 30,
wherein the poorly soluble layer has a film thickness of 10 nm or less.

37. An organic luminescent device comprising:
a hole injection electrode;
an electron injection electrode;
a light-emitting layer disposed between the hole injection electrode and the electron injection electrode; and
a hole transport layer disposed between the hole injection electrode and the light-emitting layer,
wherein the hole transport layer is made of a low-molecular-weight material having a molecular weight smaller than a predetermined first molecular weight;
wherein the hole transport layer is made of a vacuum deposition film,
wherein the light-emitting layer covers the hole transport layer, and
wherein the light-emitting layer is made of a polymer material having a molecular weight larger than a predetermined second molecular weight as a luminescent material.

38. The organic luminescent device of claim 37,
wherein the polymer material of the light-emitting layer has a mean molecular weight of 10000 or more, and
wherein the low-molecular-weight material of the hole transport layer has a molecular weight of 700 or more and 2000 or less.

39. The organic luminescent device of claim 37,
wherein the light-emitting layer is made of a coating film or a print film of the polymer material, and
wherein the low-molecular-weight material of the hole transport layer has a glass transition point, or a melting point when the low-molecular-weight material does not have the glass transition point, which is equal to or higher than a drying temperature after coating or printing and forming of the light-emitting layer.

40. The organic luminescent device of claim 37,
wherein the hole transport layer is processed with a heat treatment at a temperature equal to or higher than the glass transition point of the low-molecular-weight material of the hole transport layer, or than the melting point of the low-molecular-weight material of the hole transport layer when the low-molecular-weight material does not have the glass transition point, before the light-emitting layer is stacked on the hole transport layer.

41. The organic luminescent device of claim 37,
wherein the low-molecular-weight material has a sublimation temperature of 300° C. or more at a degree of vacuum of 1 Pa.

42. The organic electroluminescent device of claim 37,
wherein the low-molecular-weight material is a triphenylamine derivative material.

43. The organic electroluminescent device of claim 42,
wherein the triphenylamine derivative material has a structure of center of symmetry.

44. The organic electroluminescent device of claim 43,
wherein the triphenylamine derivative material is a starburst amine.

45. The organic luminescent device of claim 37,
wherein the light-emitting layer is a coating film or a print film including the polymer material,
wherein the light-emitting layer is stacked on the hole transport layer, wherein the hole transport layer has a multilayer structure having at least a first layer and a second layer, wherein the first layer is in contact with the light-emitting layer, wherein the second layer is covered with the first layer, wherein the first layer is made of a first low-molecular-weight material, wherein the second layer is made of a second low-molecular-weight material, wherein the first low-molecular-weight material has a solubility in a solvent substance smaller than that of the second low-molecular-weight material, and wherein the solvent substance is used as a solvent of the polymer material during coating or during printing.

46. The organic luminescent device of claim 45, wherein the layer thickness of the first layer is smaller than the layer thickness of the second layer.

47. The organic luminescent device of claim 44, wherein the first layer is a vacuum deposition film formed on the second layer.

48. The organic luminescent device of claim 44, wherein the solvent of the polymer material contains any one, or two or more of toluene, xylene, anisole, methyl anisole, dimethyl anisole, tetralin, ethyl benzoate, and methyl benzoate.

49. The organic luminescent device of claim 37, wherein the hole transport layer is formed by patterning the low-molecular-weight material in a shape corresponding to a deposition mask.

50. The organic luminescent device of claim 37, wherein the organic luminescent device is driven at a duty ratio of ⅓ or less during one frame period, or is driven in a DC mode in which a predetermined DC voltage in accordance with the light emission luminance is supplied across the hole injection electrode and the electron injection electrode during a display period in one frame period.

* * * * *